United States Patent
Mohn et al.

(10) Patent No.: US 9,719,169 B2
(45) Date of Patent: Aug. 1, 2017

(54) SYSTEM AND APPARATUS FOR FLOWABLE DEPOSITION IN SEMICONDUCTOR FABRICATION

(75) Inventors: Jonathan D. Mohn, Saratoga, CA (US); Harald te Nijenhuis, San Jose, CA (US); Shawn M. Hamilton, Boulder Creek, CA (US); Kevin Madrigal, Santa Cruz, CA (US); Ramkishan Rao Lingampalli, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 1598 days.

(21) Appl. No.: 13/329,078

(22) Filed: Dec. 16, 2011

(65) Prior Publication Data

US 2012/0161405 A1 Jun. 28, 2012

Related U.S. Application Data

(60) Provisional application No. 61/425,150, filed on Dec. 20, 2010.

(51) Int. Cl.
| | |
|---|---|
| *H01L 21/687* | (2006.01) |
| *H01L 21/67* | (2006.01) |
| *C23C 16/458* | (2006.01) |
| *C23C 16/40* | (2006.01) |

(Continued)

(52) U.S. Cl.
CPC ........ *C23C 16/401* (2013.01); *C23C 16/4585* (2013.01); *C23C 16/4586* (2013.01); *C23C 16/45565* (2013.01); *C23C 16/45574* (2013.01); *C23C 16/463* (2013.01); *H01L 21/6719* (2013.01); *H01L 21/67109* (2013.01);

(Continued)

(58) Field of Classification Search
USPC .................................................. 118/728, 725
See application file for complete search history.

(56) References Cited

U.S. PATENT DOCUMENTS

| | | |
|---|---|---|
| 4,099,990 A | 7/1978 | Brown et al. |
| 4,740,480 A | 4/1988 | Ooka |
| 4,923,720 A | 5/1990 | Lee et al. |

(Continued)

FOREIGN PATENT DOCUMENTS

| | | |
|---|---|---|
| CN | 1655330 A | 8/2005 |
| CN | 1722403 A | 1/2006 |

(Continued)

OTHER PUBLICATIONS

U.S. Appl. No. 13/461,287, filed May 1, 2012, entitled "CVD Flowable Gap Fill".

(Continued)

*Primary Examiner* — Jeffrie R Lund
*Assistant Examiner* — Mirza Israr Javed
(74) *Attorney, Agent, or Firm* — Weaver Austin Villeneuve & Sampson, LLP

(57) ABSTRACT

Electronic device fabrication processes, apparatuses and systems for flowable gap fill or flowable deposition techniques are described. In some implementations, a semiconductor fabrication chamber is described which is configured to maintain a semiconductor wafer at a temperature near 0° C. while maintaining most other components within the fabrication chamber at temperatures on the order of 5-10° C. or higher than the wafer temperature.

18 Claims, 47 Drawing Sheets

(51) Int. Cl.
*C23C 16/455* (2006.01)
*C23C 16/46* (2006.01)

(52) U.S. Cl.
CPC .. *H01L 21/68785* (2013.01); *H01L 21/68792* (2013.01); *Y10T 279/34* (2015.01)

(56) References Cited

U.S. PATENT DOCUMENTS

| | | | |
|---|---|---|---|
| 5,281,274 A | 1/1994 | Yoder | |
| 5,320,983 A | 6/1994 | Ouellet | |
| 5,382,311 A * | 1/1995 | Ishikawa | C23C 16/4586 118/723 E |
| 5,387,546 A | 2/1995 | Maeda et al. | |
| 5,462,603 A * | 10/1995 | Murakami | C23C 16/4586 118/719 |
| 5,516,721 A | 5/1996 | Galli et al. | |
| 5,525,157 A | 6/1996 | Hawkins et al. | |
| 5,534,731 A | 7/1996 | Cheung | |
| 5,558,717 A * | 9/1996 | Zhao | C23C 16/4401 118/715 |
| 5,747,381 A | 5/1998 | Wu et al. | |
| 5,753,886 A | 5/1998 | Iwamura et al. | |
| 5,775,808 A * | 7/1998 | Pan | G01K 11/3213 374/131 |
| 5,796,074 A * | 8/1998 | Edelstein | C23C 16/4586 219/390 |
| 5,807,785 A | 9/1998 | Ravi | |
| 5,840,631 A | 11/1998 | Kubo et al. | |
| 5,858,880 A | 1/1999 | Dobson et al. | |
| 5,874,367 A | 2/1999 | Dobson | |
| 5,879,574 A * | 3/1999 | Sivaramakrishnan | C23C 16/4405 134/1.1 |
| 5,899,751 A | 5/1999 | Chang et al. | |
| 5,902,127 A | 5/1999 | Park | |
| 5,903,428 A * | 5/1999 | Grimard | H01L 21/6833 279/128 |
| 5,911,833 A * | 6/1999 | Denison | B08B 7/0035 134/1.1 |
| 5,932,289 A | 8/1999 | Dobson et al. | |
| 5,970,383 A | 10/1999 | Lee | |
| 5,990,013 A | 11/1999 | Berenguer et al. | |
| 6,001,183 A * | 12/1999 | Gurary | C23C 16/4584 118/720 |
| 6,013,581 A | 1/2000 | Wu et al. | |
| 6,035,101 A * | 3/2000 | Sajoto | C23C 16/4586 118/728 |
| 6,054,379 A | 4/2000 | Yau et al. | |
| 6,060,384 A | 5/2000 | Chen et al. | |
| 6,072,227 A | 6/2000 | Yau et al. | |
| 6,114,224 A | 9/2000 | Ngo et al. | |
| 6,114,259 A | 9/2000 | Sukharev et al. | |
| 6,143,626 A | 11/2000 | Yabu et al. | |
| 6,207,535 B1 | 3/2001 | Lee et al. | |
| 6,218,268 B1 | 4/2001 | Xia et al. | |
| 6,235,146 B1 * | 5/2001 | Kadotani | H01L 21/67023 118/723 E |
| 6,242,366 B1 | 6/2001 | Beekman et al. | |
| 6,251,759 B1 | 6/2001 | Guo et al. | |
| 6,287,989 B1 | 9/2001 | Dobson | |
| 6,300,219 B1 | 10/2001 | Doan et al. | |
| 6,309,933 B1 | 10/2001 | Li et al. | |
| 6,323,123 B1 | 11/2001 | Liu et al. | |
| 6,383,951 B1 | 5/2002 | Li | |
| 6,399,213 B2 | 6/2002 | Shiokawa | |
| 6,413,583 B1 | 7/2002 | Moghadam et al. | |
| 6,439,244 B1 * | 8/2002 | Wu | H01J 37/32082 134/1.1 |
| 6,448,187 B2 | 9/2002 | Yau et al. | |
| 6,475,564 B1 | 11/2002 | Carter et al. | |
| 6,544,858 B1 | 4/2003 | Beekman et al. | |
| 6,605,955 B1 * | 8/2003 | Costello | H01L 21/67109 324/750.09 |
| 6,613,695 B2 | 9/2003 | Pomarede et al. | |
| 6,635,586 B2 | 10/2003 | Goo et al. | |
| 6,640,840 B1 | 11/2003 | MacNeil | |
| 6,653,247 B2 | 11/2003 | MacNeil | |
| 6,660,663 B1 | 12/2003 | Cheung et al. | |
| 6,740,853 B1 * | 5/2004 | Johnson | C23C 16/4586 118/620 |
| 6,743,436 B1 | 6/2004 | Lee | |
| 6,743,736 B2 | 6/2004 | Mardian et al. | |
| 6,787,463 B2 | 9/2004 | Mardian et al. | |
| 6,790,737 B2 | 9/2004 | Schneegans et al. | |
| 6,812,135 B2 | 11/2004 | Li et al. | |
| 6,828,162 B1 | 12/2004 | Halliyal et al. | |
| 6,846,757 B2 | 1/2005 | MacNeil | |
| 6,858,195 B2 | 2/2005 | Aronowitz et al. | |
| 6,902,947 B2 | 6/2005 | Chinn et al. | |
| 6,972,262 B2 | 12/2005 | Lee et al. | |
| 6,984,561 B2 | 1/2006 | Herner et al. | |
| 6,995,056 B2 | 2/2006 | Lee et al. | |
| 7,033,945 B2 | 4/2006 | Byun et al. | |
| 7,056,560 B2 | 6/2006 | Yim et al. | |
| 7,071,126 B2 | 7/2006 | Johnston et al. | |
| 7,074,690 B1 | 7/2006 | Gauri et al. | |
| 7,074,727 B2 | 7/2006 | Hsu et al. | |
| 7,084,505 B2 | 8/2006 | Hamada et al. | |
| 7,091,453 B2 * | 8/2006 | Murayama | H01L 21/67115 118/50.1 |
| 7,153,783 B2 | 12/2006 | Lu et al. | |
| 7,211,525 B1 | 5/2007 | Shanker et al. | |
| 7,235,137 B2 * | 6/2007 | Kitayama | C30B 31/14 118/712 |
| 7,238,604 B2 | 7/2007 | Kloster et al. | |
| 7,271,112 B1 | 9/2007 | Papasouliotis et al. | |
| 7,311,782 B2 * | 12/2007 | Strang | H01L 21/67109 118/724 |
| 7,365,000 B2 | 4/2008 | Lee et al. | |
| 7,480,129 B2 * | 1/2009 | Brown | H01L 21/6831 361/234 |
| 7,498,273 B2 | 3/2009 | Mallick et al. | |
| 7,521,378 B2 | 4/2009 | Fucsko et al. | |
| 7,524,735 B1 | 4/2009 | Gauri et al. | |
| 7,575,633 B2 | 8/2009 | Romanin | |
| 7,582,555 B1 | 9/2009 | Lang et al. | |
| 7,585,704 B2 | 9/2009 | Belyansky et al. | |
| 7,589,012 B1 | 9/2009 | Seo et al. | |
| 7,622,369 B1 | 11/2009 | Lee et al. | |
| 7,629,227 B1 | 12/2009 | Wang et al. | |
| 7,648,927 B2 | 1/2010 | Singh et al. | |
| 7,655,532 B1 | 2/2010 | Chen et al. | |
| 7,670,436 B2 * | 3/2010 | Miller | C23C 14/50 118/728 |
| 7,727,906 B1 | 6/2010 | Shanker et al. | |
| 7,794,544 B2 | 9/2010 | Nguyen et al. | |
| 7,804,130 B1 | 9/2010 | Fung | |
| 7,825,044 B2 | 11/2010 | Mallick et al. | |
| 7,888,233 B1 | 2/2011 | Gauri et al. | |
| 7,888,273 B1 | 2/2011 | Wang et al. | |
| 7,915,139 B1 | 3/2011 | Lang et al. | |
| 7,947,551 B1 | 5/2011 | Syue et al. | |
| 7,999,356 B2 | 8/2011 | Nakasaki et al. | |
| 8,178,159 B2 | 5/2012 | Baikerikar et al. | |
| 8,187,951 B1 | 5/2012 | Wang et al. | |
| 8,278,224 B1 | 10/2012 | Mui et al. | |
| 8,481,403 B1 | 7/2013 | Gauri et al. | |
| 8,557,712 B1 | 10/2013 | Antonelli et al. | |
| 8,580,697 B1 | 11/2013 | Lang et al. | |
| 8,664,287 B2 | 3/2014 | Shukla | |
| 8,685,867 B1 | 4/2014 | Danek et al. | |
| 8,728,958 B2 | 5/2014 | Ashtiani et al. | |
| 8,809,161 B2 | 8/2014 | Gauri et al. | |
| 8,846,536 B2 | 9/2014 | Draeger et al. | |
| 9,064,684 B1 | 6/2015 | Mui et al. | |
| 9,224,594 B2 | 12/2015 | Kashefi et al. | |
| 9,245,739 B2 | 1/2016 | Ndiege et al. | |
| 9,257,302 B1 | 2/2016 | Wang et al. | |
| 9,299,559 B2 | 3/2016 | Draeger et al. | |
| 2002/0006729 A1 | 1/2002 | Geiger et al. | |
| 2002/0007785 A1 | 1/2002 | Gujer et al. | |
| 2002/0050246 A1 * | 5/2002 | Parkhe | H01L 21/67109 118/500 |

(56) References Cited

U.S. PATENT DOCUMENTS

| | | | |
|---|---|---|---|
| 2002/0066726 A1* | 6/2002 | Cole, Sr. | G01R 31/2891 219/444.1 |
| 2002/0076490 A1* | 6/2002 | Chiang | C23C 16/0227 427/248.1 |
| 2003/0040199 A1 | 2/2003 | Agarwal | |
| 2003/0066482 A1 | 4/2003 | Pokharna et al. | |
| 2003/0077887 A1 | 4/2003 | Jang et al. | |
| 2003/0121898 A1* | 7/2003 | Kane | C23C 16/4586 219/200 |
| 2003/0124870 A1 | 7/2003 | Macneil et al. | |
| 2003/0146416 A1 | 8/2003 | Takei et al. | |
| 2003/0159655 A1 | 8/2003 | Lin et al. | |
| 2003/0194861 A1 | 10/2003 | Mardian et al. | |
| 2003/0207580 A1 | 11/2003 | Li et al. | |
| 2003/0210065 A1 | 11/2003 | Lu et al. | |
| 2004/0033639 A1 | 2/2004 | Chinn et al. | |
| 2004/0048455 A1 | 3/2004 | Karasawa et al. | |
| 2004/0152342 A1 | 8/2004 | Li et al. | |
| 2004/0169005 A1 | 9/2004 | Kim et al. | |
| 2004/0224496 A1 | 11/2004 | Cui et al. | |
| 2005/0020074 A1 | 1/2005 | Kloster et al. | |
| 2005/0026443 A1 | 2/2005 | Goo et al. | |
| 2005/0064698 A1 | 3/2005 | Chang et al. | |
| 2005/0112282 A1 | 5/2005 | Gordon | |
| 2005/0136684 A1 | 6/2005 | Mukai et al. | |
| 2005/0150453 A1 | 7/2005 | Simmons et al. | |
| 2005/0181566 A1 | 8/2005 | Machida et al. | |
| 2005/0191863 A1 | 9/2005 | Olmer et al. | |
| 2005/0212179 A1 | 9/2005 | Honda et al. | |
| 2005/0229849 A1* | 10/2005 | Silvetti | C23C 16/4404 118/715 |
| 2005/0258542 A1 | 11/2005 | Fuller et al. | |
| 2005/0260864 A1 | 11/2005 | Huang et al. | |
| 2006/0014384 A1 | 1/2006 | Lee et al. | |
| 2006/0024912 A1 | 2/2006 | Lee | |
| 2006/0172531 A1 | 8/2006 | Lin et al. | |
| 2006/0183345 A1 | 8/2006 | Nguyen et al. | |
| 2006/0216946 A1 | 9/2006 | Usami et al. | |
| 2006/0223290 A1 | 10/2006 | Belyansky et al. | |
| 2006/0269693 A1 | 11/2006 | Balseanu et al. | |
| 2006/0270217 A1 | 11/2006 | Balseanu et al. | |
| 2007/0054505 A1 | 3/2007 | Antonelli et al. | |
| 2007/0224777 A1* | 9/2007 | Hamelin | C23C 16/4586 438/457 |
| 2007/0256785 A1* | 11/2007 | Pamarthy | H01J 37/3244 156/345.33 |
| 2007/0258186 A1* | 11/2007 | Matyushkin | H01L 21/67109 361/234 |
| 2007/0277734 A1 | 12/2007 | Lubomirsky et al. | |
| 2007/0281495 A1 | 12/2007 | Mallick et al. | |
| 2007/0296035 A1 | 12/2007 | George et al. | |
| 2007/0298585 A1 | 12/2007 | Lubomirsky et al. | |
| 2008/0020591 A1 | 1/2008 | Balseanu et al. | |
| 2008/0054466 A1 | 3/2008 | Nasu et al. | |
| 2008/0066682 A1* | 3/2008 | Yamashita | C23C 16/4586 118/723 VE |
| 2008/0081434 A1 | 4/2008 | Nam et al. | |
| 2008/0089001 A1* | 4/2008 | Parkhe | H01L 21/6831 361/234 |
| 2008/0132087 A1 | 6/2008 | Xia et al. | |
| 2008/0199977 A1 | 8/2008 | Weigel et al. | |
| 2008/0274626 A1 | 11/2008 | Glowacki et al. | |
| 2008/0295872 A1* | 12/2008 | Riker | H01J 37/32357 134/105 |
| 2008/0318439 A1 | 12/2008 | Ito et al. | |
| 2009/0020847 A1 | 1/2009 | Byun et al. | |
| 2009/0053895 A1 | 2/2009 | Oshima et al. | |
| 2009/0061647 A1 | 3/2009 | Mallick et al. | |
| 2009/0104789 A1 | 4/2009 | Mallick et al. | |
| 2009/0104790 A1 | 4/2009 | Liang | |
| 2009/0159566 A1* | 6/2009 | Brillhart | C23C 16/4586 216/58 |
| 2009/0159587 A1* | 6/2009 | Shimanuki | H05B 3/143 219/443.1 |
| 2009/0190908 A1* | 7/2009 | Shibagaki | H01L 21/67115 392/416 |
| 2009/0215282 A1 | 8/2009 | Moore et al. | |
| 2009/0298257 A1 | 12/2009 | Lee et al. | |
| 2009/0321936 A1 | 12/2009 | Kojima et al. | |
| 2010/0000684 A1* | 1/2010 | Choi | H01J 37/32541 156/345.43 |
| 2010/0109155 A1 | 5/2010 | Liu et al. | |
| 2010/0167533 A1 | 7/2010 | Lim et al. | |
| 2011/0020955 A1 | 1/2011 | DeYoung | |
| 2011/0081782 A1 | 4/2011 | Liang et al. | |
| 2011/0151678 A1 | 6/2011 | Ashtiani et al. | |
| 2012/0149213 A1 | 6/2012 | Nittala et al. | |
| 2012/0161405 A1 | 6/2012 | Mohn et al. | |
| 2012/0164328 A1 | 6/2012 | Kojima et al. | |
| 2013/0122718 A1 | 5/2013 | Kato et al. | |
| 2013/0230987 A1 | 9/2013 | Draeger et al. | |
| 2014/0017904 A1 | 1/2014 | Gauri et al. | |
| 2014/0150647 A1 | 6/2014 | Ahn et al. | |
| 2014/0302689 A1 | 10/2014 | Ashtiani et al. | |
| 2015/0004806 A1 | 1/2015 | Ndiege et al. | |
| 2015/0044882 A1 | 2/2015 | Draeger et al. | |
| 2015/0118862 A1 | 4/2015 | Reilly et al. | |
| 2015/0118863 A1 | 4/2015 | Rathod et al. | |
| 2016/0056071 A1 | 2/2016 | Draeger et al. | |

FOREIGN PATENT DOCUMENTS

| | | |
|---|---|---|
| CN | 101079391 A | 11/2007 |
| EP | 1 063 692 A1 | 12/2000 |
| EP | 0 819 780 B1 | 2/2004 |
| JP | 2001-148382 | 5/2001 |
| JP | 2010-153859 | 7/2010 |
| KR | 10-2007-0104591 A | 10/2007 |
| KR | 10-2009-0040867 A | 4/2009 |
| TW | 380286 | 1/2000 |
| WO | WO 99/22043 A1 | 5/1999 |
| WO | WO 03/021642 | 3/2003 |
| WO | WO 2007/140376 | 12/2007 |
| WO | WO 2007/140424 | 12/2007 |
| WO | WO 2011/072143 | 6/2011 |

OTHER PUBLICATIONS

U.S. Appl. No. 12/986,070, filed Jan. 6, 2011, entitled "Density Gradient-Free Gap Fill".

U.S. Appl. No. 13/607,511, filed Sep. 7, 2012, entitled "Flowable Oxide Deposition Using Rapid Delivery of Process Gases".

U.S. Appl. No. 14/249,272, filed Apr. 9, 2014, entitled "Methods and Apparatus for Dielectric Deposition.".

US Office Action, dated Aug. 23, 2005, issued in U.S. Appl. No. 10/810,066.

US Notice of Allowance and Fee Due, dated Feb. 15, 2006, issued in U.S. Appl. No. 10/810,066.

US Office Action, dated Jun. 27, 2008, issued in U.S. Appl. No. 11/447,594.

US Notice of Allowance and Fee Due, dated Dec. 11, 2008, issued in U.S. Appl. No. 11/447,594.

US Office Action, dated May 24, 2010, issued in U.S. Appl. No. 12/411,243.

US Final Office Action, dated Sep. 13, 2010, issued in U.S. Appl. No. 12/411,243.

US Notice of Allowance, dated Oct. 6, 2010, issued in U.S. Appl. No. 12/411,243.

US Office Action, dated May 18, 2012, issued in U.S. Appl. No. 12/984,524.

US Final Office Action, dated Sep. 14, 2012, issued in U.S. Appl. No. 12/984,524.

US Notice of Allowance, dated Mar. 7, 2013, issued in U.S. Appl. No. 12/984,524.

US Office Action, dated Dec. 16, 2013, issued in U.S. Appl. No. 13/935,398.

US Notice of Allowance, dated Apr. 11, 2014, issued in U.S. Appl. No. 13/935,398.

(56) References Cited

OTHER PUBLICATIONS

US Office Action, dated Oct. 26, 2007, issued in U.S. Appl. No. 11/323,812.
US Final Office Action, dated Apr. 9, 2008, issued in U.S. Appl. No. 11/323,812.
US Office Action, dated Oct. 9, 2008, issued in U.S. Appl. No. 11/323,812.
US Notice of Allowance and Fee Due, dated Apr. 23, 2009, issued in U.S. Appl. No. 11/323,812.
US Notice of Allowance, dated Nov. 18, 2010, issued in U.S. Appl. No. 12/508,461.
US Notice of Allowance, dated Aug. 6, 2012, issued in U.S. Appl. No. 13/031,077.
US Notice of Allowance, dated Jul. 8, 2013, issued in U.S. Appl. No. 13/031,077.
US Office Action, dated Nov. 4, 2008, issued in U.S. Appl. No. 11/925,514.
US Final Office Action, dated Jun. 17, 2009, issued in U.S. Appl. No. 11/925,514.
US Notice of Allowance, dated Jul. 29, 2009, issued in U.S. Appl. No. 11/925,514.
US Office Action, dated Apr. 26, 2011, issued in U.S. Appl. No. 12/625,468.
US Final Office Action, dated Oct. 14, 2011, issued in U.S. Appl. No. 12/625,468.
US Notice of Allowance, dated Jan. 31, 2012, issued in U.S. Appl. No. 12/625,468.
US Office Action, dated Aug. 15, 2013, issued in U.S. Appl. No. 13/461,287.
US Office Action, dated Feb. 28, 2014, issued in U.S. Appl. No. 13/461,287.
US Office Action, dated Nov. 12, 2008, issued in U.S. Appl. No. 11/834,581.
US Final Office Action, dated Aug. 6, 2009, issued in U.S. Appl. No. 11/834,581.
US Office Action dated Dec. 18, 2009, issued in U.S. Appl. No. 11/834,581.
US Final Office Action, dated Apr. 22, 2010, issued in U.S. Appl. No. 11/834,581.
US Notice of Allowance, dated Oct. 7, 2010, issued in U.S. Appl. No. 11/834,581.
US Office Action, dated Nov. 25, 2011, issued in U.S. Appl. No. 12/986,070.
US Final Office Action, dated Jun. 25, 2012, issued in U.S. Appl. No. 12/986,070.
US Office Action, dated Feb. 26, 2010, issued in U.S. Appl. No. 12/334,726.
US Final Office Action, dated Oct. 26, 2010, issued in U.S. Appl. No. 12/334,726.
US Office Action, dated Sep. 16, 2011, issued in U.S. Appl. No. 12/334,726.
US Final Office Action, dated Mar. 30, 2012, issued in U.S. Appl. No. 12/334,726.
US Final Office Action, dated Oct. 23, 2012, issued in U.S. Appl. No. 12/334,726.
US Notice of Allowance dated Jun. 10, 2013, issued in U.S. Appl. No. 12/334,726.
US Notice of Allowance, dated May 29, 2012, issued in U.S. Appl. No. 12/566,085.
US Notice of Allowance, dated Jun. 21, 2012, issued in U.S. Appl. No. 12/566,085.
US Office Action, dated Jun. 21, 2013, issued in U.S. Appl. No. 13/607,511.
US Final Office Action, dated Dec. 11, 2013, issued in U.S. Appl. No. 13/607,511.
US Office Action, dated Jul. 25, 2014, issued in U.S. Appl. No. 13/607,511.
US Office Action, dated Dec. 21, 2012, issued in U.S. Appl. No. 12/964,110.

US Final Office Action, dated Sep. 12, 2013, issued in U.S. Appl. No. 12/694,110.
US Notice of Allowance, dated Dec. 27, 2013, issued in U.S. Appl. No. 12/964,110.
US Notice of Allowance, dated Apr. 23, 2014, issued in U.S. Appl. No. 12/964,110.
US Office Action, dated Dec. 6, 2012, issued in U.S. Appl. No. 13/315,123.
US Office Action, dated Jul. 15, 2013, issued in U.S. Appl. No. 13/315,123.
US Notice of Allowance, dated Nov. 8, 2013, issued in U.S. Appl. No. 13/315,123.
US Office Action, dated Nov. 8, 2013, issued in U.S. Appl. No. 13/313,735.
US Final Office Action, dated Jul. 29, 2014, issued in U.S. Appl. No. 13/313,735.
US Office Action, dated Sep. 12, 2013, issued in U.S. Appl. No. 13/493,936.
US Final Office Action, dated Feb. 3, 2014, issued in U.S. Appl. No. 13/493,936.
US Notice of Allowance, dated May 22, 2014, issued in U.S. Appl. No. 13/493,936.
Japanese Office Action dated Sep. 17, 2013 issued in JP2009-282737.
Japanese Office Action dated Jun. 3, 2014 issued in JP2009-282737.
PCT International Search Report and Written Opinion dated Aug. 10, 2011 issued in PCT/US2010/059721.
PCT International Preliminary Report on Patentability and Written Opinion dated Jun. 21, 2012 issued in PCT/US2010/059721.
Chinese First Office Action dated Feb. 8, 2014 issued in CN 2010-80055670.3.
Chung, Sung-Woong et al. (Mar. 2004) "Flowable Oxide CVD Process for Shallow Trench Isolation in Silicon Semiconductor," *Journal of Semiconductor Technology and Science,* 4(1):45-51.
Chung, Sung-Woong, et al. (2002) "Novel Shallow Trench Isolation Process Using Flowable Oxide CVD for sub-100nm DRAM," *IEEE, IEDM,* pp. 233-236.
Hatanaka, M., et al. (1991) "$H_2O$-TEOS Plasma-CVD Realizing Dielectrics Having a Smooth Surface," *IEEE,* VMIC Conference, pp. 435-441.
Matsuura, M., et al. (1994) "Novel Self-Planarizing CVD Oxide for Interlayer Dielectric Applications," *IEEE,* pp. 117-120.
Nakano, M., et al. (1989) "Digital CVD of $SiO_2$," *Extended Abstracts of the 21$^{st}$ Conference on Solid State Devices and Materials,* Tokyo, pp. 49-52.
Noguchi, S. et al. (1987) "Liquid Phase Oxidation Employing O Atoms Produced by Microwave Discharge and $Si(CH_3)_4$," *Extended Abstracts of the 19$^{th}$ Conference on Solid State Devices and Materials,* Tokyo, pp. 451-454.
Sakaue, H., et al. (1990) "Digital Chemical Vapor Deposition of $SiO_2$ Using a Repetitive Reaction of Triethylsilane /Hydrogen and Oxidation," *Department of Electrical Engineering, Hiroshima University,* pp. L 124-L 127.
U.S. Appl. No. 14/464,071, filed Aug. 20, 2014, entitled "Flowable Dielectric for Selective Ultra Low-K Pore Sealing.".
U.S. Appl. No. 14/942,703, filed Nov. 16, 2015, entitled "Apparatus for UV Flowable Dielectric."
U.S. Appl. No. 14/942,704, filed Nov. 16, 2015, entitled "Low K Dielectric Deposition Via UV Driven Photopolymerization."
US Office Action, dated Mar. 25, 2015, issued in U.S. Appl. No. 14/464,196.
US Notice of Allowance, dated Sep. 14, 2015, issued in U.S. Appl. No. 14/464,196.
US Final Office Action, dated Aug. 26, 2014, issued in U.S. Appl. No. 13/461,287.
US Notice of Allowance, dated Apr. 20, 2015, issued in U.S. Appl. No. 13/461,287.
US Notice of Allowance, dated Sep. 10, 2015, issued in U.S. Appl. No. 13/461,287.
US Notice of Allowance [Corrected Notice of Allowability], dated Oct. 22, 2015, issued in U.S. Appl. No. 13/461,287.
US Notice of Allowance, dated Jan. 23, 2015, issued in U.S. Appl. No. 13/607,511.

(56) References Cited

OTHER PUBLICATIONS

US Office Action, dated Oct. 10, 2014, issued in U.S. Appl. No. 13/313,735.
US Office Action, dated Apr. 20, 2015, issued in U.S. Appl. No. 13/313,735.
US Office Action, dated Oct. 22, 2015, issued in U.S. Appl. No. 13/313,735.
US Office Action, dated Dec. 9, 2014, issued in U.S. Appl. No. 14/466,222.
US Final Office Action, dated Jul. 14, 2015, issued in U.S. Appl. No. 14/466,222.
US Notice of Allowance, dated Oct. 23, 2015, issued in U.S. Appl. No. 14/466,222.
Chinese Second Office Action dated Dec. 15, 2014 issued in CN 2010-80055670.3.
Chinese Third Office Action and Search Report dated Jun. 23, 2015 issued in CN 2010-80055670.3.
Taiwan Office Action [no translation] dated Jun. 12, 2015 issued in TW 099143081.
Chinese First Office Action and Search Report dated Dec. 18, 2014 issued in CN 201110424193.X.
Chinese Second Office Action and Search Report dated Sep. 14, 2015 issued in CN 201110424193.X.
Chinese First Office Action and Search Report dated Jan. 6, 2015 issued in CN 201110442926.2.
Chinese Second Office Action and Search Report dated Aug. 25, 2015 issued in CN 201110442926.2.
Bekiari, V. et al. (1998) "Characterization of Photoluminescence from a Material Made by Interaction of (3-Aminopropyl)triethoxysilane with Acetic Acid," *Langmuir*, 14(13):3459-3461.
Brankova et al. (2003) "Photoluminescence from Sol-Gel Organic/Inorganic Hybrid Gels Obtained through Carboxylic Acid Solvolysis," *Chem. Mater.*, 15(9):1855-1859.
Fessenden et al. (1961) "The Chemistry of Silicon-Nitrogen Compounds," *Chem. Rev.* 61(4)361-388.
Kessler et al.(2006) "New insight in the role of modifying ligands in the sol-gel processing of metal alkoxide precursors: A possibility to approach new classes of materials," *J. Sol-Gel Sci. Techn.* 40(2-3):163-179.
Stathatos et al. (Jul. 19, 2003) "Study of Acetic Acid-Catalyzed Nanocomposite Organic/Inorganic Ureasil Sol—Gel Ionic Conductors," *Langmuir*, 19:(18)7587-7591.
US Office Action, dated Jan. 20, 2016, issued in U.S. Appl. No. 14/519,400.
US Final Office Action, dated Jul. 29, 2016, issued in U.S. Appl. No. 14/519,400.
US Office Action, dated Jan. 21, 2016, issued in U.S. Appl. No. 14/519,712.
US Final Office Action, dated Jul. 29, 2016, issued in U.S. Appl. No. 14/519,712.
US Office Action, dated Dec. 30, 2015, issued in U.S. Appl. No. 14/464,071.
US Final Office Action, dated Sep. 2, 2016, issued in U.S. Appl. No. 14/464,071.
US Office Action, dated May 6, 2016, issued in U.S. Appl. No. 14/942,704.
US Final Office Action, dated Oct. 19, 2016, issued in U.S. Appl. No. 14/942,704.
US Notice of Allowance [Corrected Notice of Allowability], dated Jan. 11, 2016, issued in U.S. Appl. No. 13/461,287.
US Office Action, dated Jun. 24, 2016, issued in U.S. Appl. No. 14/249,272.
US Final Office Action, dated Feb. 19, 2016, issued in U.S. Appl. No. 13/313,735.
Korean Office Action dated Dec. 27, 2015 issued in KR 10-2009-0124466.
Korean Office Action dated Jul. 12, 2016 issued in KR 10-2009-0124466.
Chinese Fourth Office Action dated Mar. 14, 2016 issued in CN 201080055670.3.
Korean Office Action [no translation] dated Nov. 1, 2016 issued in TW 2012-7013775.
Taiwan Office Action dated Dec. 10, 2015 issued in TW 099143081.
Taiwan Office Action dated Apr. 20, 2016 issued in TW 100145389.
Taiwan Office Action dated Nov. 20, 2015 issued in TW 100147521.
Weast, (1975) "CRC Handbook of Chemistry and Physics," *56th edition, CRC Press,* Cleveland, Ohio, excerpts from F-95 & F-119, 4 pages.

\* cited by examiner

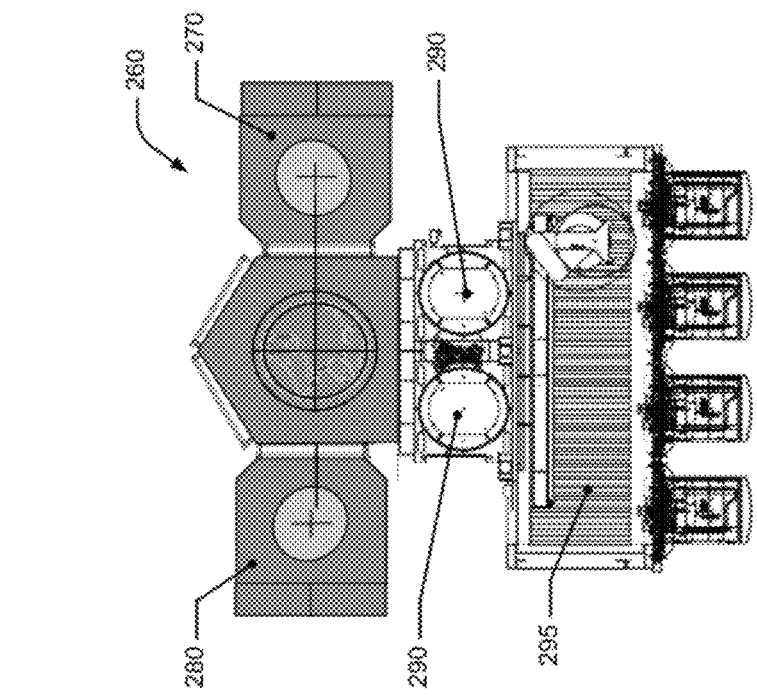
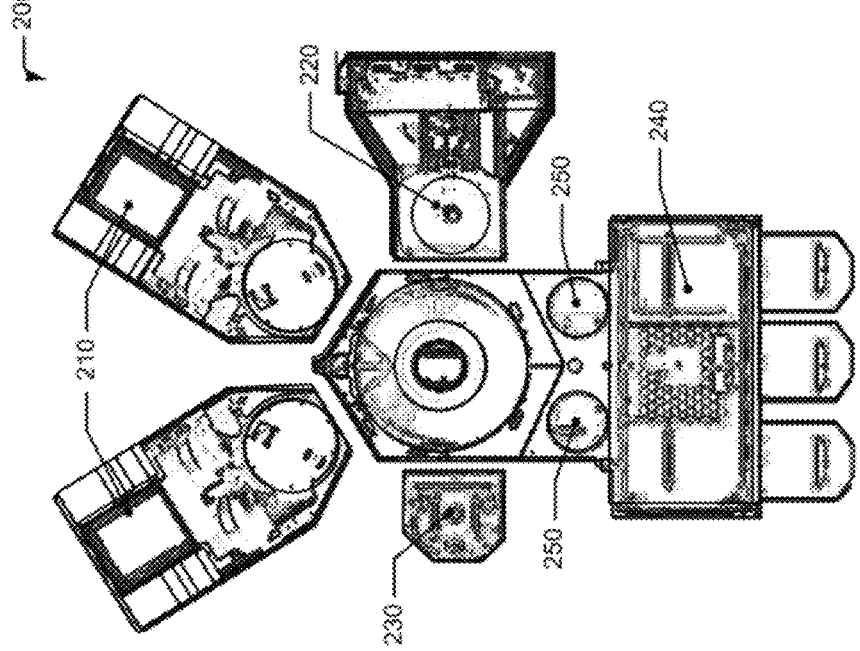
Fig. 2A
Fig. 2B

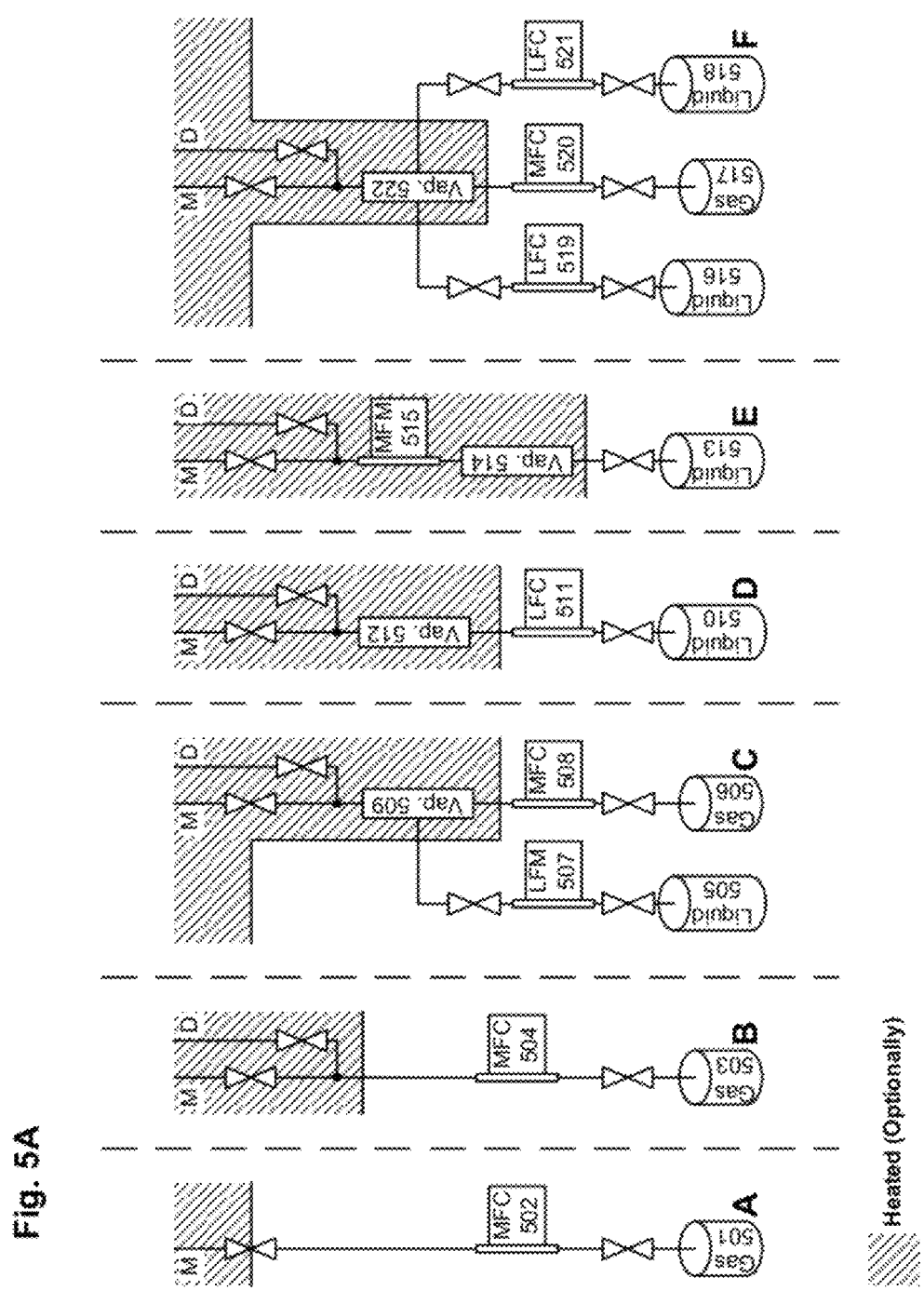

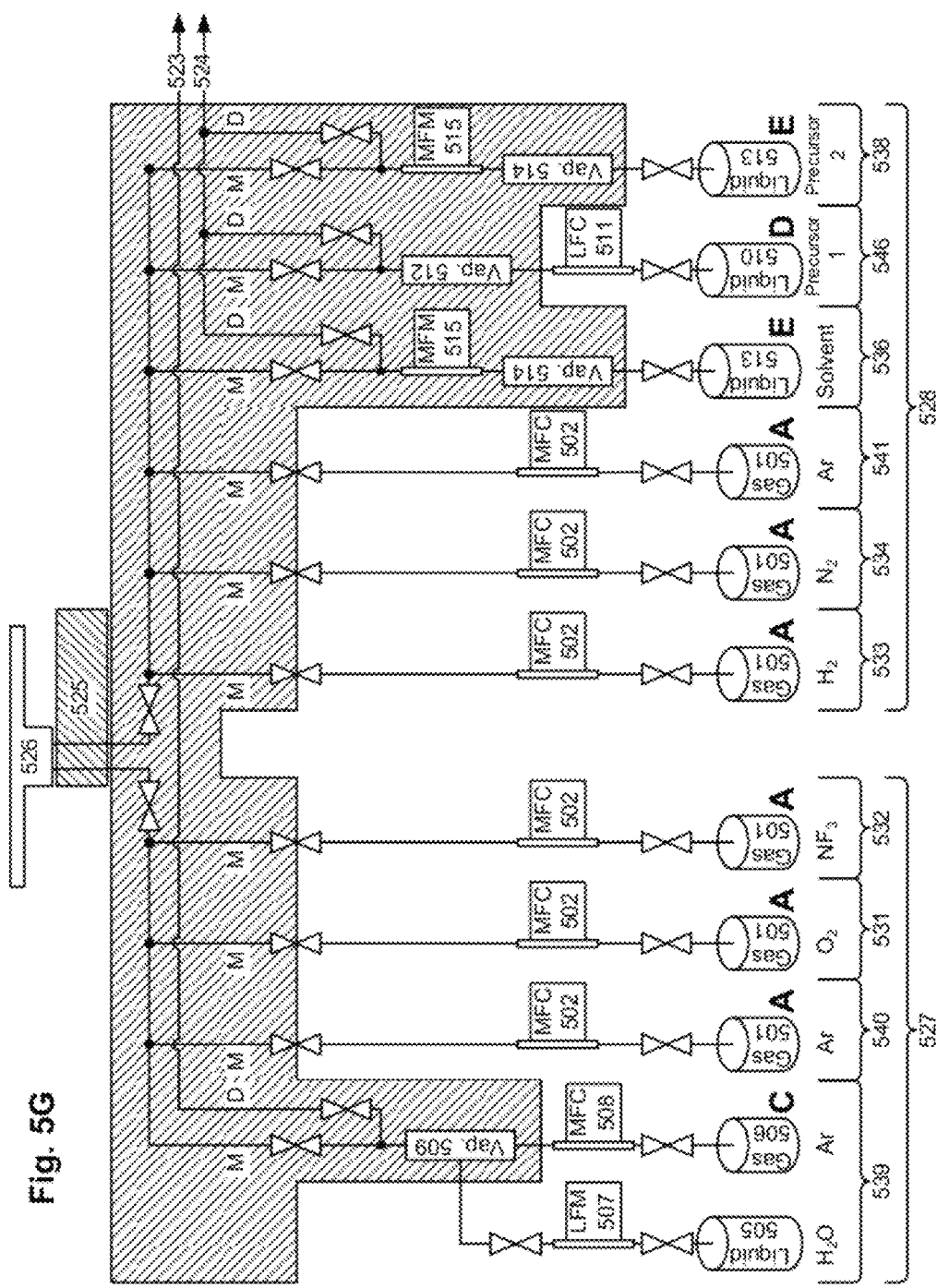

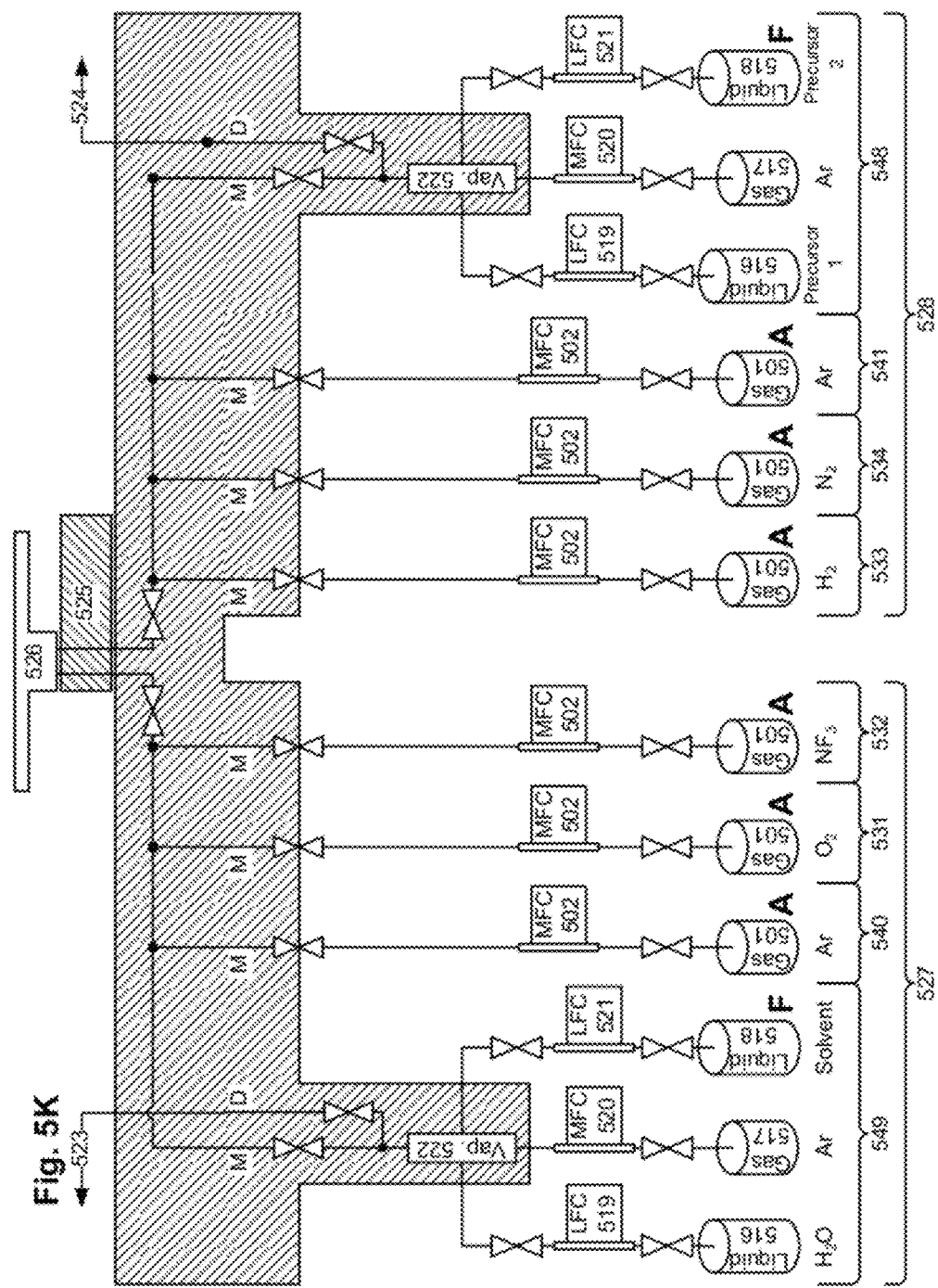

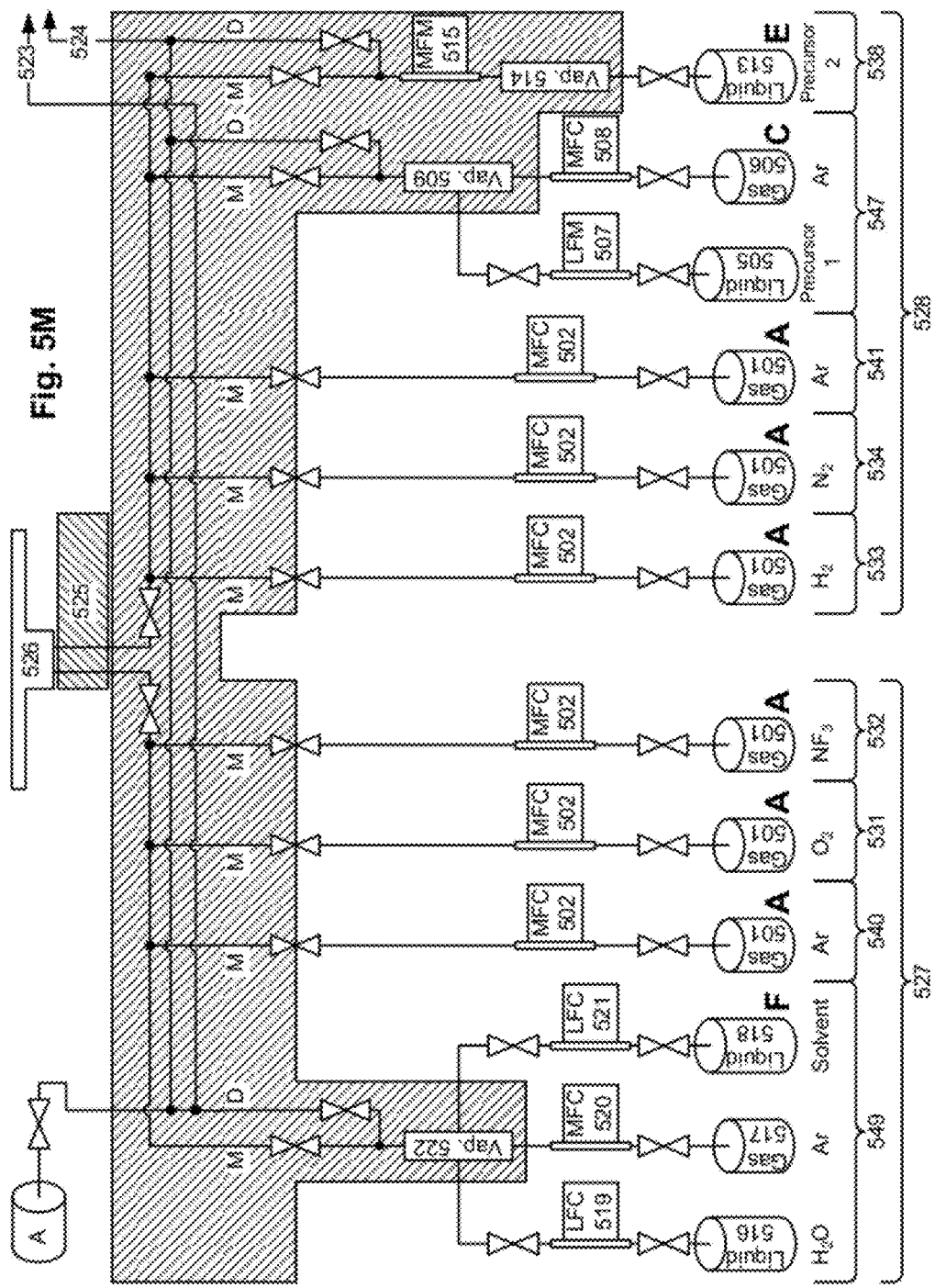

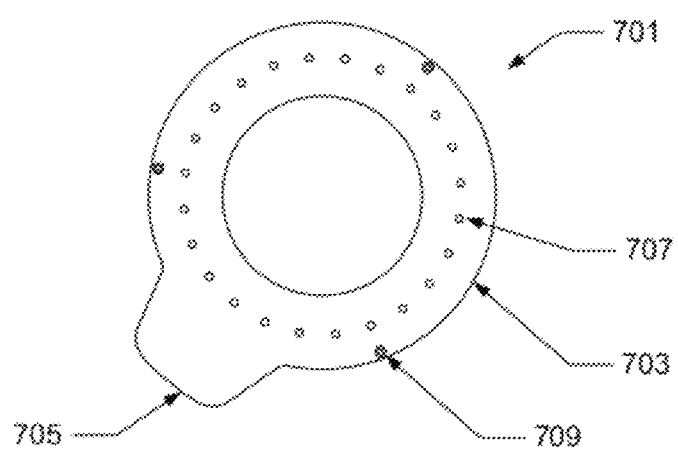
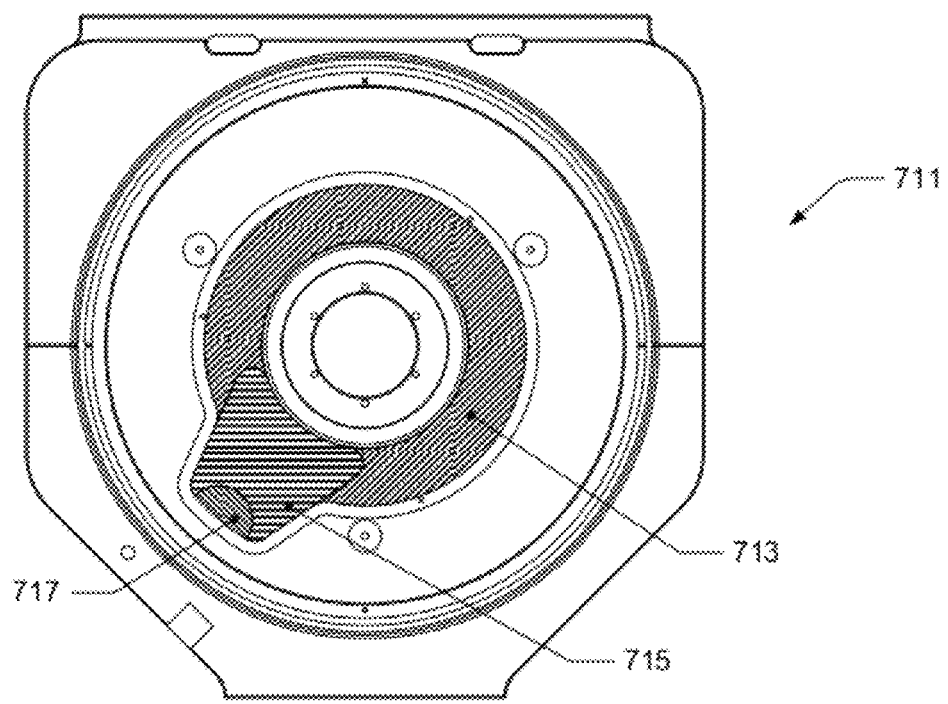

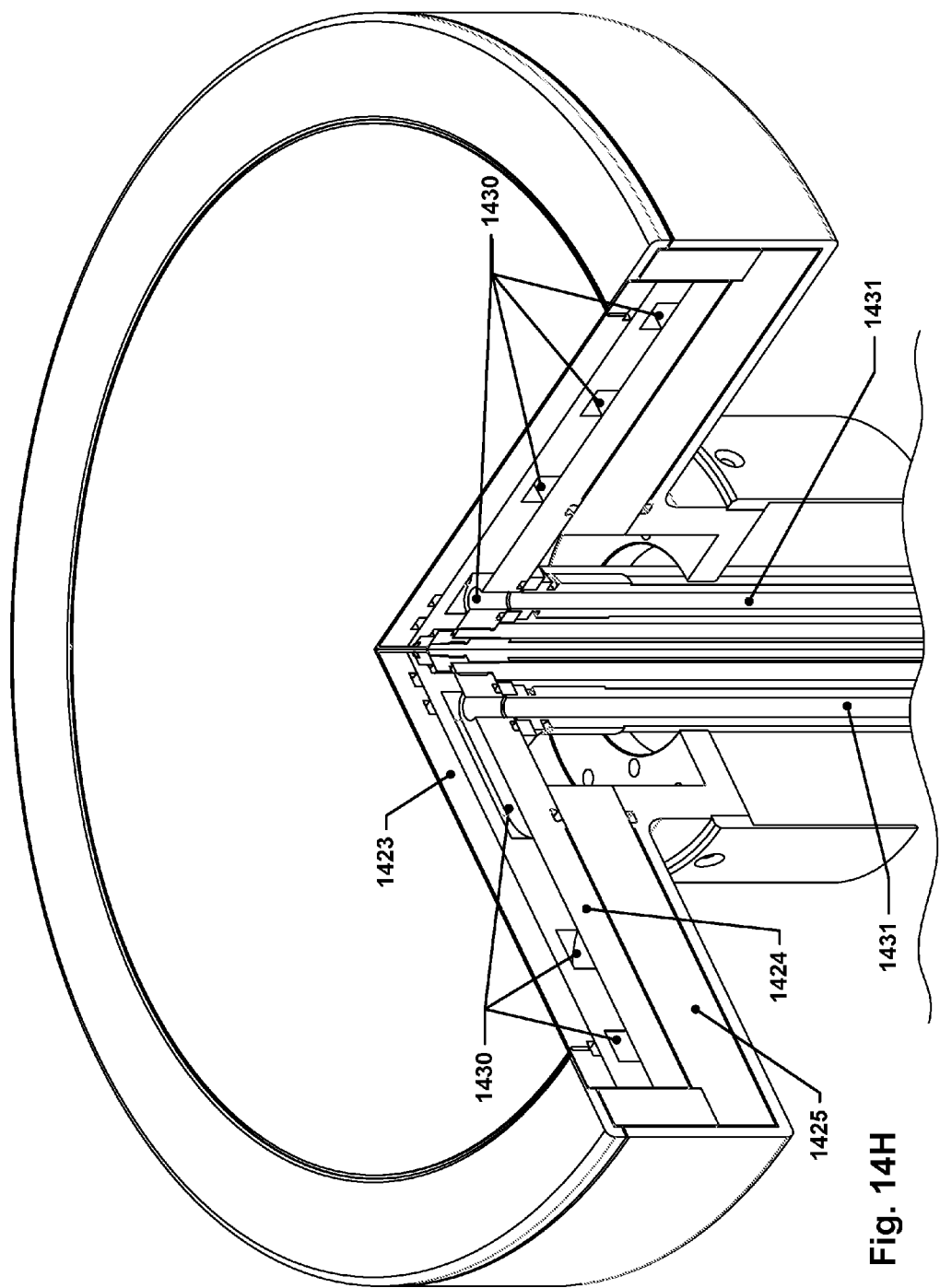

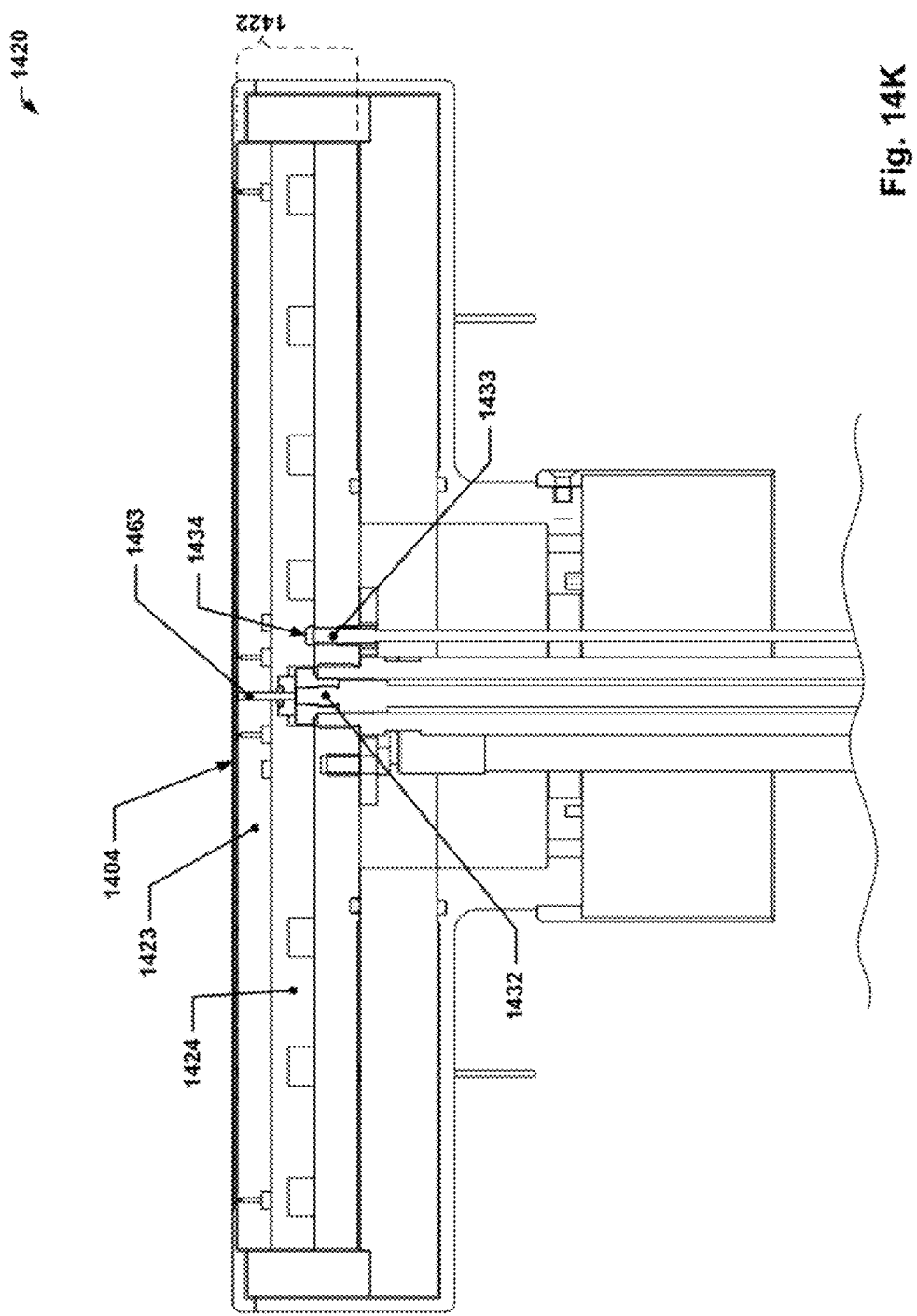

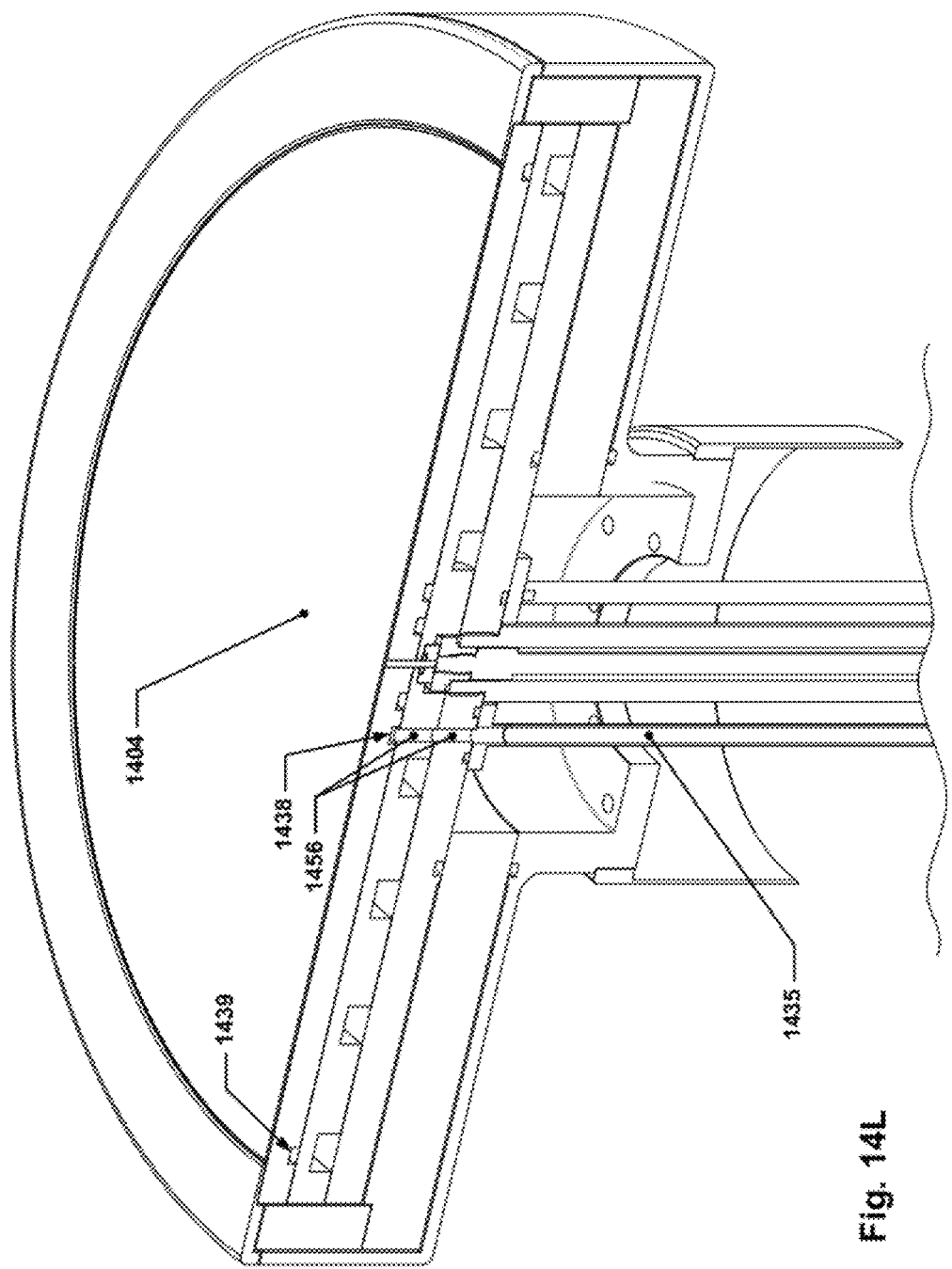

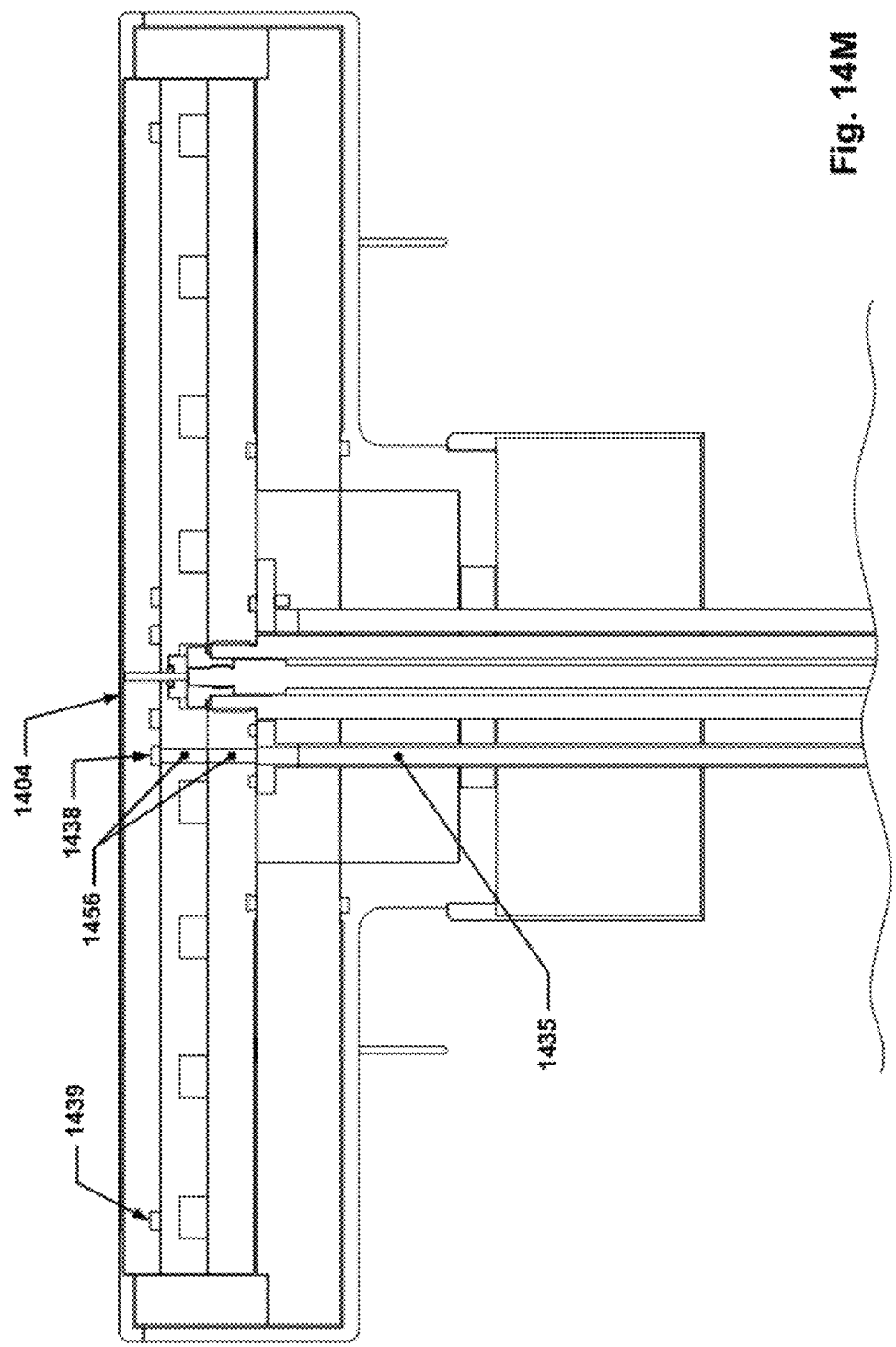

SYSTEM AND APPARATUS FOR FLOWABLE DEPOSITION IN SEMICONDUCTOR FABRICATION

CROSS-REFERENCE TO RELATED APPLICATIONS

This application claims benefit under 35 U.S.C. §119(e) to U.S. Provisional Application No. 61/425,150, filed Dec. 20, 2010, which is incorporated by reference herein.

BACKGROUND OF THE INVENTION

This invention relates to electronic device fabrication processes, apparatuses and systems. In particular embodiments, it relates to dielectric gap fill processes, apparatuses and systems.

It is often necessary in semiconductor processing to fill high aspect ratio gaps with insulating material. This is the case for shallow trench isolation (STI), inter-metal dielectric (IMD) layers, inter-layer dielectric (ILD) layers, pre-metal dielectric (PMD) layers, passivation layers, etc. As device geometries shrink and thermal budgets are reduced, void-free filling of narrow width, high aspect ratio (AR) features (e.g., AR>6:1) becomes increasingly difficult due to limitations of existing deposition processes.

New methods, apparatuses, systems and technologies for dielectric gap fill are discussed herein.

SUMMARY

In some implementations, a wafer support apparatus is provided. The wafer support apparatus may include a chuck including a top surface, a bottom surface, and an outer surface. The top surface and the bottom surface may both be substantially parallel to, and offset from, each other. The outer surface may be located between the top surface and the bottom surface, and the top surface may be configured to support a semiconductor wafer. The wafer support apparatus may also include a housing. The housing may include an outer wall and a housing floor connected to the outer wall. The housing floor may include a first thermal break region extending from the outer wall towards the center of the housing floor. The first thermal break region may stop short of extending all the way towards the center of the housing floor. The bottom surface of the chuck may face the housing floor, and the bottom surface and the outer surface of the chuck may be substantially within a volume defined by the outer wall and the housing floor. The chuck and the housing may be configured to move together as a single assembly within a semiconductor fabrication chamber. There may be no substantial thermal contact between the outer surface of the chuck and the outer wall of the housing, and no substantial thermal contact between the bottom surface and the housing floor across the first thermal break region.

In some further implementations, the no substantial thermal contact between the outer surface of the chuck and the outer wall of the housing and the no substantial thermal contact between the bottom surface and the housing floor across the first thermal break region may occur when the wafer support apparatus is exposed to gases and environmental conditions present in a flowable deposition semiconductor fabrication chamber. In yet some further implementations, the gases may include Ar or He and the environmental conditions may include a pressure of between 25 and 75 Torr.

In some implementations, there may be a gap of at least 0.015" between substantially all of the outer surface of the chuck and the outer wall of the housing, and a gap of at least 0.015" between substantially all of the bottom surface and the housing floor across the first thermal break region.

In some implementations, the outer surface and the outer wall may be substantially cylindrical, the housing floor may be substantially annular and have an inner perimeter, and the thermal break region may not extend to the inner perimeter.

In some further implementations, the wafer support apparatus may further include a dielectric break. The dielectric break may include an outer dielectric wall and a dielectric floor that meets the outer dielectric wall, and the dielectric floor may include a second thermal break region extending from the outer dielectric wall towards the center of the dielectric floor. The dielectric floor may be interposed between the housing floor and the bottom surface, and the outer dielectric wall may be interposed between the outer wall and the outer surface. There may be no substantial thermal contact between the outer wall, the outer dielectric wall, and the outer surface, no substantial thermal contact between the bottom surface and the dielectric floor across the second thermal break region, and no substantial thermal contact between the dielectric floor and the housing floor across the first thermal break region.

In some implementations, the outer surface and a surface of the outer dielectric wall facing the outer surface may be separated by a gap of between 0.015" and 0.050", the bottom surface and a surface of the dielectric floor within the second thermal break region and facing the bottom surface may be separated by a gap of between 0.015" and 0.050", the surfaces of the outer dielectric wall and the outer wall facing each other may be separated by a gap of between 0.015" and 0.050", and the surface of the dielectric floor and a surface of the housing floor within the first thermal break region may be separated by a gap of between 0.015" and 0.050".

In some implementations, the chuck may include a cooling channel located between the top surface and the bottom surface and following a circuitous path through the chuck. In some further implementations, the circuitous path may include a plurality of nested C-shaped segments of different sizes and a plurality of cross-over segments. Each cross-over segment may join an end of one C-shaped segment with a corresponding end of another C-shaped segment, and only one cross-over segment may join together any two C-shaped segments.

In some implementations, the chuck may include an annular purge gas channel located between the top surface and the bottom surface. A circular pattern of holes may fluidly connect the annular purge gas channel with the top surface. In yet some further implementations, the wafer support may be configured to support wafers of a specified nominal diameter and the diameter of the circular pattern may be smaller than the nominal diameter by 1-2 mm In some implementations, the wafer support apparatus may also include a guard ring. The guard ring may be substantially annular and have an inner diameter larger than a specified nominal diameter of the semiconductor wafer which the top surface is configured to support. The guard ring may be supported by the chuck, and may not be in contact with the outer wall of the housing or the outer surface of the chuck. In some further implementations, the guard ring may include a plurality of posts, each post protruding from a surface of the guard ring facing the top surface by a first amount and protruding into a recess in the top surface with a depth less than the first amount. The surface of the guard ring from which the posts protrude may be offset from the top surface by between 15 and 250 microns. In some implementations, there may be a gap of at least 0.015" between a surface of the guard ring closest to the outer wall and the outer wall.

In some implementations, a plurality of raised bosses protrude from the top surface of the chuck. The bosses may be arranged in concentric circular patterns, and each boss may protrude from the top surface by 15 to 250 microns.

In some implementations, the chuck may further include a calibration light pipe and an in-situ light pipe. One end of the calibration light pipe may terminates at the center of the top surface, and one end of the in-situ light pipe may terminate at a phosphor puck located between the top surface and the bottom surface. The calibration light pipe and the in-situ light pipe may be separated, within the chuck, by a distance less than the distance from the center of the housing floor to the first thermal break region.

In some implementations, the chuck may include a first plate and a second plate. The first plate may include a first top face and a first bottom face, and the second plate may include a second top face and a second bottom face. The first top face may be bonded to the second bottom face, and the cooling channel may be recessed into the second bottom face. The first plate may include two through-holes, each through-hole corresponding with a different terminal end of the cooling channel and the first plate and the second plate may be aligned such that each through-hole aligns with the corresponding terminal end of the cooling channel. In yet some further implementations, the chuck may further include a third plate with a third top face and a third bottom face. The third bottom face may be bonded to the second top face, and the third bottom face may include an annular purge gas channel and one or more purge gas supply channels fluidly connected with the annular purge gas channel. A circular pattern of holes may fluidly connect the annular purge gas channel with the third top face, and a purge gas inlet may pass through the first plate and the second plate and fluidly connect the one or more purge gas supply channels with the first bottom face.

In some implementations, the chuck and the housing may be made primarily from aluminum, and the dielectric break may be made primarily from Al2O3. In some further implementations, the chuck may be primarily made from 3003 aluminum, and the top surface may be coated with YF3.

In some implementations, an apparatus for semiconductor fabrication may be provided. The apparatus for semiconductor fabrication may include a chamber, a chuck, a chuck housing, and a controller. The chamber may include a heater system and a substantially cylindrical inner surface. The chuck may include a wafer support area that is not obstructed by the chuck housing, a substantially cylindrical outer surface, and a cooling system, and be contained substantially within, and be supported by, the chuck housing. The chuck housing may include a substantially cylindrical outer surface, and be movable with respect to the chamber. The controller may be configured to control the heater system and the cooling system, and to produce a first operating configuration by regulating the cooling system temperature and the heating system temperature. In the first operating configuration, the inner surface of the chamber may have a temperature of at least 40° C., the wafer support area may have a temperature of between −10 and +10° C., and the outer surface of the chuck housing may have a temperature of at least 5° C. higher than the temperature of the wafer support area.

In some further implementations, the controller may be further configured to produce a second operating configuration by regulating the cooling system temperature and the heating system temperature. In the second operating configuration, the inner surface of the chamber, the outer surface of the chuck housing, and the wafer support area may have temperatures of greater than 70° C.

In some further implementations, the controller may be further configured to produce a third operating configuration by regulating the cooling system temperature and the heating system temperature. In the third operating configuration, the inner surface of the chamber, the outer surface of the chuck housing, and the wafer support area have a temperature of between 30 and 50° C. In some implementations, the controller may be further configured to maintain a temperature profile with a temperature variation of less than 0.35° C. across a wafer supported by the wafer support area.

In some implementations, a semiconductor fabrication module may be provided. The semiconductor fabrication module may include a chamber, a wafer support apparatus, a showerhead, a gas distribution system, a heating system, a cooling system, and a temperature controller. The chamber may include an inner surface, a top plate, and a floor. The wafer support apparatus may be contained within the chamber and may include a chuck and a housing. The chuck may be configured to support a semiconductor wafer of nominal diameter D during processing via a wafer support area located on a top surface of the chuck, be substantially cylindrical in overall shape, and have a nominal diameter larger than D. The housing may include an outer surface and a floor. The outer surface may be substantially cylindrical may define the outer edge of the floor. The chuck may be substantially within the volume defined by the outer surface. The showerhead may be located above the wafer support area. The gas distribution system may be configured to deliver reactants to the chamber via the showerhead. The heating system may be configured to heat the inner surface, the top plate, and the floor of the chamber, and the cooling system may be configured to cool the chuck. The temperature controller may be configured to control the amount of heating supplied by the heating system and the amount of cooling supplied by the cooling system. The temperature controller may also be configured to provide a first operating configuration by regulating the cooling system and the heating system. In the first operating configuration, the inner surface of the chamber may have a temperature of at least 40° C., the wafer support area may have a temperature of between −10 and +10° C., and the outer surface of the housing may have a temperature of at least 5° C. higher than the temperature of the wafer support area.

In some implementations of the semiconductor fabrication module, the showerhead may include a first plenum and a second plenum. The first plenum and the second plenum may be fluidly isolated from each other within the showerhead and may each be equipped with gas distribution holes fluidly connecting both plenums with a process volume located between the wafer support area and the showerhead. The gas distribution system may be further configured to deliver one or more first reactants to the first plenum of the showerhead via a first showerhead supply line, and deliver one or more second reactants to the second plenum of the showerhead via a second showerhead supply line. In some further implementations, the first showerhead supply line may be configured to be heated by a first showerhead supply line heater, the second showerhead supply line may be configured to be heated by a second showerhead supply line heater, and the temperature controller may be further configured to control the amount of heating supplied by the first showerhead supply line heater and the second showerhead supply line heater. In yet some further implementations, the first showerhead supply line heater, the second showerhead supply line heater, and the temperature controller may be configured to heat the first showerhead supply line and the second showerhead supply line to temperatures of at least 100° C.

In some implementations of the semiconductor fabrication module, the chuck may be configured to supply a purge gas about the perimeter of the wafer support area. In some further implementations of the semiconductor fabrication module, the wafer support area may include a plurality of bosses configured to offset semiconductor wafers supported by the wafer support area from the chuck by a distance of between 15 and 250 microns. The chuck may be configured to supply the purge gas about the perimeter of the wafer support area through a circular pattern of purge gas holes. The circular pattern may have a diameter approximately 1 to 2 mm less than the nominal diameter, and the purge gas holes may have an exit diameter of less than the diameter difference between the circular pattern and the nominal diameter.

In some implementations of the semiconductor fabrication module, the wafer support apparatus may further include a dielectric break interposed between the chuck and the housing. The dielectric break may be in substantial thermal contact with the housing across a central housing area of the floor of the housing, and not in substantial thermal contact across the portion of the floor excluding the central housing area. The dielectric break may also be in substantial thermal contact with the chuck across a central chuck area, and not in substantial thermal contact with the chuck across the portion of the chuck excluding the central chuck area. The central chuck area and the central housing area may have nominal sizes, when viewed along the center axis of the housing outer surface, of less than 50% of the diameter of the chuck.

In some further implementations of the semiconductor fabrication module, surfaces of the dielectric break and the housing which face each other, excluding portions of such faces in contact with each other across the central housing area, may be separated from each other by a gap of between 0.015" and 0.050", and surfaces of the dielectric break and the chuck which face each other, excluding portions of such faces in contact with each other across the central chuck area, may be separated from each other by a gap of between 0.015" and 0.050".

In some further implementations of the semiconductor fabrication module, the wafer support apparatus may further include a guard ring. The guard ring may be supported by the chuck, may be substantially axially symmetric, and may have an inner diameter less than the nominal diameter of the chuck. The guard ring may be offset from the chuck along the chuck center axis by between 15 microns and 250 microns. The offset from the chuck may be provided by posts which are in thermal contact with the chuck across the portion of the overlap not offset from the chuck, and the surfaces of the guard ring and the dielectric break which face each other may be separated by a gap of 0.015" to 0.050" and surfaces of the guard ring and the housing which face each other are separated by a gap of 0.015" to 0.050".

In some implementations, one or more components of the semiconductor fabrication chamber selected from the group consisting of the chamber, the chuck, the housing, and the showerhead may be at least partially coated with a hydrophobic coating in areas which are exposed to reactants within the chamber. In some further implementations, the hydrophobic coating may be TiO2.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

FIGS. 2A and 2B illustrate plan views of tools using flowable gap fill modules.

FIG. 5A schematically illustrates various gas supply modules for use with a gas delivery system in some implementations of a flowable gap fill apparatus.

FIG. 5G schematically illustrates a fourth example gas delivery system using Ar as a carrier gas.

FIG. 5K schematically illustrates an eighth example gas delivery system using Ar as a carrier gas.

FIG. 5M schematically illustrates the ninth gas delivery system using Ar as a carrier gas with an optional divert line purge gas source.

FIG. 7A illustrates a removable baffle plate in plan view.

FIG. 7B illustrates a reactor and annular channel in plan view.

FIG. 14H depicts an isometric partial section view of the wafer support apparatus of FIG. 14A illustrating cooling line interfaces.

FIG. 14K depicts a side view of the section shown in FIG. 14J.

FIG. 14L depicts an isometric section view of the wafer support apparatus of FIG. 14A illustrating a gas purge interface.

FIG. 14M depicts a side view of the section shown in FIG. 14L.

FIG. 14O depicts a side view of the section shown in FIG. 14N.

DETAILED DESCRIPTION OF THE INVENTION

Introduction

Provided herein are apparatuses, systems and methods for dielectric gap fill. According to various embodiments, the apparatuses and systems are configured for gap fill in various integration processes that include deposition of a flowable dielectric material, in certain embodiments, a flowable oxide material. While the discussion below includes details of a flowable oxide deposition process, similar techniques and equipment may also be used for flowable nitrides and carbides; the present application should not be read as being limited to flowable oxide techniques and is intended to encompass such additional flowable film techniques as well. These methods, apparatuses, systems, and technologies are also not restricted solely to gap fill applications, however, and may be of use in any flowable deposition semiconductor fabrication process, including, but not limited to, planarization, sacrificial film deposition, and pore sealing. In certain embodiments, the apparatuses and systems are configured for gap fill with flowable dielectric material and high density plasma chemical vapor deposition dielectric material.

Various terms which imply a particular orientation with respect to the environment, such as, but not limited to, "bottom," "top," "underneath," etc. may be used in conjunction with the drawings to aid in understanding the concepts described herein. Use of such terms should not be interpreted as requiring that such orientations be used in implementing the concepts described herein, unless a particular concept requires the described orientation to function.

Figure 1:
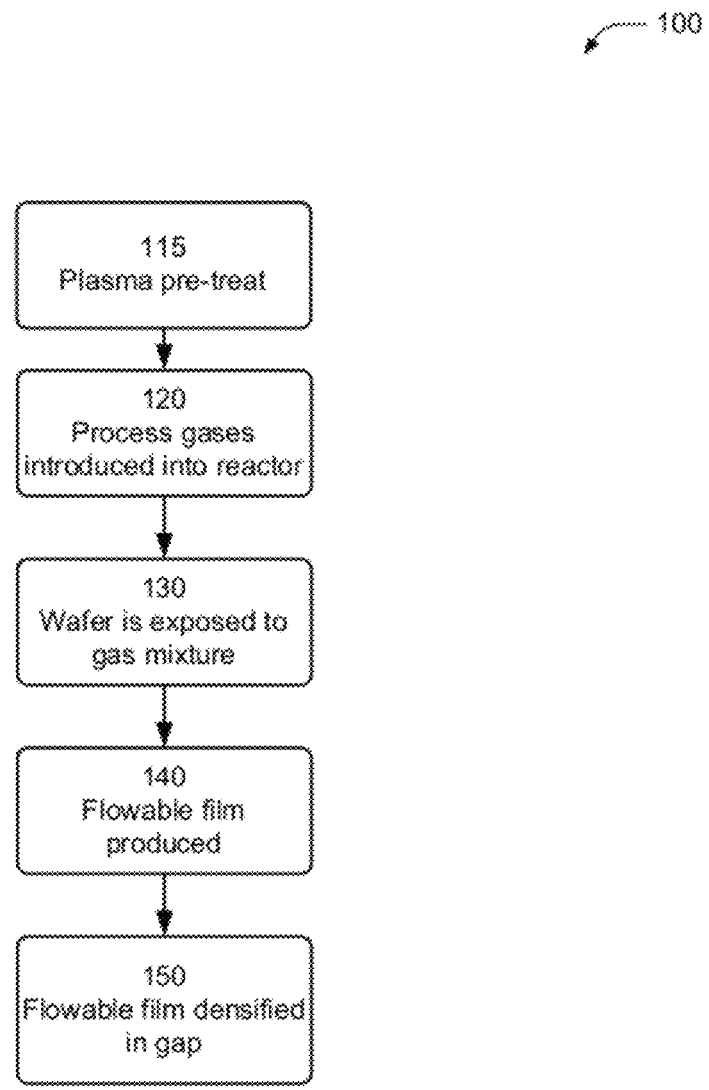
FIG. 1 illustrates a flowable gap fill process diagram.

FIG. 1 is a process flow sheet depicting a representative flowable gap-fill method. Many or all of the steps shown in FIG. 1 may be performed in a flowable gap-fill deposition module, although some steps may be performed in another process module. For example, steps 115 and 150 may be performed in a module specifically configured for plasma treatment. The wafer may be provided to a module and transitioned between modules as appropriate. Providing the wafer to a module may involve clamping the wafer to a pedestal or other support in a chamber of the module. For this purpose, an electrostatic or mechanical chuck may be employed. Transitioning the module may be performed under vacuum, e.g., using a vacuum transfer system, or under inert atmosphere as appropriate.

A plasma pre-treatment or clean may be performed in step 115 to prepare the wafer for deposition. Step 115 may also, as mentioned above, occur in a separate module or chamber from other steps in process 100. If so, the wafer may need to be transferred to the deposition reactor after step 115 is performed.

In step 120, process gases are introduced. In embodiments in which a silicon-based dielectric is formed, the process gases include a silicon-containing compound and, if necessary, another reactant. For example, a silicon-containing precursor may be reacted with an oxidant to form a silicon oxide, or with a nitride to form a silicon nitride. The gases may also include one or more dopant precursors. Sometimes, although not necessarily, an inert carrier gas is present. In certain embodiments, the gases are introduced using a liquid injection system. The silicon-containing compound and the oxidant are introduced to the reaction chamber via separate inlets. In certain embodiments the process gases including a solvent, catalyst and/or dopants. Also, in certain embodiments, the reactants may be provided in manner that increases residence time over the wafer surface and/or maximizes reactor utilization. For example, a reactant may be introduced prior to other reactants.

Examples of silicon containing precursors include, but are not limited to, alkoxysilanes, e.g., tetraoxymethylcyclotetrasiloxane (TOMCTS), octamethylcyclotetrasiloxane (OMCTS), tetraethoxysilane (TEOS), triethoxysilane (TES), trimethoxysilane (TriMOS), methyltriethoxyorthosilicate (MTEOS), tetramethylorthosilicate (TMOS), methyltrimethoxysilane (MTMOS), dimethyldimethoxysilane (DMDMOS), diethoxysilane (DES), dimethoxysilane (DMOS), triphenylethoxysilane, 1-(triethoxysilyl)-2-(diethoxymethylsilypethane, tri-t-butoxylsilanol, hexamethoxydisilane (HMODS), hexaethoxydisilane (HEODS), tetraisocyanatesilane (TICS), bis-tert-butylamino silane (BTBAS), hydrogen silsesquioxane, tert-butoxydisilane, T8-hydridospherosiloxane, OctaHydro POSSTM (Polyhedral Oligomeric Silsesquioxane) and 1,2-dimethoxy-1,1,2,2-tetramethyldisilane. Further examples of silicon containing precursors include, but are not limited to, silane ($SiH_4$), disilane, trisilane, hexasilane, cyclohexasilane, and alkylsilanes, e.g., methylsilane, and ethylsilane.

Examples of suitable oxidants include, but are not limited to, ozone ($O_3$), peroxides including hydrogen peroxide ($H_2O_2$), oxygen ($O_2$), water ($H_2O$), alcohols such as methanol, ethanol, and isopropanol, nitric oxide (NO), nitrous dioxide ($NO_2$) nitrous oxide ($N_2O$), carbon monoxide (CO) and carbon dioxide ($CO_2$). In certain embodiments, a remote plasma generator may supply activated oxidant species.

Solvents or other surfactants may be used to relieve surface tension and increase wetting of reactants on the substrate surface. They may also increase the miscibility of the dielectric precursor with the other reactants, especially when condensed in the liquid phase. Examples of surfactants and solvents may include alcohols, ethylene glycol and polyethylene glycol. Difference surfactants may be used for carbon-doped silicon precursors because the carbon-containing moiety often makes the precursor more hydrophobic.

Surfactants may be used to relieve surface tension and increase wetting of reactants on the substrate surface. They may also increase the miscibility of the dielectric precursor with the other reactants, especially when condensed in the liquid phase. Examples of surfactants include solvents, alcohols, ethylene glycol and polyethylene glycol. Difference surfactants may be used for carbon-doped silicon precursors because the carbon-containing moiety often makes the precursor more hydrophobic.

Solvents may be non-polar or polar and protic or aprotic. The solvent may be matched to the choice of dielectric precursor to improve the miscibility in the oxidant. Non-polar solvents include alkanes and alkenes; polar aprotic solvents include acetones and acetates; and polar protic solvents include alcohols and carboxylic compounds.

Examples of solvents that may be introduced include alcohols, e.g., isopropyl alcohol, ethanol and methanol, or other compounds, such as ethers, carbonyls, nitriles, miscible with the reactants. Solvents are optional and in certain embodiments may be introduced separately or with the oxidant or another process gas. Examples of solvents include, but not limited to, methanol, ethanol, isopropanol, acetone, diethylether, acetonitrile, dimethylformamide, and dimethyl sulfoxide, tetrahydrofuran (THF), dichloromethane, hexane, benzene, toluene, isoheptane and diethylether. The solvent may be introduced prior to the other reactants in certain embodiments, either by puffing or normal delivery. In some embodiments, the solvent may be introduced by puffing it into the reactor to promote hydrolysis, especially in cases where the precursor and the oxidant have low miscibility.

Examples of nitrogen-containing compounds (e.g., to deposit a silicon nitride or silicon oxynitride) include silicon- and nitrogen-containing precursors (for example, trisilylamine (TSA) or disilylamine (DSA)), a nitrogen precursor (for example, ammonia ($NH_3$), BTBAS, or hydrazine ($N_2H_4$)).

The wafer is then exposed to the process gas at operation 130. Conditions in the reactor are such that the silicon-containing compound and, if present, the oxidant or other reactant react. The reaction mechanism may involve an adsorption reaction, a hydrolysis reaction, a condensation reaction, a polymerization reaction, a vapor-phase reaction producing a vapor-phase product that condenses, condensation of one or more of the reactants prior to reaction, or a combination of these. As shown in operation 140, a flowable film is thereby deposited on the wafer surface. The wafer is exposed to the process gas for a period sufficient to allow the flowable film to fill the gap. In certain embodiments, the deposition process forms a soft jelly-like film with good flow characteristics, providing consistent fill. The deposited film may also be described herein for the purposes of discussion as a gel having liquid flow characteristics, a liquid film or a flowable film. The fill mechanism may vary according to the particular reaction; for example, a flowable film may form in the gap or form on field regions that surround the gap and flow into the gap, or some combination of these.

Process conditions in the reactor are such that the reaction product may condense on surfaces of the reactor other than the wafer surface. The wafer may or may not be exposed to a plasma during the deposition phase (steps 130 and 140) of the process and, in certain embodiments, the wafer is brought into the chamber under "dark", i.e., non-plasma conditions. Although not indicated on the flow sheet, gaseous byproducts may be continuously pumped from the reaction chamber.

Substrate temperatures may be between about −20° C. and 100° C. In some implementations, the substrate temperatures may be between about −20° C. and 30° C., e.g., between −10° C. and 10° C. In some implementations, higher substrate temperatures may be experienced, e.g., a chemical vapor deposition process may be used which requires that the substrate be heated to approximately 200-400° C. Chamber pressure may be between about 0 and 600 Torr; in certain cases, it may be between 500 mTorr and 200 Torr, and in some other cases, it may be between 10 and 100 Torr. Partial pressures of the process gas components may be characterized in terms of component vapor pressure with Pp the partial pressure of the reactant and Pvp the vapor pressure of the reactant at the reaction temperature. Examples are: Precursor partial pressure ratio (Pp/Pvp)=0.01-1, e.g., 0.01-0.5; Oxidant partial pressure ratio (Pp/Pvp)=0.25-2, e.g., 0.5-1; and Solvent partial pressure ratio (Pp/Pvp)=0-1, e.g, 0.1-1. Examples of reactant partial pressure ranges are: Oxidant: Precursor partial pressure ratio ($Pp_{oxidant}/Pp_{precursor}$)=1-30, e.g., 5-15 and Solvent: Oxidant partial pressure ratio ($Pp_{solvent}/Pp_{oxidant}$)=0-10, e.g., 0.1-5. One having ordinary skill in the art will recognize that values outside of these ranges may be used according to the implementation.

After the flowable film has been deposited in the gap, the as-deposited flowable film is densified in one or more operations in operation 150. The deposited film may be wholly or partially densified. The post-deposition densification treatment operation may involve one or more operations, any or all of which may also result in chemically converting the as-deposited film. In other embodiments, any or all of the densification operations may densify without chemical conversion. In certain embodiments, one conversion operation may be separately performed, or not performed at all. If separately performed, a conversion operation may be performed before or after a densification operation. In one example, a film is converted and partially densified by exposure to a reactive plasma followed by further densification by thermal anneal in an inert environment.

In some embodiments, the film is converted by exposure to a plasma containing, for example, one or more of oxygen, nitrogen, helium, argon and water. The film may be densified at this operation as well as chemically converted to a silicon oxide, silicon nitride, or silicon oxynitride network as desired. In some embodiments of a flowable film deposition process, the flowable dielectric film is a silicon oxide (or other desired network) film as-deposited and does not need to be converted post-deposition.

FIG. 1 provides an example of a flowable gap fill process; the systems and apparatuses provided herein are configured or configurable for other flowable gap fill processes. For example, while the process in FIG. 1 is a single-cycle deposition/densification process, in other embodiments, multi-cycle processes are performed. In other embodiments, dielectric films such as SiOC and SiON films are formed. Examples of flowable gap fill processes that may be used in accordance with the present invention include those described in the following: U.S. Pat. Nos. 7,074,690; 7,524,735; 7,582,555; and 7,629,227; and U.S. patent application Ser. Nos. 11/834,581, 12/334,726, 12/566,085, 12/964,110, 61/421,548, and 61/421,562, which are incorporated by reference herein. The systems and apparatuses described herein may also be used in accordance with any appropriate flowable gap fill process. Moreover, in certain embodiments, the systems and apparatuses described herein are not limited to the particular processes described herein, but may be used in other processes in integrated circuit fabrication, flat panel display fabrication, and the like.

Flowable gap fill processes present challenges seldom, if ever, faced in other semiconductor processes. For example, flowable gap fill processes involve the deliberate formation of liquid condensation within the process chamber. The apparatuses and systems described herein maximize the condensation on the substrate being processed and minimize the condensation everywhere else in the chamber. In certain embodiments, this involves active thermal management of the process chamber and equipment therein. Apparatus and systems for thermal management of a flowable gap fill reactor are described in further detail below.

Another challenge encountered during flowable gap fill processes is management of the process gases so as to prevent premature condensation or deposition. For example, flowable gap fill reactants may be mixed during gap fill operations to develop the proper chemistry for gap fill processing. Premature mixing of the reactants may cause particle formation within the system, which may be problematic if the particles contaminate the processed wafer or impinge the wafer surface and cause damage. If mixed reactants are not kept at a sufficiently elevated temperature, the mixed reactants may form a condensate which may cause undesired deposition inside of the reactant delivery system or may cause droplets to be forcefully expelled into the reactor, which may cause damage to the substrate being processed. Apparatus and systems for reactant management and isolation in a flowable gap fill reactor are also described in further detail below.

Yet another challenge encountered during flowable gap fill processes is the control of reactant flow over the wafer. During flowable gap fill, the condensate-producing reactant mixture is flowed across a substrate being processed and towards the perimeter of the substrate. This may result in greater deposition towards the edges of the wafer and on the wafer bevel than in the interior of the wafer. Apparatus and systems for mitigating such behavior, such as a configuration for introducing purge gas about the wafer periphery, are also described in further detail below.

Definitions

In this application, the terms "substrate", "semiconductor wafer", "wafer" and "partially fabricated integrated circuit" will be used interchangeably. One skilled in the art would understand that the term "partially fabricated integrated circuit" can refer to a silicon wafer during any of many stages of integrated circuit fabrication thereon. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

Integrated circuits are manufactured by passing semiconductor wafers through various processing stages. While many wafers are circular in shape, the wafers may be other shapes as well. In this application, the "axial" direction of a wafer refers to a direction parallel to a circular wafer's central axis. The "axial" direction for a non-circular wafer would refer to a similar direction, i.e., normal to the planar face of the wafer. The "radial" direction refers to a direction along a radius of the wafer, i.e., substantially parallel to the planar face of the wafer and intersecting a central area of the wafer.

As used herein, the term "HDP oxide film" refers to doped or undoped silicon oxide films deposited using high density plasma (HDP) chemical vapor deposition (CVD) processes. Generally, a high density plasma is any plasma having electron density of at least about $1\times10^{11}$ electrons per cubic centimeter, although such plasmas may range between $5\times10^{10}$ to $1\times10^{11}$ electrons per cubic centimeter. HDP-CVD reactions may also be characterized in certain embodiments, by relatively low reactor pressures, in the range of 100 mTorr or lower.

As used herein, the term "flowable oxide film" is a flowable doped or undoped silicon oxide film having flow characteristics that provide consistent fill of a gap. The flowable oxide film may also be described as a soft jelly-like film, a gel having liquid flow characteristics, a liquid film, or a flowable film. Unlike HDP-CVD reactions, forming a flowable film involves reacting a silicon-containing precursor and an oxidant to form a condensed flowable film on the substrate. Formation of the film may be aided by a catalyst, e.g., as described in U.S. Pat. No. 7,629,227, incorporated by reference herein. The flowable oxide deposition methods described herein are not limited to a particular reaction mechanism, e.g., the reaction mechanism may involve an adsorption reaction, a hydrolysis reaction, a condensation reaction, a polymerization reaction, a vapor-phase reaction producing a vapor-phase product that condenses, condensation of one or more of the reactants prior to reaction, or a combination of these. The substrate is exposed to the process gases for a period sufficient to deposit a flowable film to fill or partially fill at least some of the gaps. The deposition process typically forms soft jelly-like film with good flow characteristics, providing consistent fill. In certain embodiments, the flowable film is an amorphous organo-silicon film.

As-deposited HDP oxide films are densified solids and not flowable, whereas as-deposited flowable oxide films are not fully densified. The flowable films are generally flowable at the deposition conditions, at least for some period of time. Depending on the particular process and chemistry, once the wafer is removed from the deposition conditions, the flowable oxide film may be soft (e.g., scratchable) or hard. As described above, the as-deposited flowable films may be densified and/or chemically converted. The term "flowable oxide film" may be used herein to refer to flowable oxide films that have undergone a densification or cure process that wholly or partially solidifies the flowable oxide film as well as-deposited flowable oxide films.

Tool-Level Integration of Flowable Gap Fill

Provided herein are semiconductor manufacturing tools including one or more flowable gap fill modules. FIG. 2A depicts example tool configuration 200 in which the tool includes two high density plasma chemical vapor deposition (HDP-CVD) modules 210, flowable gap fill module 220, PEC 230, WTS (Wafer Transfer System) 240, and loadlocks 250, in some embodiments including a wafer cooling station. HDP-CVD modules 210 may, for example, be Novellus SPEED MAX modules. Flowable gap fill module 220 may, for example, be a Novellus Integra module. PEC module 230 may, for example, be a Novellus Pedestal Electrostatic Chuck (ESC) Cover module. WTS module 240 may, for example, be a Novellus WTS Max module.

Some tool-level implementations may feature a flowable gap fill module which is used for multiple process steps. For example, the flowable gap fill module may also be used to perform an in-situ pretreatment followed by a flowable oxide deposition process. This may allow for a tool which features multiple flowable gap fill modules, e.g., four such modules.

Alternate example tool configuration 260, depicted in FIG. 2B, includes wafer transfer system 295 and loadlocks 290, remote plasma cure module 270, and flowable gap fill module 280. An additional remote plasma cure module 270 and flowable gap fill module 280 may also be included to increase throughput of the tool.

Other modules that may be used for pre-treatment or post-treatment include Novellus SPEED or SPEED Max, Novellus INOVA Reactive Preclean Module (RPM), Novellus Altus ExtremeFill (EFx) Module, Novellus Vector Extreme Pre-treatment Module (for plasma, ultra-violet or infra-red pre-treatment), and Novellus SOLA (for UV pre-treatment), and Novellus Vector or Vector Extreme. These modules may be attached to the same backbone as the flowable gap fill module.

Flowable Gap Fill Module Overview

Figure 3:
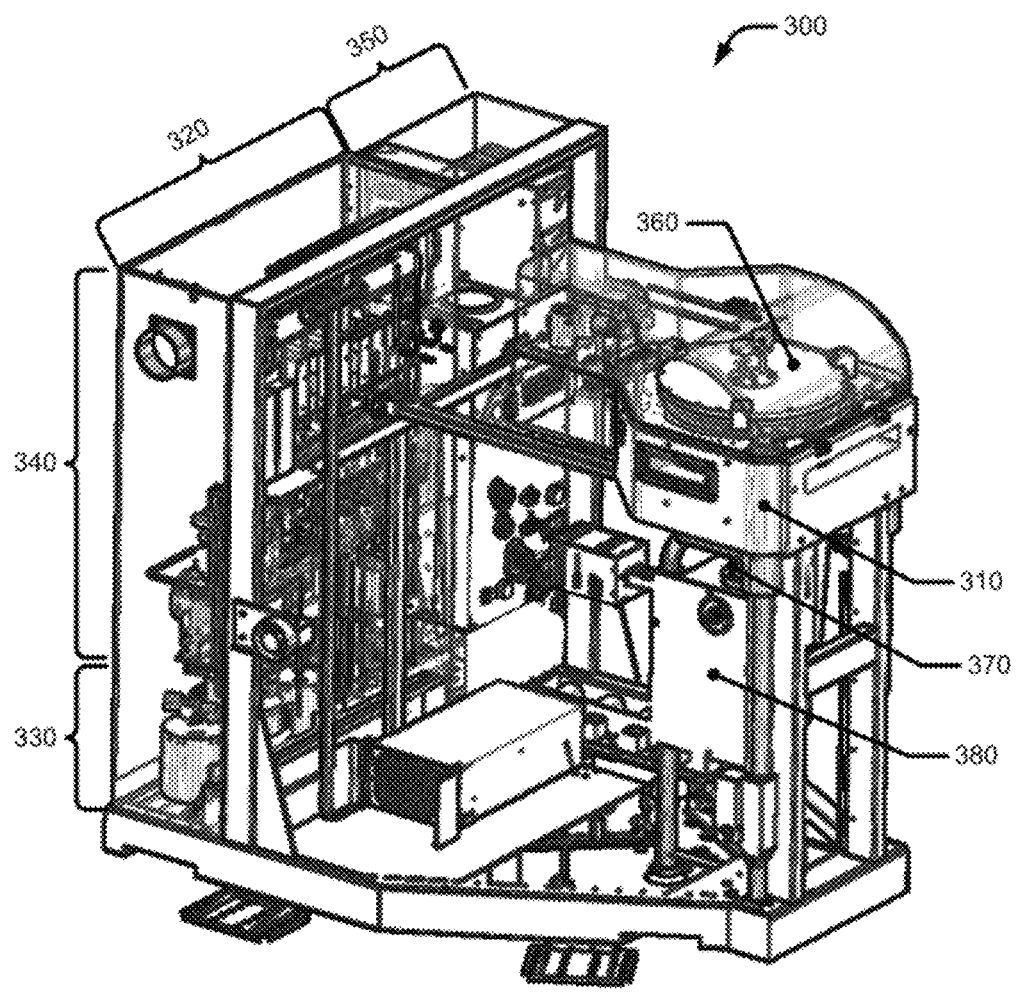
FIG. 3 illustrates a configuration of a flowable gap fill module.

A process module for performing flowable gap fill may include many components, subcomponents, systems, and subsystems. The following sections discuss some of the major components and systems of embodiments of flowable gap fill process module 300, shown in FIG. 3.

The deposition of a flowable film on a wafer occurs inside of reactor 310. Reactor 310 may also be known as a reaction chamber, a process chamber, or chamber.

Many or all of the gases and/or liquids used during the deposition process are supplied to reactor 310 from gas delivery system 320. While such a system is referred to in this application as a "gas delivery system," it is to be understood that the gas delivery system may supply or handle liquids, aerosols, or vapors in addition to or instead of gases. Gas delivery system 320 may include process reactant and chemical sources 330 or connection points for such sources, flow control hardware 340 for process reactant and chemical delivery, such as valves, degassers, vaporizers, heaters, and so forth, and gas delivery controller 350 for controlling flow control hardware 340.

In this application, the term "reactants" will be used, unless otherwise noted, to refer to gases, liquids, or other flowable material which is introduced into the reactor for wafer processing. Reactants, in this context, may also include inert carrier gases which do not chemically participate in wafer processing. While inert carrier gases do not participate in wafer processing reactions in a direct chemical manner, the presence of inert carrier gases may affect the partial pressure of the reactants in the wafer processing reactions, which may influence the condensation behavior of the reactants. For example, increasing inert carrier gas flow while keeping other gas flows and reactor pressure constant will result in reduced partial pressure of the reactant flows, which will reduce the reaction rate of the reactants.

Upon delivery to reactor 310, the reactants may be distributed across the surface area of the wafer through a manifold known as a showerhead. Showerhead 360 introduces the reactants in the desired quantities, locations, and at the desired pressures for processing. The volume of space located substantially between the wafer and the showerhead is referred to herein as the "reaction area."

After introduction to reactor 310, the reactants may be confined to the reaction area through the use of a skirt, which forms a mechanical barrier to reactant flow.

The wafer is axially supported by a chuck. The chuck may also include technology to prevent the wafer from lateral movement during processing. The chuck may be supported by pedestal 370. Pedestal 370 may be configured to move the chuck and supported wafer along the wafer's axial direction for wafer loading and unloading and for wafer processing using pedestal drive unit 380. The chuck may be cooled during processing by a chiller system.

The chuck and pedestal 370 may also interface with an insulating ring which helps protect the chuck and pedestal 370 from unwanted processing.

FIGS. 4A through 4E depict a simplified diagram of a flowable gap-fill module reactor highlighting different process operations. A particular structure in one of FIGS. 4A through 4E may not be labeled with a callout in all figures to reduce visual clutter. The reader is asked to assume that a component labeled with a particular callout will be referenced in figures drawings showing the same component using the same callout. For example, reactor 400 in FIG. 4 would also be referred to as reactor 400 in discussions of FIGS. 4B through 4E despite possibly being unlabeled in those figures.

Figure 4A:
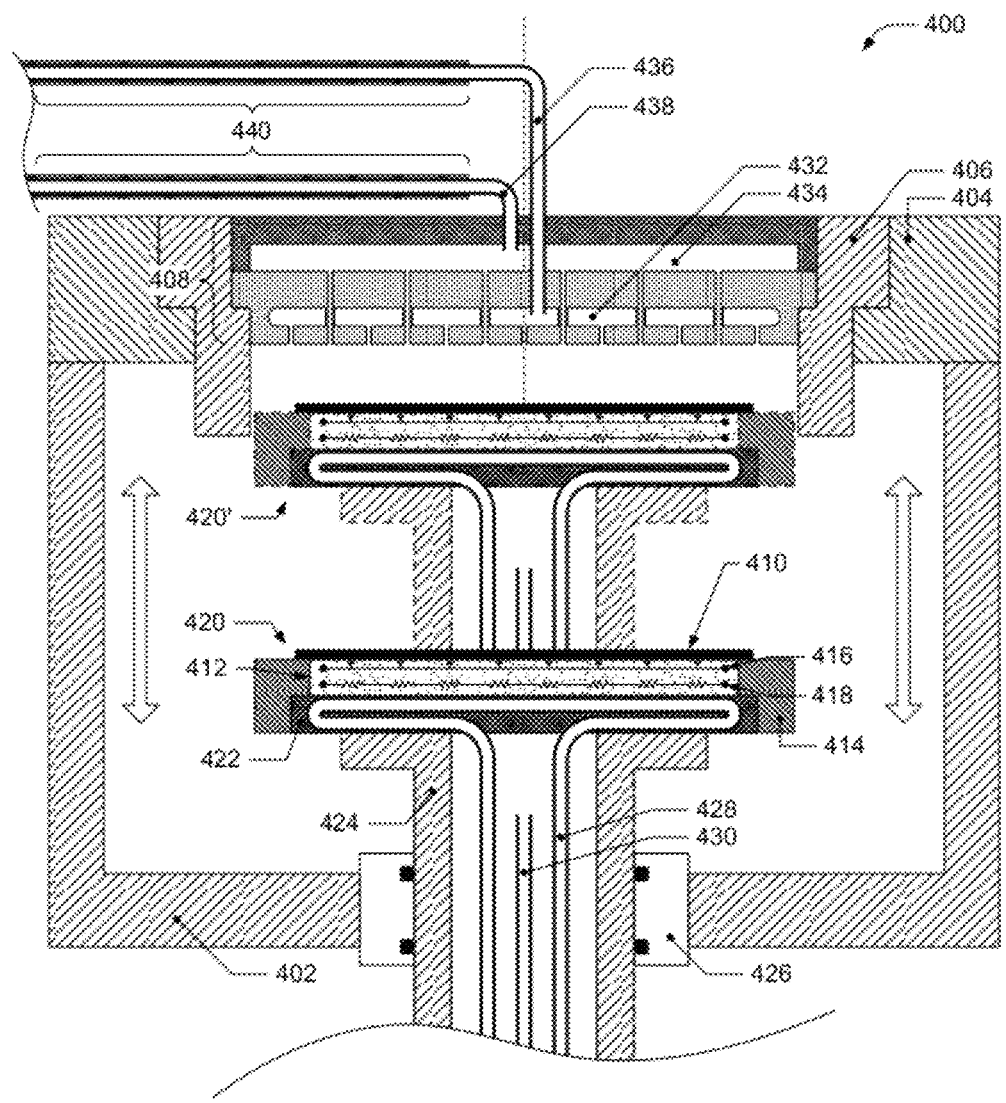
FIGS. 4A-4E illustrate various structures in one flowable gap fill module implementation.
Figure 4B:
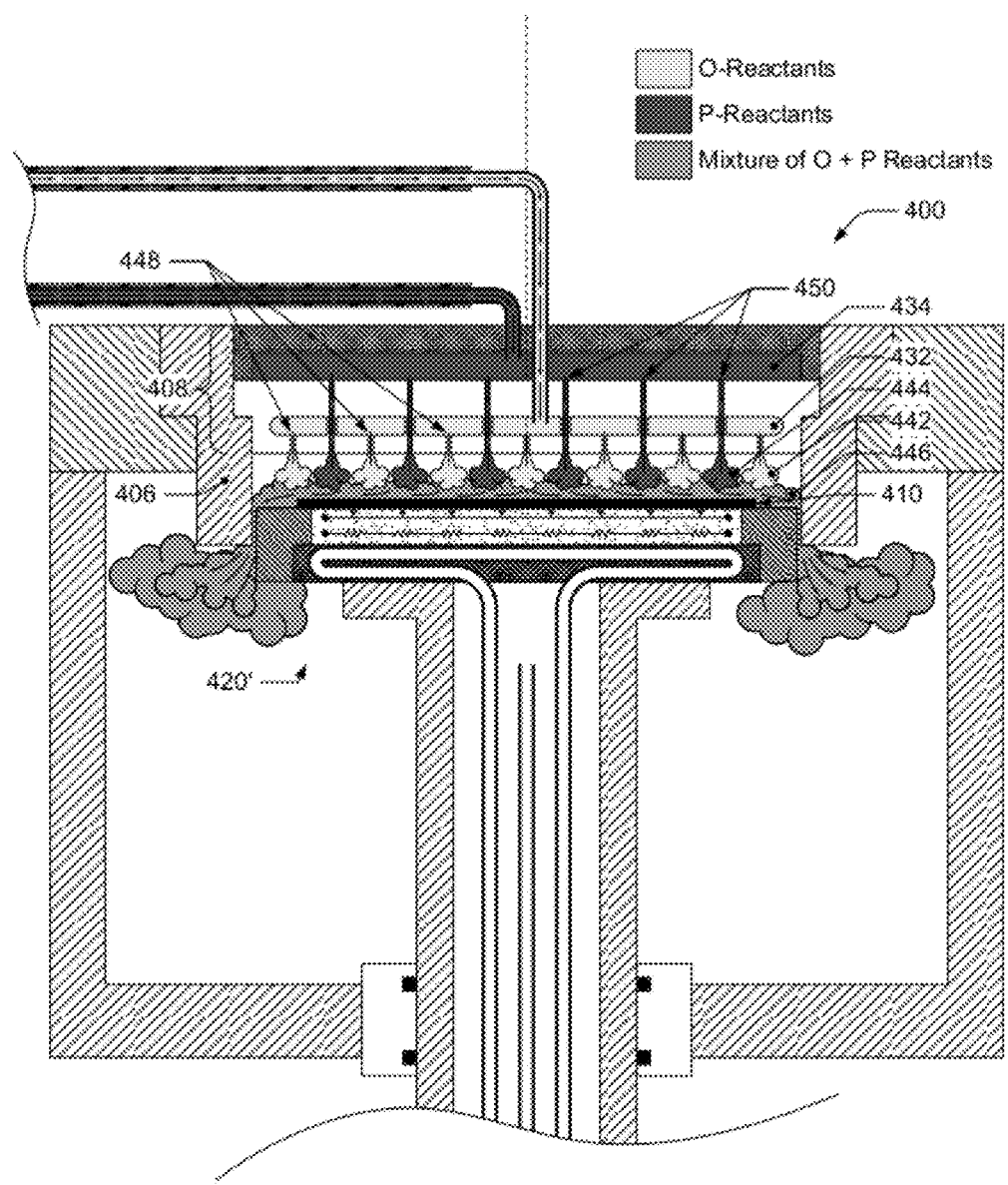
Figure 4C:
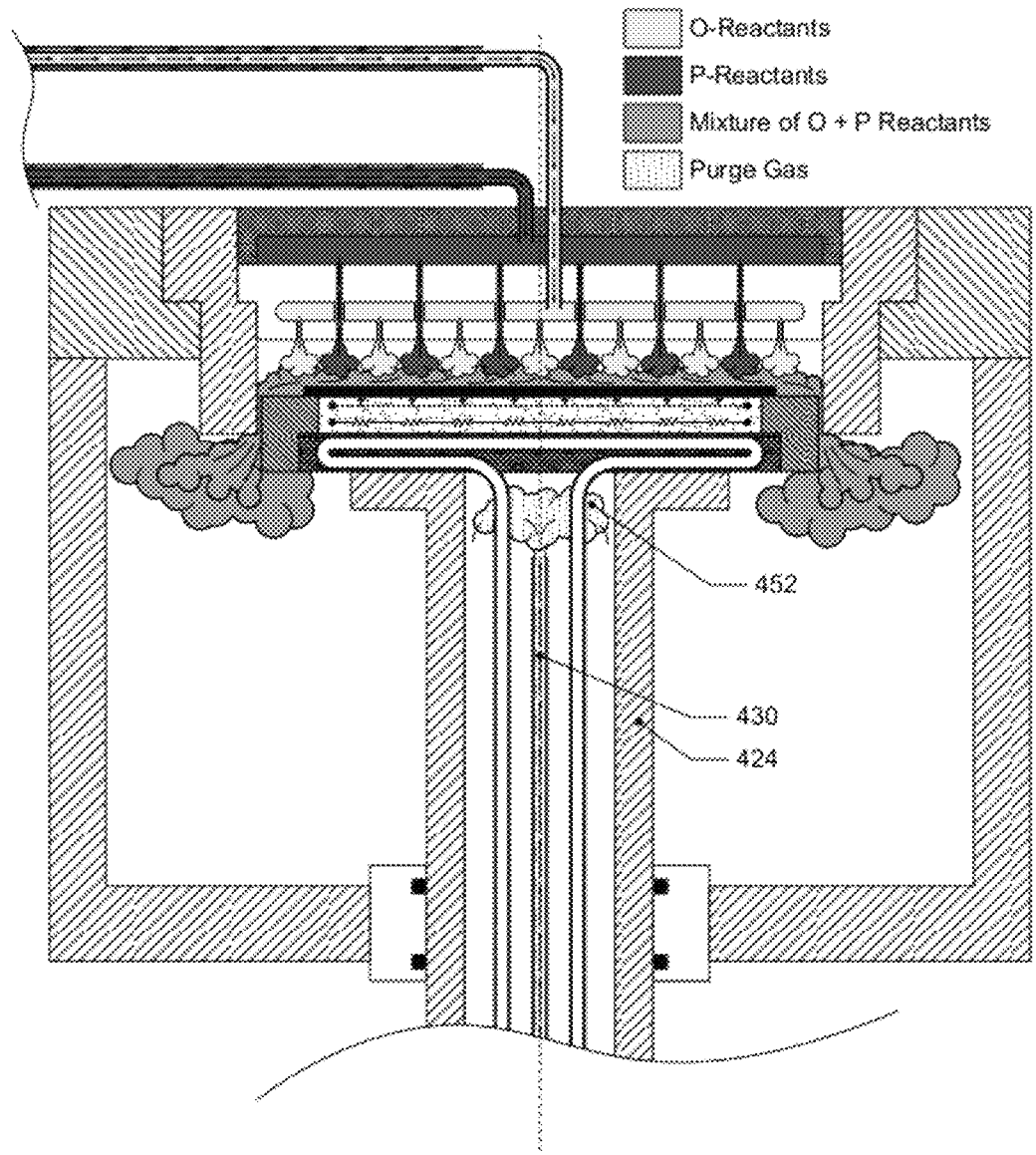
Figure 4D:
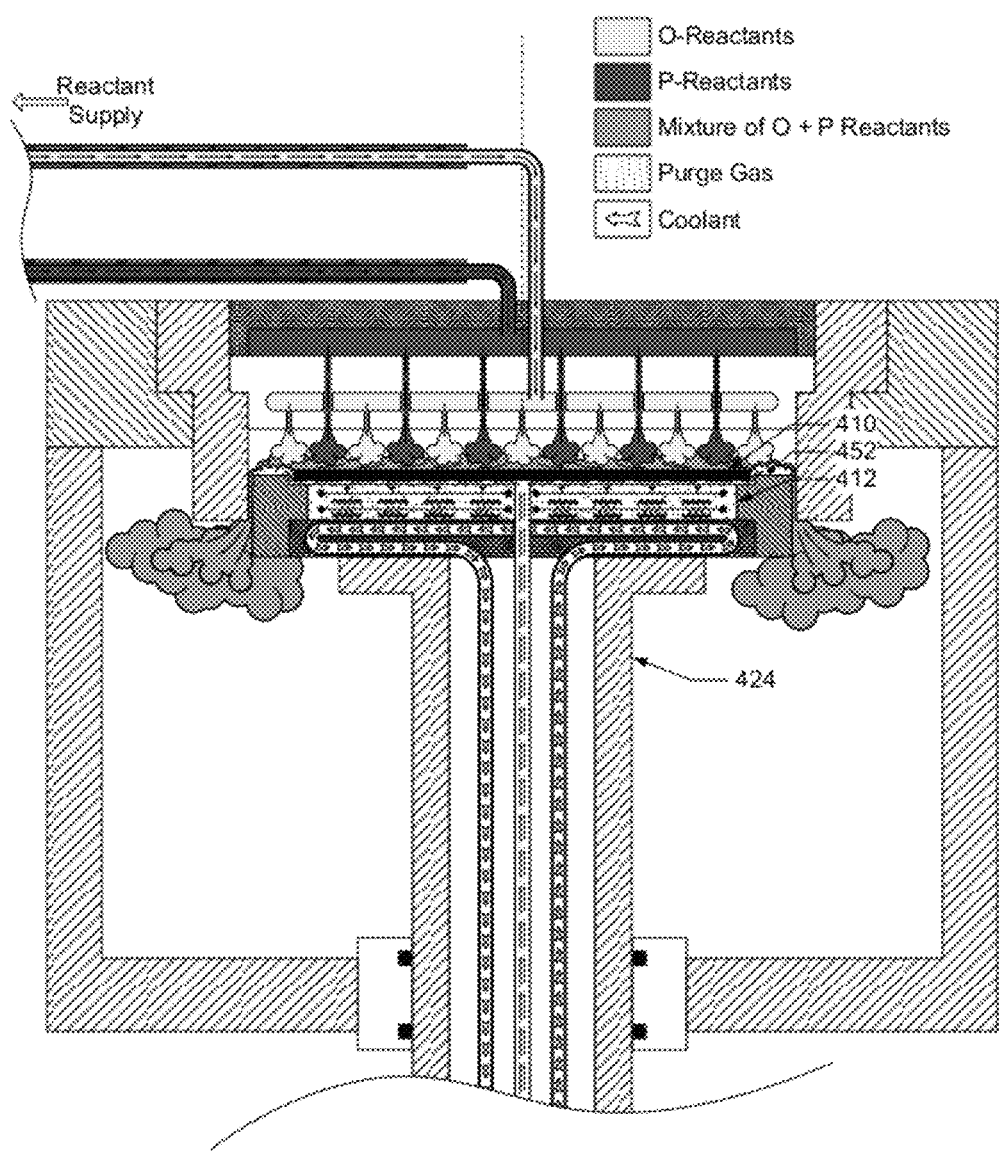

FIGS. 4B-4D, for illustration purposes, depict O-reactants 442 and P-reactants 444 and deposition gas mixture 446, discussed below, in reaction area of reactor 400 as plumes or clouds with well-defined boundaries, such depictions are merely intended to represent the introduction or presence of such gases and should not be interpreted as describing the actual physical behavior of such gases in the reaction area. For example, while deposition gas mixture 446 is depicted as a cloud of gas occupying only part of the reaction area and as billowing out into only a part of the interior volume of reactor 400, deposition gas mixture 446 may be substantially evenly diffused throughout substantially all of the reaction area and the interior volume of reactor 400, or may be diffused throughout the reaction area and the interior volume of reactor 400 but at different densities.

FIG. 4A illustrates simplified embodiment of flowable gap-fill module reactor 400. Chamber housing 402, top plate 404, skirt 406, showerhead 408, pedestal column 424, and seal 426 provide a sealed volume for flowable gap fill processing. Wafer 410 is supported by chuck 412 and insulating ring 414. Chuck 412 includes RF electrode 416 and resistive heater element 418. Chuck 412 and insulating ring 414 are supported by pedestal 420, which includes platen 422 and pedestal column 424. Pedestal column 424 passes through seal 426 to interface with a pedestal drive (not shown). Pedestal column 424 includes platen coolant line 428 and pedestal purge line 430. Showerhead 408 includes O-plenum 432 and P-plenum 434, which are fed by O-gas line 436 and P-gas line 438, respectively. O-gas line 436 and P-gas line 438 may be heated prior to reaching showerhead 408 in zone 440. 420' and 420 refer to the pedestal, but in a lowered (420) and raised (420') position.

Flowable gap fill process module 300 may include leveling features which allow for flowable gap fill process module 300 to be leveled after installation. Flowable gap fill processes involve liquid flow and may thus be extraordinarily sensitive to gravity. For example, if flowable gap fill process module 300 is at a slight tilt to one side, a deposited flowable film will tend to migrate to the "downhill" side of the wafer plane. This results in greater deposition on the downhill side and lesser deposition on the "uphill" side. To prevent such flowable film behavior, flowable gap fill process module 300 may be leveled with respect to the gravitational pull of the Earth.

Additional leveling features may be included at the pedestal level of the assembly in order to further true the wafer plane. For example, an initial truing might be performed when the module is installed. Over time, there may be drift in the levelness of the wafer plane due, for example, to thermal expansion, component stress, assembly variances. Such excursions from wafer plane levelness may be addressed through a pedestal-level leveling feature which does not require the entire module to be re-trued.

Gas Delivery System

The module is equipped with, or connected to, gas delivery system 320 for delivering reactants to reactor 310. Gas delivery system 320 may supply reactor 310 with one or more oxidants, including water, oxygen, ozone, peroxides, alcohols, etc. which may be supplied alone or mixed with an inert carrier gas. Components designated for oxidant-handling are indicated with an "O" prefix herein.

In a particular embodiment, the O-reactants include helium (or other inert gas), oxygen, water, helium-water and ethanol. Gas delivery system 320 may also supply reactor 310 with one or more dielectric precursors, for example triethoxysilane (TES), which may be supplied alone or mixed with an inert carrier gas. Components designated for precursor-handling are indicated with a "P" prefix herein. In a particular embodiment, P-reactants include TES, hydrogen, helium and nitrogen. P-reactants may also include a catalyst, for example, a halogen-containing silicon precursor.

In some embodiments, a reactant which is chemically an oxidant may be delivered with P-reactants rather than with O-reactants; in such cases, components and systems with a P-prefix would also handle this particular O-reactant as well as the P-reactants. For example, an O-reactant such as ethanol may be delivered via P-reactant delivery paths. Delivering ethanol via P-reactant delivery paths may also facilitate matching the flow regimes between the other O-reactants and the P-reactants upon introduction of the reactants to the reaction area in reactor 310. In certain embodiments, the gas delivery system is also configured to deliver one or more cleaning reagents, e.g., $NF_3$ for pre- or post-deposition reactor cleaning. The gas delivery system is additionally configured, in certain embodiments, to deliver one or more post-deposition reactants. For example, for post-deposition plasma processing, argon, nitrogen, oxygen or other gas may be delivered.

Each reactant may be supplied to gas delivery system 320 through direct connection to a facility source, e.g., a facility water or nitrogen source, or by connecting ampoules containing reactants to gas delivery system 320. Gas delivery system 320 may include fittings and hardware 340 for connection to these reactant sources.

Each reactant may be routed to reactor 310 through separate gas lines, such as O-gas line 436 and P-gas line 438. Each reactant gas line may be connected to one or more reactant sources 330, and each reactant source 330 may pass through degassers, filters, mass flow controllers, vaporizers, pressure transducers, pressure regulators, and/or temperature sensors before introduction into its respective gas line. Some reactant gas lines may include additional components, whereas some reactant gas lines may include a subset of or none of these components. For example, whereas an $NF_3$ gas line may use a mass flow controller, an argon gas line may use a flow restrictor.

The ampoule for a reactant may be pressurized with gas, such as helium, to force the reactant from the ampoule and into gas delivery system 320. By introducing gas into an ampoule, the ampoule headspace is pressurized and displaces the reactant contained within the ampoule. The reactant is then driven into gas delivery system lines 436 or 438.

Gas delivery system 320 may be designed to minimize gas transit volumes between process reactant and chemical sources 330 and reactor 310. For example, unnecessary bends, fittings, or other volumes may be removed.

Similarly, gas delivery system 320 may be designed to minimize transit time for a reactant through gas delivery system 320 to reactor 310. For example, a gas shunt or divert may be provided for a gas line which allows the gas flow rate to be ramped-up to a desired flow speed through the shunt. When the gas has reached the desired flow speed, the gas may be switched from the shunt to the reactor feed line. In this manner, gas may be introduced to reactor 310 at a flow rate which is closer to the desired flow rate than if the gas were to be introduced to reactor 310 during the flow ramp-up period. This may help ensure that the required quantity of gas is introduced into reactor 320 within a desired time interval.

Gas delivery system 320 may utilize high accuracy/low response time valves or other flow-control devices in flow control hardware 340. For example, P-gas line 438 may utilize a valve capable of reaching 90% of the gas flow rate within 0.05 s of a command to open the valve being executed by gas delivery controller 350.

Gas delivery system 320 may include one or more preheat devices for heating reactants before transmission to reactor 310 via the reactant gas lines. The one or more preheat devices for a reactant gas line may be located near or collocated with a vaporizer for that reactant gas line. Preheat devices may be configured to heat the vaporized reactant to a desired temperature level after vaporization and before the gas leaves gas delivery system 320 and is transported to reactor 310. The preheat devices may be configured to heat the reactant gas to temperatures between 50° C. and 250° C., e.g., 50° C.-150° C. For example, an ethanol reactant may be pre-heated to 150° C. after vaporization and before introduction to a gas line leading to reactor 310.

In some embodiments, the wetted surface of components handling each reactant of one or more reactants may be preheated to a temperature at least 10° C. above the dew point for that reactant at the delivery system pressure for that reactant and at least 10° C. below that reactant's decomposition temperature. In other embodiments, the wetted surface of components handling each reactant of one or more reactants may be preheated to a temperature at least 20° C. above the dew point for that reactant at the delivery system pressure for that reactant and at least 20° C. below that reactant's decomposition temperature. If several reactants are mixed together and preheated as a mixture, the above rules may be applied using the dew point and pressure for the mixture.

In addition to, or alternatively to, the preheat devices, the reactant gas lines may also include thermal heating jackets to provide heating to the reactant gases during transit from the gas delivery system to reactor 310. For example, resistive heater blankets or sleeves may be wrapped around exposed gas lines between the gas delivery system and reactor 310, as indicated by section 440 in FIG. 4. Alternatively, the gas lines may be routed within an external sleeve through which heated fluid, such as water or oil, is pumped or may be routed through inductive heating coils. In certain embodiments the heating jackets are configured to maintain some or substantially all of the wetted interior surfaces of the gas lines at temperatures determined with respect to the dew point and decomposition temperatures of the reactants as described above. Additionally, one or more gas lines may be individually heated to different temperatures using separate heating jackets.

Figure 5B:
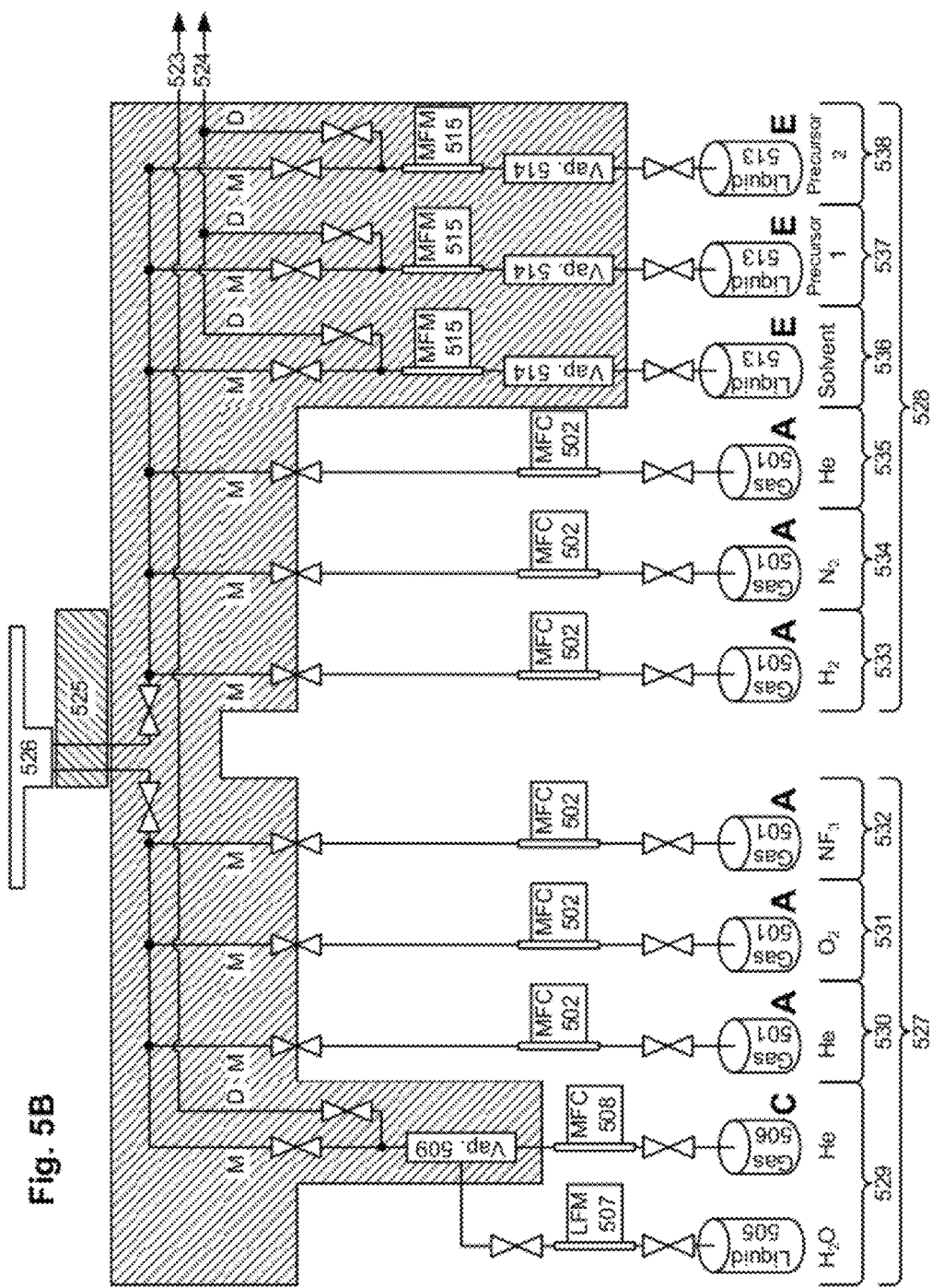
FIG. 5B schematically illustrates an example gas delivery system using He as a carrier gas.

A modular approach may be taken to providing a gas delivery system. FIG. 5A illustrates six potential modules for use in a gas delivery system. The illustrated modules may be configured to supply different types of reactants or other agents and connected to manifolds for supplying O-reactants and P-reactants as needed. Some particular implementations of modular gas delivery systems suitable for use with reactors such as those described herein are diagrammed, in part, in FIGS. 5B-5M. It is to be recognized that similar fluid routings may also be constructed using a non-modular approach to provide similar process functionality.

FIG. 5A illustrates six potential gas supply modules A-F. Each module may include a manifold outlet M which may be configured for connection to a gas manifold. Some modules may also include a divert outlet D which may be configured for connection to a divert line. In some semiconductor fabrication process steps, reactants must be delivered to the showerhead with minimal ramp-ups in flow rates. In such steps, the flow from a particular gas source may first be directed to a divert line until the flow rate has stabilized to a substantially steady-state condition. Once the steady-state flow condition is reached, a valve to the divert line A may be closed and a valve to the manifold outlet may be opened, shunting the steady-state flow to the gas manifold leading to the showerhead. Several divert lines may be joined together to form a divert manifold, and there may be separate divert manifolds for O-reactants and P-reactants. The divert lines/manifolds may vent into a volume separate from the reactor. Each module may also be configured to pre-heat the supplied reactants by preheating various components used to deliver the reactants to the M and, in some modules, D outlets. Such pre-heating may be accomplished using resistive heater blankets, heat exchangers, or other heating technologies. Components which may be pre-heated are located within the cross-hatched areas of FIGS. 5A-5M. The preheated components may be heated to temperatures of between 50° and 250° C., e.g., 50-150° C., and different preheat temperatures may be used for each module.

Module A may be configured to supply a gaseous reactant, e.g., $O_2$, $H_2$, $N_2$, $NF_3$, Ar, He, etc. to the showerhead. Module A may include a module A gas source 501 and a module A mass flow controller 502. Module A gas source 501 may be connected to module A mass flow controller 501 via a gas line and an in-line inlet valve. A second gas line and an in-line outlet valve may connect module A mass flow controller 501 to the manifold outlet M. Module A does not include a divert outlet D, and may be used to deliver gas which is not timing-critical. Components of module A downstream of module A mass flow controller 502 may optionally be preheated if desired.

Module B is similar to module A, but includes divert functionality. Module B may include a module B gas source 503 and a module B mass flow controller 504. Module B gas source 503 may be connected to module B mass flow controller 504 via a gas line and an in-line inlet valve. A second gas line and an in-line outlet valve may connect module B mass flow controller 504 to the manifold outlet M. A third gas line and accompanying in-line outlet valve may also fluidly connect the module B mass flow controller with a divert outlet D. Module B does include a divert outlet D, and may thus be used to deliver gas which is timing-critical. Module B is not used in any of the example gas delivery systems shown in FIGS. 5B-5L, but may be used in place of a particular module A if the gas delivered by the module A is timing-critical. Components of module B downstream of module B mass flow controller 504 may optionally be preheated if desired.

Module C may be configured to supply a vaporized reactant via a carrier gas. Module C may include a module C liquid source 505 and a module C gas source 506. Module C liquid source 505 may be fluidly connected to module C liquid flow meter 507 by a fluid line and in-line valve. Module C liquid source 505 may, for example, contain water, a solvent, or another liquid reactant. Module C liquid flow meter 507 may be fluidly connected with module C vaporizer 509 by another fluid line and in-line valve. Module C gas source 506 may be fluidly connected to module C mass flow controller 508 by a gas line and in-line valve. Module C gas source 506 may contain, for example, Ar or He. Module C mass flow controller 508 may also be fluidly connected to module C vaporizer by a gas line. Liquid flowing from module C liquid source 505 may be vaporized and entrained in a flow of gas from module C gas source 506 within module C vaporizer 509. Module C vaporizer 509 may be fluidly connected with a manifold outlet M and a divert outlet D in much the same manner that module B mass flow controller 504 is fluidly connected with a manifold outlet M and a divert outlet D. Module C vaporizer 509 and downstream components of module C may optionally be preheated if desired.

If the optional preheat is used with module C, module C liquid source 505 and module C liquid flow meter 507 may not be preheated to allow for more accurate metering of the supplied liquid. The use of a carrier gas from module C gas source 506 not only aids in transporting the vaporized liquid reactant to the showerhead, but may also assist in vaporizing the liquid reactant by evaporating some of the liquid reactant. This may allow the use of liquid reactants with higher boiling points. An absence of devices which may significantly reduce gas flow downstream of module C vaporizer 509 may, correspondingly, result in no significant pressure drop being observed downstream of module C vaporizer 509, which may reduce the likelihood of condensation. The use of divert functionality may allow module C to deliver vaporized liquid reactants to the showerhead without startup delay or instability.

Module D may be configured to supply a vaporized reactant without using a carrier gas. Module D may include a module D liquid source 510 fluidly connected with a module D liquid flow controller 511. Module D liquid flow controller 511 may, in turn, be fluidly connected with module D vaporizer 512. Module D vaporizer 512 may be fluidly connected with a manifold outlet M and a divert outlet D in much the same manner that module B mass flow controller 504 is fluidly connected with a manifold outlet M and a divert outlet D. Module D liquid source 510 may, for example, contain a solvent, a precursor, or other liquid. As with module C, module D vaporizer 512 and downstream components of module D may optionally be preheated if desired.

As with module C, if the optional preheat is used with module D, module D liquid source 510 and module D liquid flow controller 511 may not be preheated to allow for more accurate metering of the supplied liquid. Module D may also allow for more undiluted delivery of the supplied liquid vapor since there is no carrier gas present to dilute the vaporized liquid. An absence of devices which may significantly reduce gas flow downstream of module D vaporizer 512 may, correspondingly, result in no significant pressure drop being observed downstream of module D vaporizer 512, which may reduce the likelihood of condensation. The use of divert functionality may allow module D to deliver vaporized liquid reactants to the showerhead without startup delay or instability.

Module E, similar to module D, may be configured to supply a vaporized reactant without using a carrier gas.

Module E may include a module E liquid source 513 fluidly connected with a module E vaporizer 514 via a fluid line and in-line valve. Module E vaporizer 514 may be fluidly connected to module E mass flow meter 515 by a gas line. Module E mass flow meter 515 may then be fluidly connected with a manifold outlet M and a divert outlet D in much the same manner that module B mass flow controller 504 is fluidly connected with a manifold outlet M and a divert outlet D.

If module E is used with an optional preheat, module E vaporizer 514 and module E mass flow meter 515 may both be preheated, although module E liquid supply 513 may not be preheated. This allows the vaporized liquid to be delivered with no dilution by a carrier gas and allows the vapor to be metered after vaporization and preheat has occurred.

Module F may be configured to supply one or two vaporized liquid reactants via a carrier gas. Module F may include a module F first liquid source 516, a module F second liquid source 518, and a module F gas source 517. Module F first liquid source 516 may be fluidly connected to a module F first liquid flow controller 519 via a fluid line and in-line valve. Module F first liquid flow controller 519 may be fluidly connected to a module F vaporizer 522 via a fluid line and in-line valve. Similarly, module F second liquid source 518 may be fluidly connected to a module F second liquid flow controller 521 via a fluid line and in-line valve. Module F second liquid flow controller 521 may also be fluidly connected to module F vaporizer 522 via a fluid line and in-line valve. Module F gas source 517 may be fluidly connected to module F mass flow controller 520 via a gas line and in-line valve. Module F mass flow controller 520 may also be fluidly connected with module F vaporizer 522 via a gas line. Module F vaporizer 522 may be fluidly connected with a manifold outlet M and a divert outlet D in much the same manner that module B mass flow controller 504 is fluidly connected with a manifold outlet M and a divert outlet D.

Module F may optionally be configured to preheat module F vaporizer 522 and downstream components. Module F first liquid source 516 and module F second liquid source 518 may each contain different liquids. For example, module F first liquid source 516 may contain a first precursor, and module F second liquid source may contain a second precursor different from the first precursor.

FIG. 5B depicts a diagram of one implementation of a gas delivery system featuring modules for providing O-reactants within O-zone 527 and modules for providing P-reactants within P-zone 528. In O-zone 527, module C 529 contains liquid H2O in module C liquid source 505 and gaseous He in module C gas source 506, module A (O-zone) 530 contains gaseous He within module A gas source 501, module A 531 contains gaseous O2 within module A gas source 501, and module A 532 contains gaseous NF3 within module A gas source 501. In P-zone 528, module A 533 contains gaseous H2 within module A gas source 501, module A 534 contains gaseous N2 within module A gas source 501, module A (P-zone) 535 contains gaseous He within module A gas source 501, module E 536 contains liquid solvent within module E liquid source 513, module E 537 contains liquid first precursor within module E liquid source 513, and module E 538 contains liquid second precursor within module E liquid source 513.

An O-divert line 523 and a P-divert line 524 may be connected with the divert outlets of the modules in O-zone 527 and P-zone 528, respectively.

The manifold outlets from module C 529, module A 530, module A 531, and module A 532 may be connected to a common O-manifold which is connected, via a valve, to a dual-flow showerhead 526. Similarly, the manifold outlets from module A 533, module A 534, module A 535, module E 536, module E 537, and module E 538 may similarly be connected to a common P-manifold which is connected, via a valve, to dual-flow showerhead 526. Reactants delivered to dual-flow showerhead 526 may be further heated during transfer to dual-flow showerhead 526 in zone 525. Components within zone 525 may be heated to a different temperature than used for the pre-heat. For example, components within zone 525 may be heated to temperatures of up to 150° C., although a typical pre-heat temperature may be approximately 100° C.

While there is only one line shown leading to dual-flow showerhead 526 from O-zone 527 and only one line shown leading to dual-flow showerhead 526 from P-zone 528, there may, in some implementations, be multiple such lines running to dual-flow showerhead 526 from one or both such zones. For example, if two precursors are used in P-zone 528, each with different temperature or pressure requirements for vaporization without decomposition, it may be desired to prevent mixing of the two precursors until they are introduced into dual-flow showerhead 526. The precursors may, for example, be kept separated using physically separate gas lines leading to dual-flow showerhead 526. For chemically aggressive precursor species, the materials selected for such gas lines, as well as for the various components in the corresponding modules for the gas delivery system, may be selected to minimize corrosion of the components by the precursor.

Figure 5C:
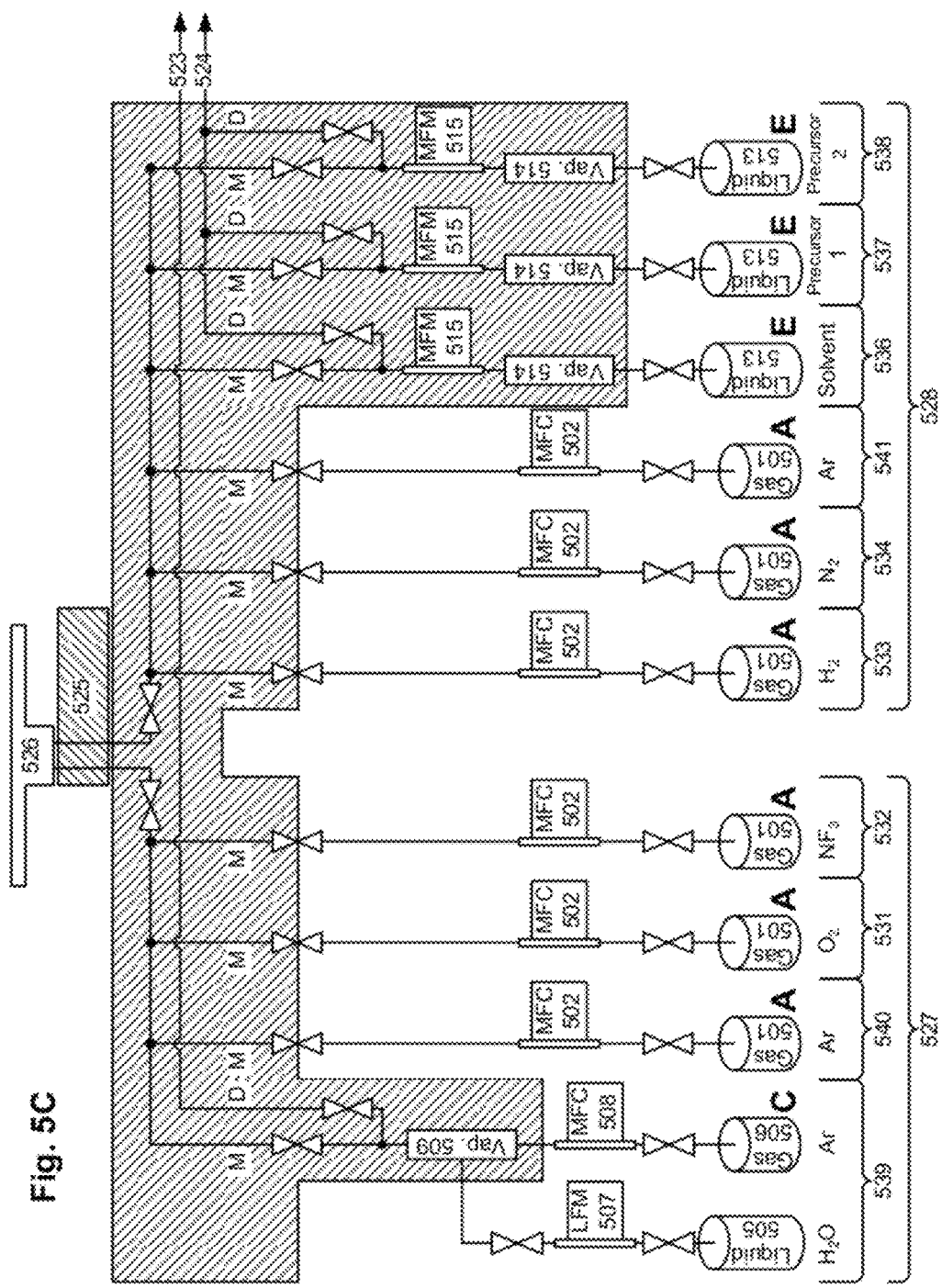
FIG. 5C schematically illustrates the gas delivery system of FIG. 5B with Ar as a carrier gas.

FIG. 5C depicts a gas delivery system implementation which is largely similar to the gas delivery system shown in FIG. 5B, but with module C 539, module A 540, and module A 541 replacing module C 529, module A 530, and module A 535, respectively. Module C gas source 506 of module C 539, module A gas source 501 of module A 540, and module A gas source 501 of module A 541 all contain Ar instead of He.

Figure 5D:
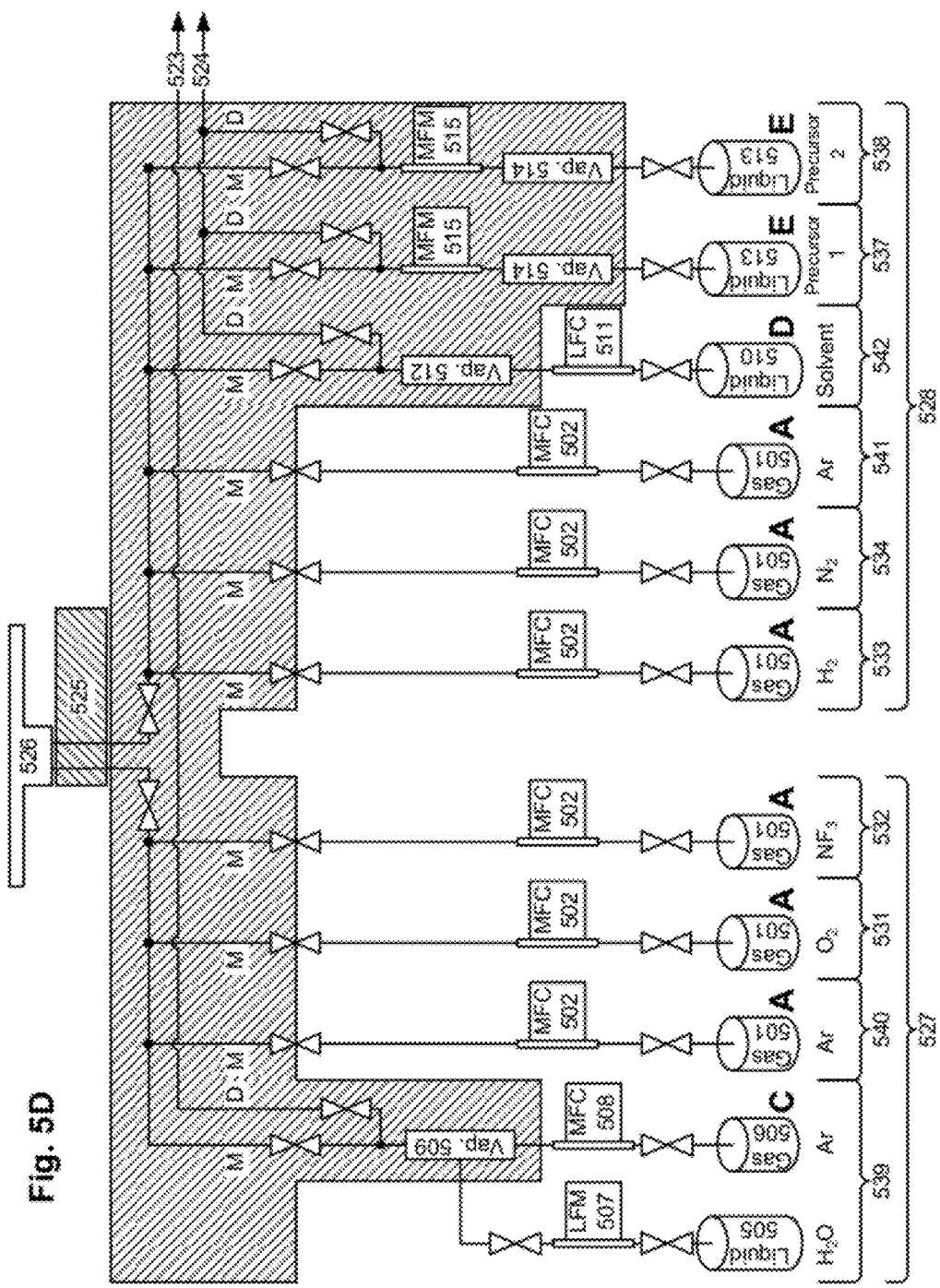
FIG. 5D schematically illustrates another example gas delivery system using Ar as a carrier gas.

FIG. 5D depicts a gas delivery system implementation which is largely similar to the gas delivery system shown in FIG. 5C, but with module E 536 replaced with module D 542. Module D liquid source 510 of module D 542 may contain a solvent.

Figure 5E:
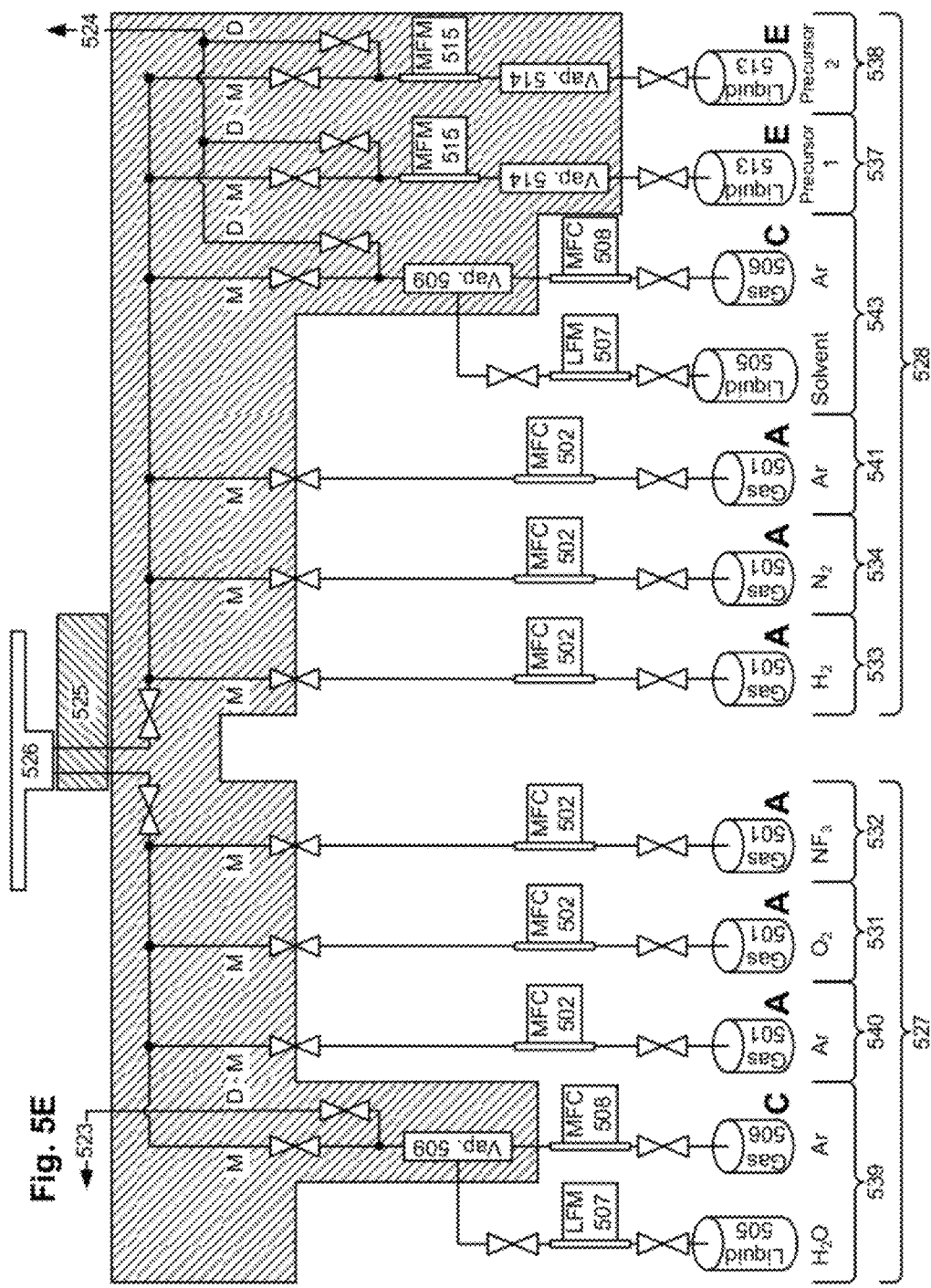
FIG. 5E schematically illustrates a second example gas delivery system using Ar as a carrier gas.

FIG. 5E depicts a gas delivery system implementation which is also largely similar to the gas delivery system shown in FIG. 5C, but with module E 536 replaced with module C 543. Module C liquid source 505 and module C gas source 506 of module C 543 may contain a solvent and Ar, respectively.

Figure 5F:
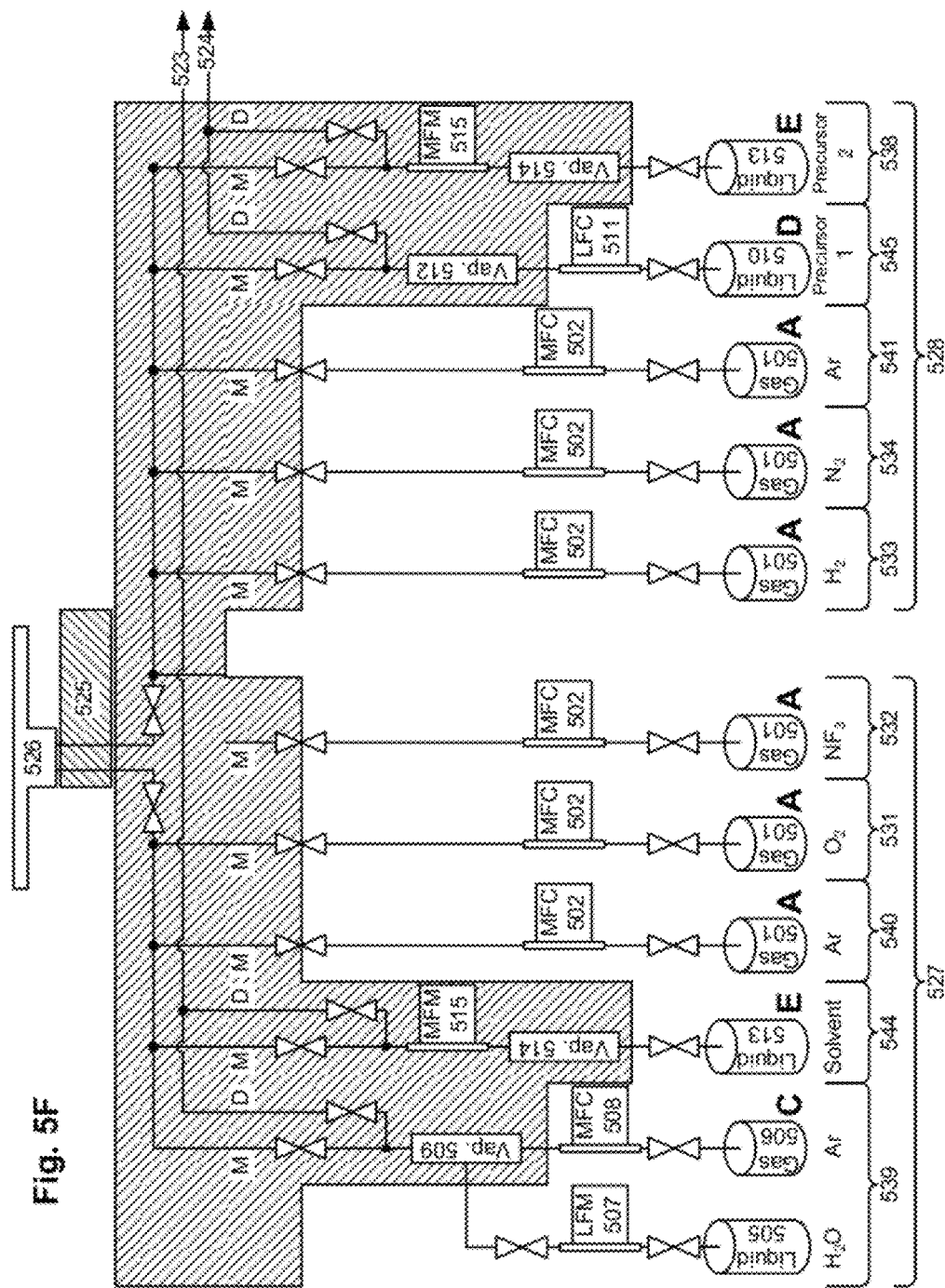
FIG. 5F schematically illustrates a third example gas delivery system using Ar as a carrier gas.

FIG. 5F depicts a diagram of another implementation of a gas delivery system featuring modules for providing O-reactants within O-zone 527 and modules for providing P-reactants within P-zone 528. In O-zone 527, module C 539 contains liquid $H_2O$ in module C liquid source 505 and gaseous He in module C gas source 506, module E 544 contains solvent in module E liquid source 513, module A (O-zone) 540 contains gaseous Ar within module A gas source 501, module A 531 contains gaseous $O_2$ within module A gas source 501, and module A 532 contains gaseous $NF_3$ within module A gas source 501. In P-zone 528, module A 533 contains gaseous $H_2$ within module A gas source 501, module A 534 contains gaseous $N_2$ within module A gas source 501, module A (P-zone) 541 contains gaseous Ar within module A gas source 501, module D 545 contains a liquid first precursor within module D liquid source 510, and module E 538 contains liquid second precursor within module E liquid source 513.

FIG. 5G depicts a gas delivery system implementation largely similar to that shown in FIG. 5C, but with module E 537 replaced with module D 546. Module D 546 may contain liquid first precursor within module D liquid source 510.

Figure 5H:
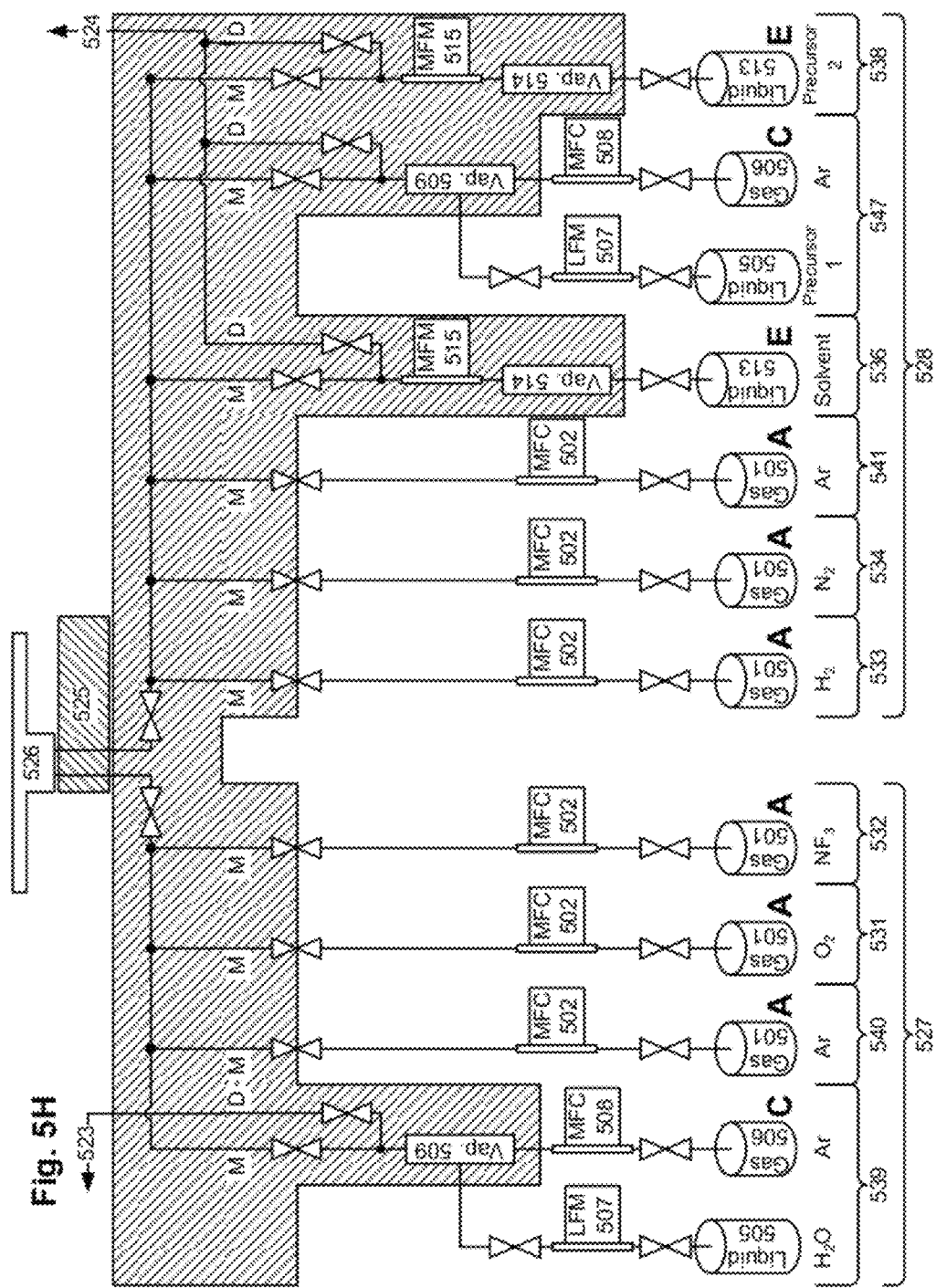
FIG. 5H schematically illustrates a fifth example gas delivery system using Ar as a carrier gas.

FIG. 5H also depicts a gas delivery system implementation largely similar to that shown in FIG. 5C, but with module E 537 replaced with module C 547. Module C 547 may contain a liquid first precursor and Ar gas within module C liquid source 506 and module C gas source 505, respectively.

Figure 5I:
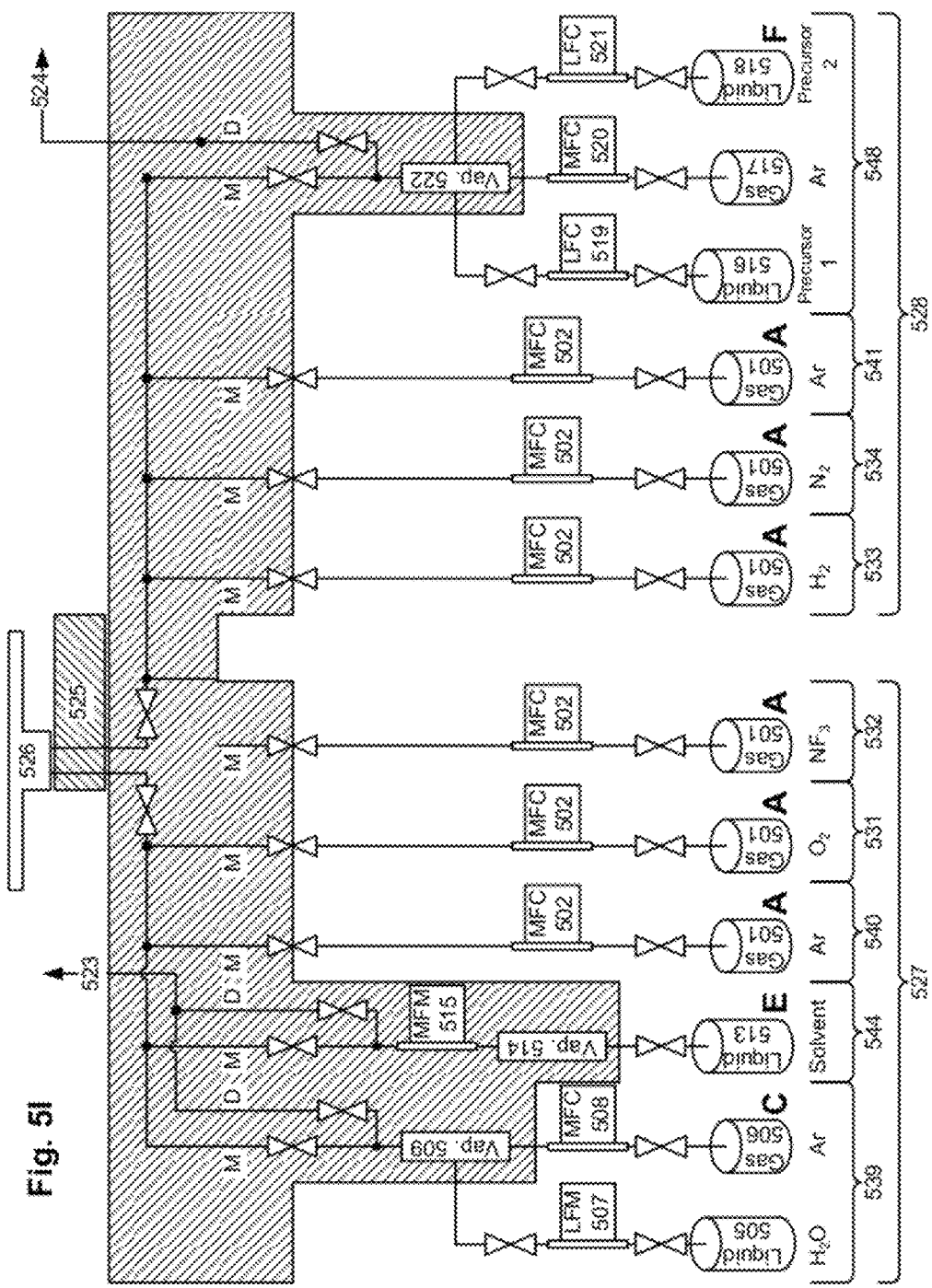
FIG. 5I schematically illustrates a sixth example gas delivery system using Ar as a carrier gas.

FIG. 5I depicts a gas delivery system implementation largely similar to that shown in FIG. 5F, but with module D 545 and module E 538 replaced with a single module F 548. Module F 548 contains a first precursor in module F first liquid source 516, a second precursor in module F second liquid source 518, and Ar in module F gas source 517.

Figure 5J:
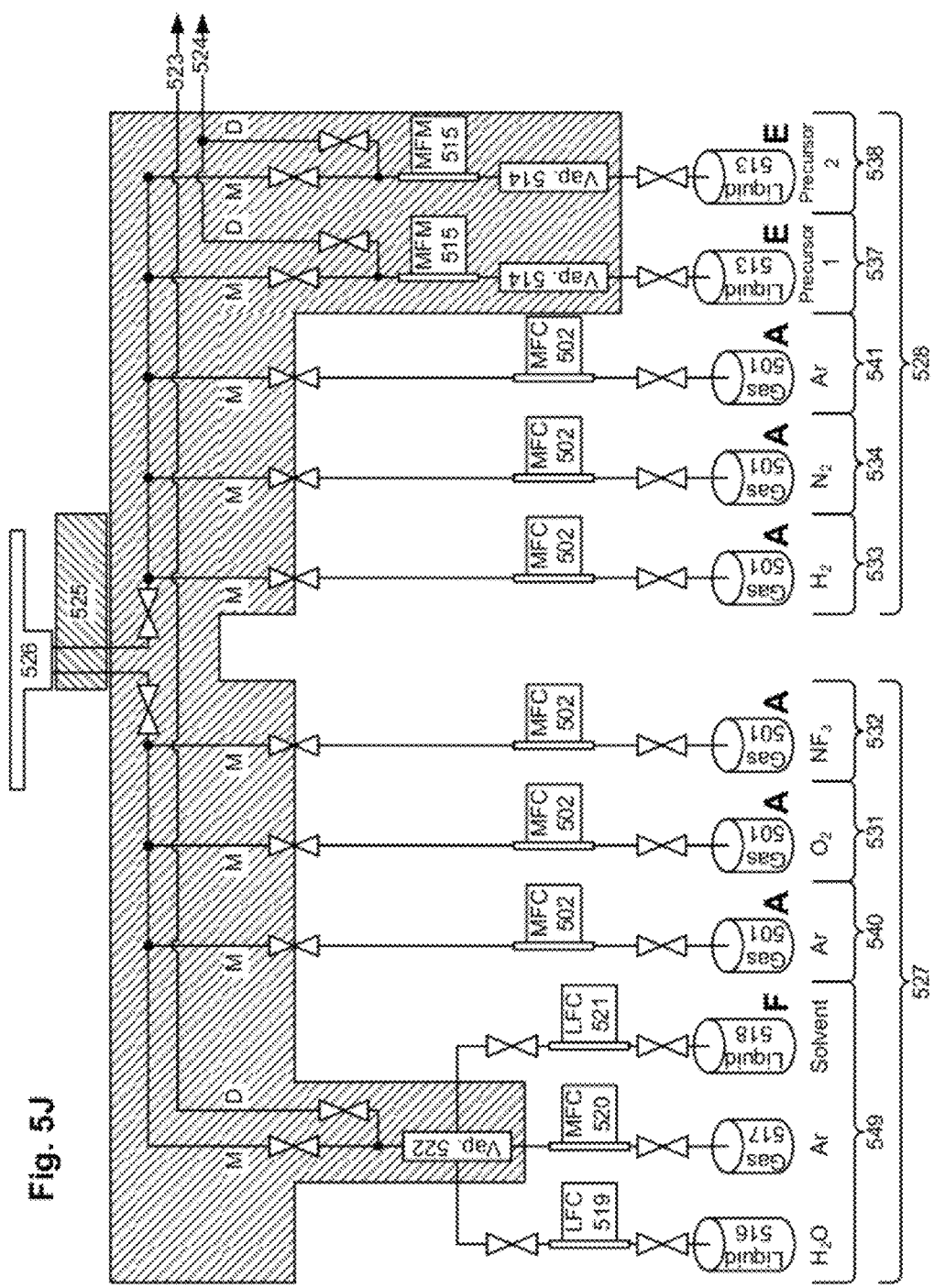
FIG. 5J schematically illustrates a seventh example gas delivery system using Ar as a carrier gas.

FIG. 5J depicts a gas delivery system implementation which is largely similar to that shown in FIG. 5C, but with module E 536 removed from P-zone 528, and with module C 539 replaced with module F 549 in O-zone 527. Module F 549 may contain $H_2O$ in module F first liquid source 516, a solvent in module F second liquid source 518, and Ar in module F gas source 517.

FIG. 5K depicts a gas delivery system implementation which is largely similar to that shown in FIG. 5I, but with module C 539 and module E 544 replaced with a single module F 549. Module F 549 contains $H_2O$ in module F first liquid source 516, a solvent in module F second liquid source 518, and Ar in module F gas source 517.

Figure 5L:
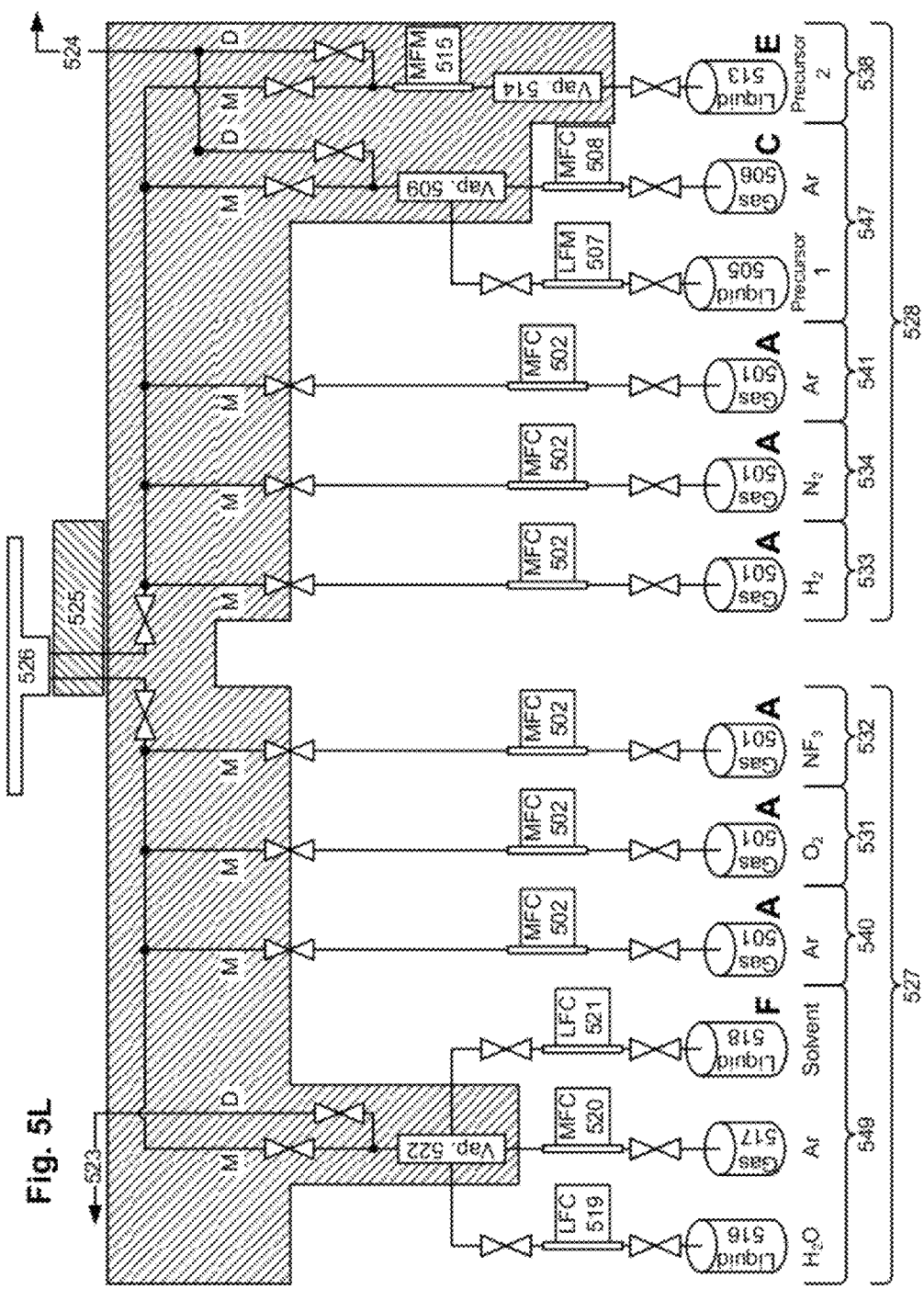
FIG. 5L schematically illustrates a ninth example gas delivery system using Ar as a carrier gas.

FIG. 5L depicts a gas delivery system implementation which is largely similar to that shown in FIG. 5J, but with module E 537 replaced with module C 547. Module C 547, as discussed in FIG. 5H, may contain a liquid first precursor and Ar gas.

FIG. 5M depicts the gas delivery system of FIG. 5L but with an additional Ar source which may be used to purge the divert lines of diverted reactants.

The various valves portrayed in FIGS. 5A-5M may be opened or closed as needed to supply O-reactants and P-reactants to dual-flow showerhead 526 during various phases of wafer processing.

Reactor

The module includes a reactor 400, also referred to as a reaction chamber, chamber and the like. Reactor 400 serves as a sealed environment within which flowable gap fill processing may occur. In many embodiments, reactor 400 features a radially symmetric interior. Reducing or eliminating departures from a radially symmetric interior helps ensure that flow of the reactants occurs in a radially balanced manner over wafer 410. Disturbances to the reactant flows caused by radial asymmetries may cause more or less deposition on some areas of wafer 410 than on other areas, which may produce unwanted variations in wafer uniformity.

Reactor 400 includes several main components. Structurally, reactor 400 may include a chamber housing 402 and a top plate 404. Top plate 404 is configured to attach to chamber housing 402 and provide a seal interface between chamber housing 402 and a gas distribution manifold/showerhead, electrode, or other module equipment. Different top plates 404 may be used with the same chamber housing 402 depending on the particular equipment needs of a process.

Chamber housing 402 and top plate 404 may be machined from an aluminum, such as 6061-T6, although other materials may also be used, including other grades of aluminum and other, non-aluminum materials. The use of aluminum allows for easy machining and handling and makes available the elevated heat conduction properties of aluminum.

Top plate 404 may be equipped with a resistive heating blanket to maintain top plate 404 at a desired temperature. For example, top plate 404 may be equipped with a resistive heating blanket configured to maintain top plate 404 at a temperature of between 40° C. and 80° C. Alternative heating sources may be used in addition to or as an alternative to a resistive heating blanket, such as circulating heated liquid through top plate 404 or supplying top plate 404 with a resistive heater cartridge.

Figure 6:
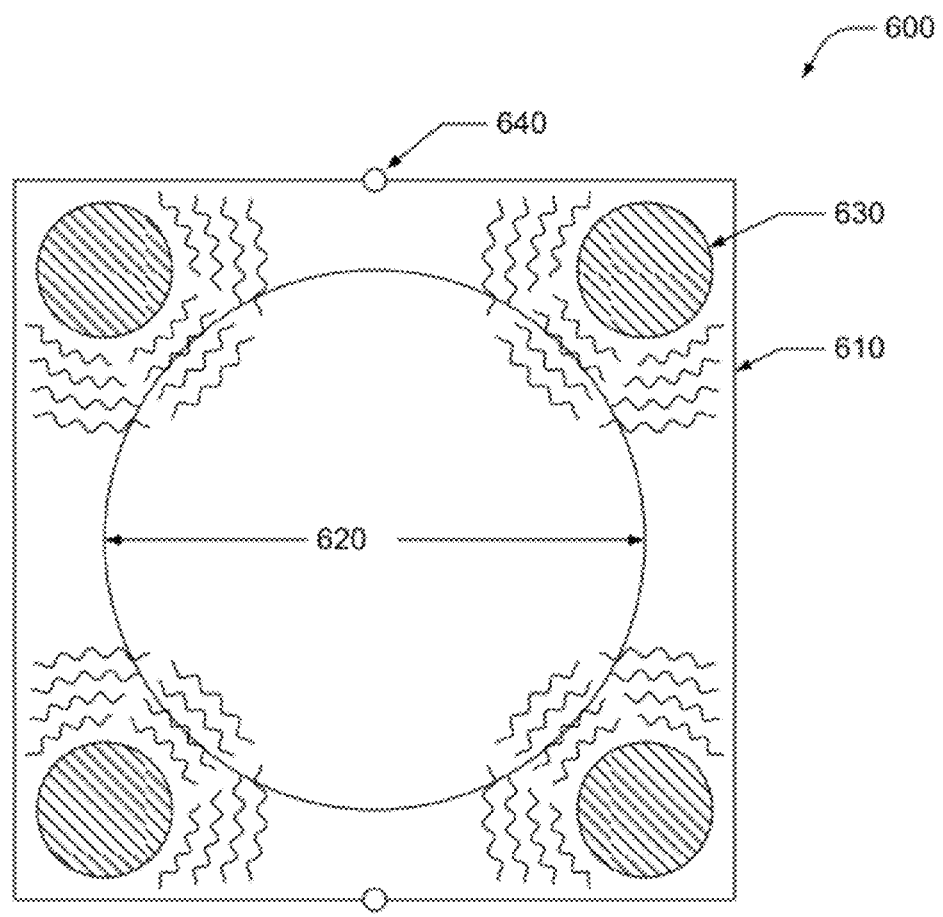
FIG. 6 is a simplified plan view of a reactor and potential resistive heater element locations.

Chamber housing 402 may be equipped with resistive heater cartridges configured to maintain chamber housing 402 at a desired temperature. For example, chamber housing 402 may be equipped with four resistive heater cartridges, one located at each of the four corners of the chamber. FIG. 6 illustrates such an arrangement in a simplified plan view. In FIG. 6, reactor 600 includes chamber 610 with an interior bore 620 defining the sealed processing environment; chamber 610 may be configured with bores in the corners to receive resistive heater cartridges 630. Resistive heater cartridges 630 may be electronically controlled in response to temperatures measured by resistive thermal devices (RTDs) 640 or other temperature-monitoring sensors. Two RTDs 640 may be located on opposite sides of chamber 610, with each RTD 640 located midway between the nearest two resistive heater cartridges 630. Feedback from the RTDs 640 may be used to control the resistive heater cartridges 630 and chamber 610 temperature. Other temperature control systems may also be used, such as circulating heated fluids through bores in the chamber walls.

The chamber interior walls may be temperature-controlled during flowable gap fill processing to a temperature between 40° C. and 80° C. using resistive heater cartridges 630. In some implementations, top plate 404 may not include heating elements and may instead rely on thermal conduction of heat from the chamber resistive heater cartridges 630 to maintain a desired temperature. Various embodiments may be configured to temperature-control the chamber interior walls and other surfaces on which deposition is undesired, such as the pedestal, skirt, and showerhead, to a temperature approximately 10° C. to 40° C. higher than the target deposition process temperature. In some implementations, these components may be held at temperatures above this range.

Through actively heating and maintaining reactor 400 temperature during processing, the interior reactor walls may be kept at an elevated temperature with respect to the temperature at which wafer 410 is maintained; wafer temperature is described in more detail later. Elevating the interior reactor wall temperature with respect to the wafer temperature may minimize or eliminate condensation of the reactants on the interior walls of reactor 400 during flowable film deposition. If condensation of the reactants occurs on the interior walls of reactor 400, the condensate may form a deposition layer on the interior walls, which is undesirable.

In addition to, or alternatively to, heating chamber housing 402 and/or top plate 404, a hydrophobic coating may be applied to some or all of the wetted surfaces of reactor 400 and other components with wetted surfaces, such as pedestal 420, insulating ring 414, or platen 422, to prevent condensation. Such a hydrophobic coating may be resistant to process chemistry and processing temperature ranges, e.g., a processing temperature range of 40° C. to 80° C. Some silicone-based and fluorocarbon-based hydrophobic coatings, such as polyethylene, may not be compatible with an oxidizing, e.g., plasma, environment and may not be suitable for use. Nano-technology based coatings with super-hydrophobic properties may be used; such coatings may be ultra-thin and may also possess oleophobic properties in addition to hydrophobic properties, which may allow such a coating to prevent condensation as well as deposition of many reactants, such as TES, ethanol, and water, used in flowable film deposition. One example of a suitable super-hydrophobic coating is Titanium Dioxide ($TiO_2$).

In one embodiment, reactor 400 may be implemented with a sloped floor. For example, the floor of reactor 400 may be a conic surface rather than a planar surface. The reactor floor may be sloped such that any condensate deposited on the reactor floor flows towards the bottom outer interior edge of reactor 400. Alternatively, the reactor floor may be sloped to direct such condensate towards the center of reactor 400. Drain ports may be included in the location where any such condensate collects. In some implementations, a planar tilt to the reactor floor may be used instead of a conical slope; a conical slope, however, may reduce manufacturing complexity for reactor 400 over a planar tilt.

Reactor 400 may also include pressure sensors configured to measure pressures during wafer processing operations in reactor 400. For example, pressure sensors may be mounted to the interior wall of reactor 400, within recesses in the interior wall of reactor 400, and/or on the exterior of reactor 400. If the pressure sensors are mounted on the exterior of reactor 400, a pressure monitoring port may be provided to allow the pressure sensors to be fluidly connected with the interior of reactor 400. If a pressure monitoring port is implemented, the pressure monitoring port may be configured with a major axis which is horizontal or which slopes such that the major axis is at its lowest point where it intersects the interior wall of reactor 400. In this manner, condensate which forms in the pressure monitoring port will be encouraged to drain from the pressure monitoring port by gravitational forces. The pressure sensors may also be individually heated to prevent condensation from forming and affecting the pressure sensors. The pressure sensors may be configured to measure pressures at one or more locations inside reactor 400. For example, pressure sensors may be configured to obtain pressure measurements at several positions about the internal diameter of reactor 400 and a vertical position located between showerhead 408 and wafer 410 when pedestal 420 is in a raised position, as shown by pedestal 420'. The pressure sensors may also be mounted at an elevation approximately coincident with the plane of wafer 410 when wafer 410 is undergoing a deposition process.

The reactor pressure sensors may provide pressure readings in the reaction area during wafer processing. Such pressure readings may be used to verify that the pressure gradient about the periphery of the reaction area is relatively uniform. The pressure readings may also be used to verify that process pressures stay within process parameters. The pressure sensors may also be used in a closed-loop control implementation, where the exit flow rates of the reactants are adjusted in response to feedback from the pressure sensors. For example, if reaction area pressures measured by the pressure sensors indicate that a desired reaction area pressure is not being maintained, reactant exit flow rates may be decreased to counteract the pressure drop (or increased, if the reaction area pressure is exceeding the desired reaction area pressure). Such decreases and increases of exit flow rates may be managed using, for example, a variable-angle throttle, such as a butterfly valve. The angle of the throttle plate of the valve may be adjusted according to feedback from the pressure sensors.

Pressure sensors of different sensitivities may be used to allow for accurate measurement over a broad pressure range. For example, a 100 Torr manometer and a 10 Torr manometer may be used to allow for accurate pressure measurement at both high and low pressures.

Reactor 400 may also include a vacuum source flow path or other means for evacuating gasses from reactor 400 and inducing reactant flow across wafer 410. For example, reactor 400 may include a series of radially-arrayed ports which are fluidly connected with a vacuum source. The radially-arrayed ports may be located on the bottom surface of reactor 400. The ports may be evenly spaced and may each be of approximately the same size. The radially-arrayed ports may be integrated into a removable baffle plate which may be installed over a substantially annular channel present in the bottom surface of reactor 400. The annular channel may be part of the vacuum source flow path and may include a radial alcove providing a fluid flow connection with the vacuum source flow path.

Figure 7C:
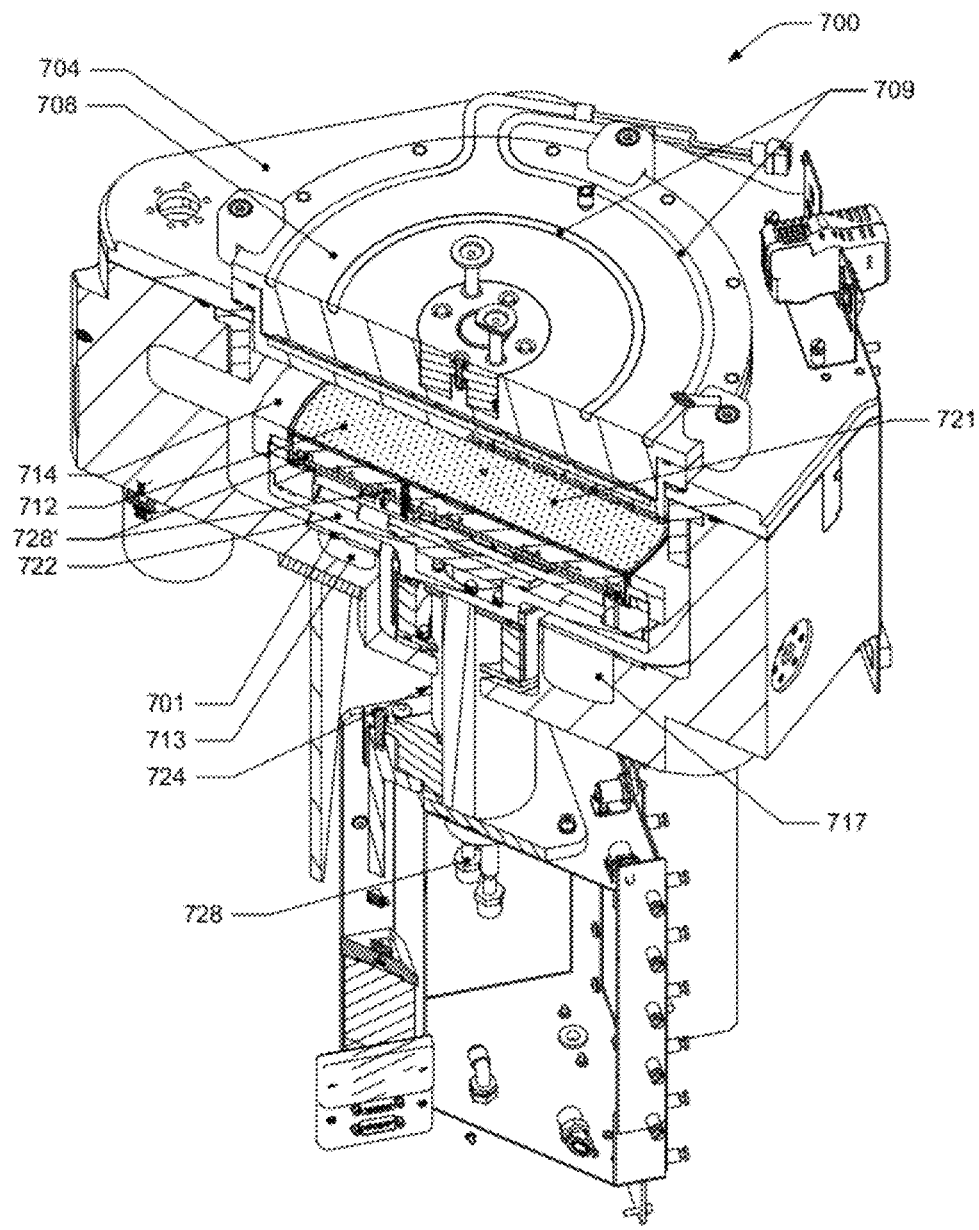
FIG. 7C illustrates a reactor in an isometric cutaway view.

One embodiment of a removable baffle plate and underlying annular channel in reactor 400 may be found in FIGS. 7A-7C. FIG. 7A depicts removable baffle plate 701, which includes annular region 703 and radial extension region 705. Removable baffle plate 701 includes 24 evenly-spaced holes 707. Holes 707 may be 0.225" in diameter and may provide approximately 0.95 $in^2$ of total cross-sectional flow area, although holes 707 may range in size from 0.085" to 0.3" in diameter, although holes 707 for a given removable baffle plate should all be of the same nominal size. Holes 707 may be held to tight diametrical tolerances, such as ±0.001", to minimize flow asymmetries. Additional holes 709 may be provided to facilitate mounting of removable baffle plate 701 to reactor 711; reactor 711 provides similar functionality to reactor 400.

Reactor 711 may include, among other features, annular channel 713. Annular channel 713 may include radial alcove 715, which fluidly connects annular channel 713 with vacuum port 717. Annular channel 713 may have a nominal cross-sectional area of 1.5 $in^2$; the cross-sectional area of annular channel 713 may be larger in the vicinity of, for example, radial alcove 715. Such features may be observed in FIG. 7B.

Figure 8:
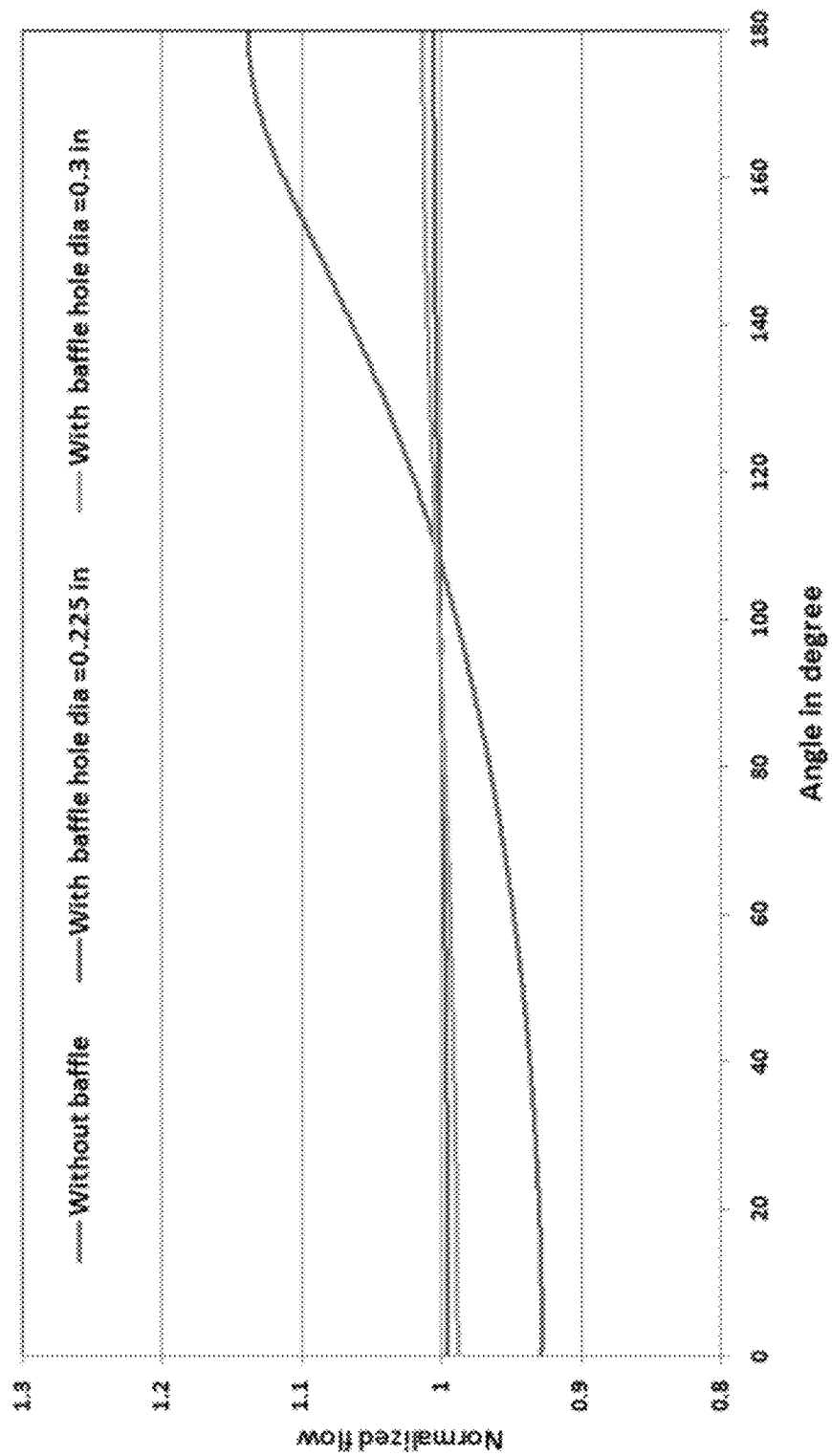
FIG. 8 is a plot of analysis results for a baffle plate.

FIG. 8 depicts a graph of radial flow distribution for an embodiment such as that described above with respect to FIGS. 7A-7C. Three scenarios are depicted: one where the removable baffle plate is not present, one in which the removable baffle plate includes 24 0.225" diameter holes, and one in which the removable baffle plate includes 24 0.3" holes. For each scenario, fluid flows representative of process flows were simulated and normalized flow results obtained for points about the perimeter of a wafer in the flow path. Due to symmetry effects, data is only shown for half of the overall wafer perimeter. As can be seen, flow about the perimeter of the wafer varied from 92% to 113% of the average perimeter flow for the scenario without a removable baffle plate. For a removable baffle plate with 0.225" diameter holes, the variation was approximately 0.4%; for the 0.3" diameter holes, the variation was approximately 1.9%.

Other configurations of removable baffle plates are also envisioned. For example, removable baffle plate 701 may include a different number of holes 707 and/or different diameter holes 707. Annular channel 713 is not restricted to an annular shape and may be implemented using other shapes as well, such as straight channels or a channel swept along a C-shaped path instead of through a complete circle. Removable baffle plate 701 may also be manufactured as two or more pieces which may substantially encircle the pedestal drive column when installed in reactor 711. Embodiments of removable baffle plate 701 may feature a total cross-sectional flow area in which the ratio of the total cross-sectional flow area of the removable baffle plate to the radial cross-sectional flow area of annular channel 713 is approximately 1:10, although specific configurations may vary.

Vacuum port 717 may connect with a vacuum source (not pictured) configured to draw a vacuum or partial vacuum in reactor 711. A variable-angle throttle valve may be interposed between vacuum port 717 and the vacuum source; the variable-angle throttle valve may be used to vary the degree of suction provided via vacuum port 717.

FIG. 7C shows a section view of reactor 700. Annular channel 713 is visible, as is removable baffle plate 701. Annular channel 713 is fluidly connected with vacuum port 717.

Figure 9:
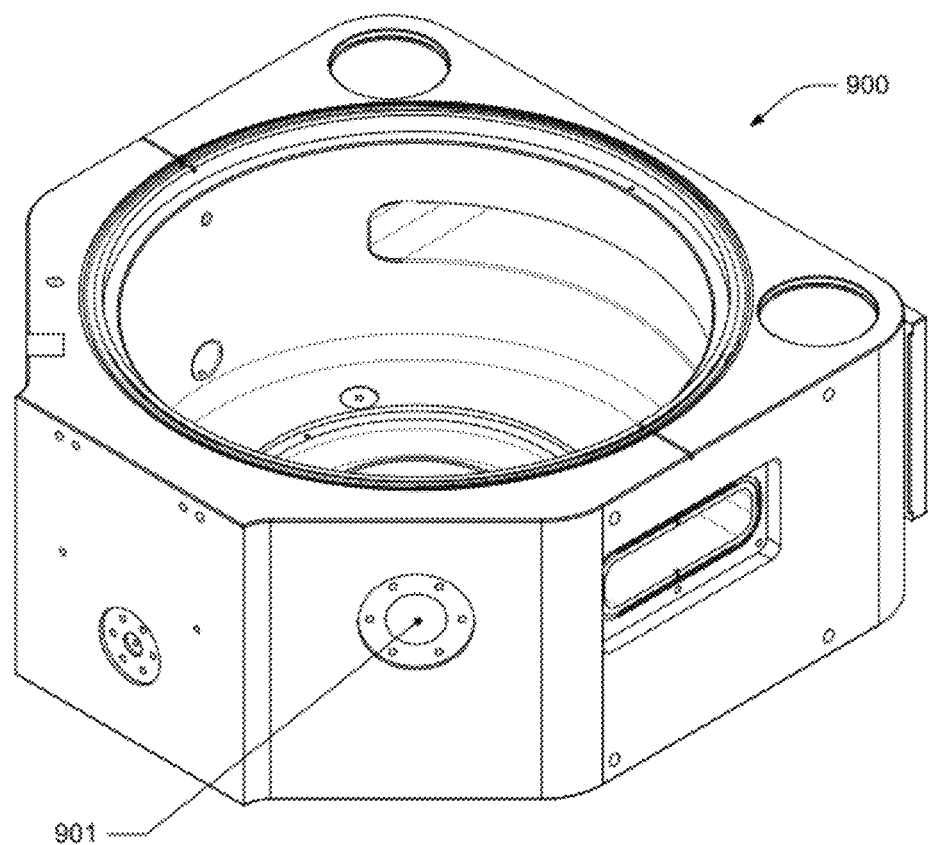
FIG. 9 is an isometric view of a reactor with hidden lines showing internal features.

Reactor 400 may also include remote plasma source port 901 as shown in the embodiment of reactor 900 shown in FIG. 9, which may be used to introduce plasma process gases into reactor 400. For example, remote plasma source port 810 may be provided as a means of introducing etchant or cleaning gas, such as $NF_3$, to the reaction area without requiring that the etchant or cleaning gas be routed through showerhead 408. Remote plasma source port 810 may also be used to deliver hydrogen-oxygen-inert gas mixtures which may be used to pacify $NF_3$. Providing etchant gas through means other than showerhead 408 allows showerhead 408 to be devoted to deposition processing and provides for more uniform plasma formation in reactor 400.

In the context of reactor cleaning there are two options to activate $NF_3$: direct plasma and remote plasma. In the former case, plasma will be more uniform if the $NF_3$ is routed through the showerhead, which may provide better repeatability. In some cases, where the area to be cleaned is at the outside edge of the pedestal, $NF_3$ might not need to be routed through the whole showerhead and may instead, for example, be routed through an annular region of the showerhead in the vicinity of the wafer perimeter. In the remote plasma case, routing activated $NF_3$ (mostly atomic F) through the showerhead is typically less desirable because atomic F will recombine at any surface, such as the interior of the showerhead, which reduces clean rate. Highly reactive atomic F may cause damage to the internal components of the gas distribution system, such as O-rings and valves.

Gas Distribution Manifold/Showerhead

The module may include a gas distribution manifold, or showerhead, which facilitates gas distribution across the wafer in a desired manner. In flowable gap fill processing, showerhead 408 may be configured to deliver oxidant(s) and precursor(s) to the reaction area separately to prevent mixing of the oxidant(s) and precursor(s) prior to introduction of these reactants into reactor 400. Once the oxidant(s) and precursor(s) are allowed to mix, they may form a flowable film. If the flowable film forms in showerhead 408 prior to introduction into reactor 400, the flowable film may interfere with the even distribution of the reactants through showerhead 408. For example, if a flowable film forms within showerhead 408, the film may partially or completely block some of the small holes, described below, which may be used to distribute the reactants across the surface of wafer 410. Such blockages may result in uneven fluid flow across wafer 410. Another concern is particle formation resulting from reactant mixing. Particles may be formed and entrained in the reactant flows and may contaminate the processed wafer or may impinge on the wafer surface and cause surface irregularities.

Showerhead 408 is configured to provide dual-flow gas delivery to reactor 400. Dual-flow showerhead 408 is configured to evenly distribute the oxidant(s) and precursor(s) across the reaction area in the reactor via separate delivery paths. For example, dual-flow showerhead 408 may include O-plenum 432 and P-plenum 434. Each plenum may be fluidly connected with the interior of reactor 400 via a plurality of flow paths, such as via patterns of small holes penetrating into each respective plenum through the face of the showerhead facing the wafer. As illustrated in FIG. 4B, O-reactants 442 and P-reactants 444 distributed through O-plenum 432 and P-plenum 434 in dual-flow showerhead 408 are fluidly separate until they are introduced into reactor 400, at which point they intermix to form deposition gas mixture 446. Deposition gas mixture 446 flows across wafer 410 and into the larger interior volume of chamber 400 through an annular gap between pedestal 420' and skirt 406. The holes in the pattern of holes for each respective plenum may be located so as to evenly distribute the plenum's respective reactant across the processing area.

O-plenum 432 may be fluidly connected with the reaction area via an O-pattern of O-plenum holes 448. Similarly, P-plenum 434 may be fluidly connected with the reaction area via a P-pattern of P-plenum holes 450. The diameters of O-plenum holes 448 and P-plenum holes 450 may be configured such that the average exit velocity of O-reactants 442 from O-plenum holes 448 is substantially matched to the average exit velocity of P-reactants 444 from P-plenum holes 450.

O-reactants 442 and P-reactants 444 may be supplied to showerhead 408 from gas delivery system 320 at different volumetric flow rates. For example, during flowable gap fill processing, O-reactants 442 may be delivered to showerhead 408 from gas delivery system 320 at a volumetric flow rate four times more than the volumetric flow rate at which P-reactants 444 are delivered to showerhead 408. Thus, O-plenum 432 may include O-plenum holes 448 of the same diameter as P-plenum holes 450 in P-plenum 434, but include four times as many O-plenum holes 448 as P-plenum holes 450. Alternatively, O-plenum 432 may include the same number of O-plenum holes 448 and P-plenum holes 450, but each O-vent hole 448 in O-plenum 432 may have a cross-sectional area four times larger than the cross-sectional area of a P-vent hole 450 in P-plenum 434. Other configurations may be used as well, such as adjusting the diameter/cross-sectional area of the plenum holes as well as the number of plenumholes for a given plenum. In certain embodiments, the ratio of the total cross-sectional area of O-plenum holes 448 to the total cross-sectional area of P-plenum holes 450 is substantially equal to the ratio of the volumetric flow rate of oxidant reactants 442 to the volumetric flow rate of precursor reactants 444.

Figure 10:
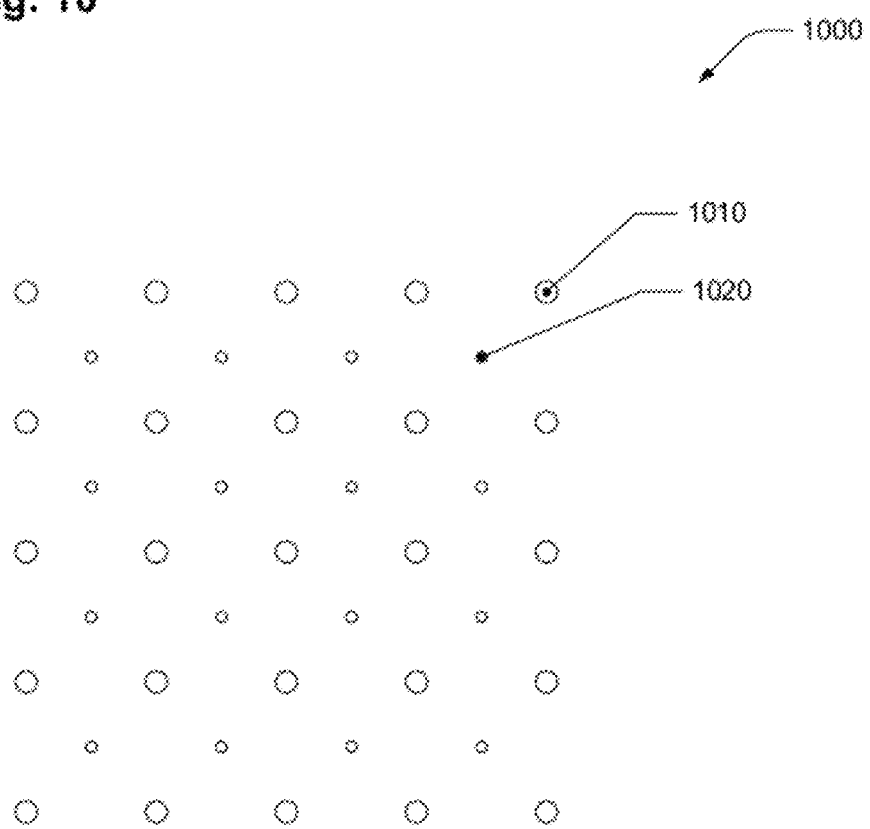
FIG. 10 illustrates a partial hole pattern for use with a showerhead.

In a particular embodiment, showerhead 408 features an O-pattern and P-pattern as shown in FIG. 10. The hole patterns 1000 shown in FIG. 10 are developed for use with a dual-flow showerhead designed for use with TES+ethanol+helium P-reactants and steam+helium O-reactants and an overall flow rate of approximately 500-5000 sccm. O-pattern features 1456 O-holes 1010 with a diameter of 0.040 in. P-pattern features 1616 P-holes 1020 with a diameter of 0.019 in. The total cross-sectional area for the O-pattern of O-holes 1010 is approximately 1.83 in$^2$. The total cross-sectional area for the P-pattern of P-holes 1020 is approximately 0.46 in$^2$. The overall ratio of P-pattern cross-sectional area to O-pattern cross-sectional area is approximately 1:4.

The O-pattern of holes and P-pattern of holes shown in FIG. 10 are both rectilinear patterns with equal spacing in the X and Y directions; the O-pattern and P-pattern are offset from one another such that one pattern's interior holes are diagonally centered between the nearest four holes of the other pattern. Other hole patterns are contemplated as well, such as hexagonal patterns, non-equal rectilinear patterns, circular patterns, spiral patterns, and patterns with spacing which varies depending on the hole distance from the center of the wafer.

The plenum holes for the plenums may also be sized to prevent excessive jetting of the reactants into the reactor. Excessive jetting occurs when the reactant flows from showerhead 408 resist transitioning from the laminar flow regime to the turbulent flow regime, which may cause the reactant flows to fail to effectively mix with each other prior to contacting wafer 410 or which may cause a crater or bowl feature to be formed in the deposited flowable film due to an uneven pressure front in the reactants. The flow rates for the reactants may be adjusted to produce a constant or near-constant pressure front at or near the face of the wafer being processed. In general, reactant flow rate, plenum hole quantity, and separation distance between the plenum holes and the wafer surface all contribute to a determination of an acceptable plenum hole diameter. For example, plenum flow holes may be designed in accordance with the following relationship: $L/D \geq 0.112$ Pe, where L is the mixing length, e.g., distance between plenum flow hole outlet and wafer, D is the distance between adjacent plenum flow holes, and Pe is the (mass dispersion) Péclet number of the reactant flow.

The reactant transit time through the showerhead plenums may be minimized to the extent possible to increase system responsiveness. In certain embodiments, the showerhead plenum volume(s) should be less than 10-20% of the volume of the reaction area. For a dual-flow showerhead, the residence time of reactants within each plenum may be matched to ensure synchronized delivery of reactants from both plenums. For example, the O-plenum may be X times larger in volume than the P-plenum if the O-reactant flow rate is to be X times greater than the P-reactant flow rate. For example, a showerhead with an O-plenum with a volume 4× larger than the volume of the P-plenum may be used in a system where the O-reactant flow rate is approximately 4× greater than the P-reactant flow rate.

While a dual-flow plenum is described herein, a single-flow plenum may be used to distribute reactants across the wafer-processing area. For example, reactants may be supplied to the showerhead and may mix within a single plenum before introduction into the reactor. While a dual-flow showerhead may be used when reactants react in the gas phase at the pressure and temperature conditions in the showerhead, a single-flow showerhead may provide an acceptable alternative in some processing scenarios where the pressure and temperature conditions within the showerhead are such that the reactants do not react, or react at reduced levels. Additionally, a single-flow showerhead may be used when residence time of the reactants within the showerhead is short. In such cases, physical separation of the reactants may not be required to mitigate unwanted deposition within the showerhead.

Showerhead 408 may include heater elements or heat conduction paths which may maintain the showerhead temperature within acceptable process parameters during flowable gap fill processing. For example, showerhead 408 may be thermally coupled to top plate 404, which may have a resistive heater blanket, as discussed above, installed. The resistive heater blanket may provide heat to showerhead 408 via top plate 404 and be configured to heat showerhead 408 to between 40 and 150° C., although the showerhead may, in some configurations, typically be heated to approximately 100° C. Showerhead 408 may thus be maintained at an elevated temperature with respect to wafer 410 being processed. By maintaining showerhead 408 at an elevated temperature, condensation of deposition gas mixture 446 within showerhead 408 is prevented. In embodiments in which showerhead 408 is a single-flow design, heating showerhead 408 may also prevent condensation of any deposition gas mixture 446 which may exist within the showerhead plenum.

Showerhead 408 may also include an RF electrode for generating plasma environments within the reaction area. Pedestal 420 may also include an RF electrode for generating plasma environments within the reaction area. Such plasma environments may be generated using capacitive coupling between a powered electrode and a grounded electrode; the powered electrode, which may be connected with a plasma generator, may correspond with the RF electrode in showerhead 408. The grounded electrode may correspond with the pedestal RF electrode. Alternative configurations are also possible. The electrodes may be configured to produce RF energy in the 13.56 MHz range, 27 MHz range, or, more generally, between 50 Khz and 60 MHz. In some embodiments, there may be multiple electrodes provided which are each configured to produce a specific frequency range of RF energy. In embodiments wherein showerhead 408 includes a powered RF electrode, chuck 412 may include or act as the grounded RF electrode. For example, chuck 412 may be a grounded aluminum plate, which may result in enhanced cooling across the pedestal-chuck-wafer interface due to aluminum's higher thermal conductivity with respect to other materials, such as ceramics. An aluminum plate may also allow for cooling channels to be machined in the back face of the aluminum plate to allow liquid coolant to be circulated within chuck 412; such channels may cause cracking in a ceramic plate due to thermal expansion stresses. This is discussed later below. Inclusion of an RF electrode in showerhead 408 with a grounded electrode may also result in a lower ion bombardment of the wafer.

FIG. 7 illustrates one embodiment of reactor 700 which features showerhead 708 mounted to top plate 704. Resistive heater element 709 is embedded in a groove on the top of showerhead 708 and may be used to heat showerhead 708.

While the above embodiment discusses a chuck featuring a grounded aluminum plate RF electrode, other embodiments of the chuck may not include an RF electrode integrated with an aluminum chuck.

Skirt or Shield

Skirt 406 or a shield, hereinafter "skirt," may be used to provide a mechanical barrier to reactant flows within reactor 400. The interface between skirt 406 and pedestal 420' may restrict the flow of deposition gas mixture 446 out of the reaction area in the radial direction. The interface may constitute an annular gap with an outer diameter defined by an internal diameter of skirt 406 and an inner diameter defined by an outer diameter of pedestal 420'. The annular gap may be between 0.112" and 0.125" for a typical wafer, with a nominal gap size of 0.125" for a skirt with a 14.25" inner diameter. Pedestal 420' and skirt 406 may be configured such that the relative position of pedestal 420' with respect to showerhead 408 may be changed from a deposition configuration to a cleaning or plasma treatment configuration, and vice-versa, without altering the cross-sectional flow area of the annular gap.

Skirt 406 may, through this flow restriction, cause a backpressure to be generated in the reaction area. Skirt 406 should not be confused with shields used in other semiconductor fabrication processes which form a gas-tight seal with pedestal 420'.

Skirt 406 may also act to confine a plasma in the reaction area if plasma processing is performed in reactor 400. While flowable gap fill processing does not require a plasma during flowable gap fill operations, plasmas may still be used in cleaning, pre-deposition treatment, post-gap fill treatment, cure, or other operations. Skirt 406 may also be used to tune the size of the plasma by varying the backpressure in the reaction area.

Skirt 406 may also have an impact on heat flow within reactor 400.

Skirt 406 may be made from a ceramic material. Skirt 406 may also be made from a dielectric material if plasma processing is to also occur within reactor 400. Skirt 406 may be heated through the use of heater elements placed in skirt 406 and/or through heat conduction from top plate 404 or other components conductively coupled with skirt 406. Skirt 406 may be configured to be heated to a temperature between 40 and 80° C. during deposition processing. Because skirt 406 is not required to form a contact seal with pedestal 420' during flowable gap fill, skirt 406 may be maintained at an elevated temperature with respect to pedestal 420' and wafer 410 without conductive heat transfer to pedestal 420' and wafer 410.

Skirt 406 may be configured to be mounted to or seated in top plate 404, and may provide an interface for mounting showerhead 408. Various embodiments employ alternative mounting configurations. For example, showerhead 408 and skirt 406 may both mount directly to top plate 408 but not interface directly with each other. In a particular embodiment, skirt 406 may be integrated with showerhead 408 or with top plate 404 and may not be a distinct component.

Pedestal

Pedestal 420 provides axial support to the wafer during processing via a chuck, discussed later. Pedestal 420 may be configured to raise and lower, as indicated by pedestal 420', during processing to facilitate different processing stages or wafer 410 loading and unloading. Pedestal 420 may also provide power for sparking plasmas. Pedestal 420 may also provide cooling and/or heating capabilities for controlling the temperature of chuck 412 and wafer 410 during processing.

During flowable gap fill processing, pedestal 420' may be positioned such that wafer 410 is located approximately 12 mm beneath showerhead 408. Skirt 406 configuration, pedestal 420' size, and pedestal 420' position relative to skirt 406 may define an annular pedestal flow area between pedestal 420' and skirt 406. The backpressure in the reaction area may be a function of the annular pedestal flow area, the volumetric flow rate(s) of the reactants, pressure increase due to chemical reactions, and environmental conditions.

In various embodiments, pedestal 420' is positioned during flowable gap fill processing such that the backpressure in the reaction area is maintained at approximately 25 Torr. After flowable gap fill processing, pedestal 420' may be repositioned to produce a larger annular gap for rapid backpressure relief or for wafer handling. In particular embodiments, pedestal 420' may, during deposition, be re-positioned continuously or at intervals based on time or on reaction area pressure set-points being reached. The wafer 410/showerhead 408 spacing may be more or less than 12 mm during flowable gap fill processing, depending on other parameters such as pedestal 420' size or skirt 406 dimensions and location.

During plasma treatment, such as during a wafer cleaning operation, pedestal 420' may be positioned such that wafer 410 is located approximately 25 mm beneath showerhead 408. In preparation for cleaning, pedestal 408 may be repositioned relative to the position pedestal 408 is in for flowable gap fill processing to facilitate rapid pressure bleed off from the reaction area.

Pedestal 420 may include platen 422 or a base plate, drive column 424, and a drive mechanism (not shown). Platen 422 or base plate, hereinafter "platen," may be a circular, substantially flat surface. Platen 422 may serve as an interface for chuck 412, which is configured to accept wafer 410 for processing. Alternatively, wafer 410 may be placed directly on platen 422 in some processes. Drive column 424 provides axial support to platen 422 and may be configured to translate platen 422 within chamber housing 402 along the chamber central axis. Drive column 424 may protrude through the floor of chamber housing 402 and connect with the drive mechanism. Seal 426 may seal the interface between chamber housing 402 and drive column 424 to prevent fluid flow between reactor 400 and the outside environment. The drive mechanism is configured to translate drive column 424 and platen 422 in a vertical direction, i.e., towards or away from showerhead 408.

Pedestal 420 may include features for cooling or heating chuck 412 mounted to platen 422. For example, pedestal 420 may include coolant loop 428 which circulates chilled coolant from an outside chiller through platen 422. Other configurations may route coolant loop 428 through chuck 412, for example. Coolant loop 428 may be augmented by a heater (not shown), such as a resistive heating element, which may be used to raise the temperature of platen 422. Through using both a chiller and a heater, the time needed to achieve a desired temperature set-point may be reduced significantly. For example, if wafer 410 is required to be cooled from 20° C. to −5° C., a chiller with a setpoint of −5° C. may be used. However, if the chiller is used in conjunction with a heater, the chiller may be set to a setpoint lower than −5° C., which will accelerate the cooling process. The heater may be used to counteract the chiller once the −5° C. mark is reached. For example, the chiller may have a setpoint of −20 to +80° C., and/or be configured to support a chuck setpoint of −15 to +80° C. In this manner, the overall time to cool the wafer to the desired working temperature may be significantly reduced, which decreases process time and increases throughput for the system. A lower chiller setpoint may also be used to counteract the heat imparted from a hot wafer to a chilled platen. In some embodiments, the chiller may be configured with a setpoint of 1-5° C. lower than the wafer process temperature.

The heater (and/or chiller) may also be configured to heat the platen to a temperature of greater than 70° C., e.g., 80° C., during plasma treatment to avoid condensation of plasma reactants on the platen, pedestal, chuck, or wafer. The heater (and/or chiller) may be configured to heat the platen or pedestal to a temperature of between 30° C. and 50° C., e.g., 40° C., to desorb products and byproducts of the reaction. Similar temperatures may be induced in chamber housing 402 and other components within the chamber.

Platen 422 and skirt 406 may be engineered to have tight concentricity tolerances. By maintaining a high degree of concentricity between platen 422 and skirt 406, the annular gap formed between skirt 406 and insulating ring 414, which is mounted to platen 422, may be maintained at a near-constant value about the perimeter of insulating ring 414. This promotes even gas-flow across wafer 410 and reduces unbalanced deposition.

The concentricity of platen 422 with respect to skirt 406 may be enhanced through the use of radial locator features on platen 422 which engage with skirt 406 to radially center platen 422 with respect to skirt 406. Of course, the radial locator features may also be located on skirt 406 and interface with platen 422. An alternative embodiment may involve radial standoffs on platen 422 which engage with the sidewalls of chamber housing 402; if skirt 406 is similarly equipped with radial locator features, chamber housing 402 may act as a common reference surface which may be used by both components to establish a concentricity relationship. This latter configuration has the benefit of allowing the radial locator features to be located some distance from the annular gap formed by skirt 406 and insulating ring 414, which mitigates flow imbalances caused by the presence of radial locator features located near the platen-skirt annular gap.

Pedestal 420 may incorporate purge gas supply 430 in pedestal drive column 424 to prevent deposition, condensation, or icing within pedestal 420. As shown in FIG. 4C, purge gas supply 430 may circulate purge gas 452, such as clean dry air (CDA) or nitrogen, through pedestal drive column 424; purge gas 452 may also be heated to further inhibit the formation of condensation or ice inside pedestal drive column 424. Heating the interior of pedestal drive column 424 with heated CDA or nitrogen may also be used to indirectly heat the exterior of pedestal drive column 424, which may prevent condensation or icing on the exterior surface as well.

Pedestal 420 may also be configured to deliver purge gas to the perimeter of wafer 410. For example, as shown in FIG. 4D, which depicts a variation on the embodiments depicted in FIGS. 4A through 4C and FIG. 4E, purge gas 52 may be delivered through pedestal column 424 to a distribution system which evenly distributes purge gas 452 around the periphery of wafer 410 from the underside of wafer 410. Purge gas 452 may thus be used to protect the surface of chuck 412 and insulating ring 414 from unwanted deposition. Purge gas 452 may also be used to prevent increased deposition about the periphery of wafer 410. Purge gas 452 may still also be supplied to the inside of pedestal drive column 424, although this feature is not shown in FIG. 4D.

Chuck

Chuck 412 serves as the interface between pedestal 420 and wafer 410 during wafer processing. Chuck 412 may fulfill a number of roles. Chuck 412 supports wafer 410 in the vertical direction during processing. Chuck 412 may also incorporate features or technologies which restrain wafer 410 in the radial direction and prevent wafer 410 from rotating relative to chuck 412.

In one embodiment of the invention, chuck 412 may be an electrostatic chuck (ESC), which may include a ceramic disk with embedded RF electrodes 416. RF electrodes 416 may be configured as a biased electrode and provide power to generate and maintain a plasma generated inside reactor 400. For example, RF electrodes 416 may be configured to supply 3 kW of power at 13.65 MHz to a plasma generated inside reactor 400. In this embodiment, the showerhead is grounded; in other embodiments, the ground is in pedestal 424 with showerhead 408 powered. In configurations where plasma is not used or where power is provided to other components, such as showerhead 408, chuck 412 may include a grounded aluminum disk. The grounded aluminum chuck may have a higher thermal conductivity and allow for more rapid heating and cooling of wafer 410 during processing than other chuck materials.

Embodiments featuring a grounded aluminum chuck may simply integrate the grounded aluminum chuck into a component in pedestal 424. For example, chuck 412 and platen 422 could be one integrated component rather than separate pieces. This would provide improved thermal conduction over a separate chuck 412/platen 422 configuration due to the elimination of the interface between the two parts.

Figure 4E:
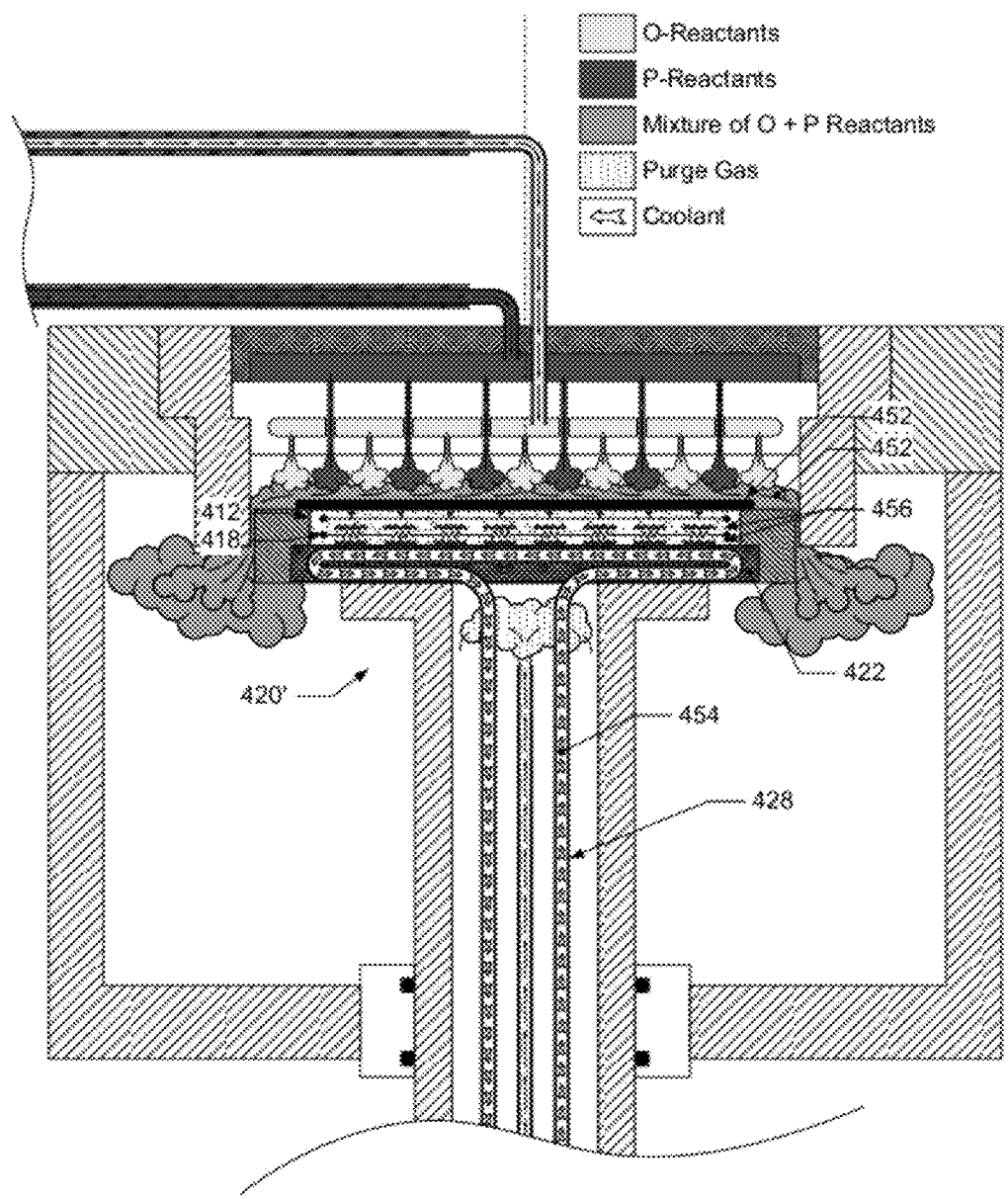

Chuck 412 may have heating features, such as resistive heaters 418, embedded inside chuck 412 or attached to an outer surface of chuck 412. Chuck 412 may also include features for providing cooling, such as Peltier junctions or coolant flow paths for refrigerated coolant circulation. These heating and cooling features may augment or replace the features mentioned above in the discussion of the pedestal. In some embodiments, a cooling feature may be located in one component and a heating feature may be located in the other component. For example, chuck 412 may include resistive heater elements 418 embedded within a ceramic disk comprising the body of chuck 412, and platen 422 may include coolant loop 428 configured to circulate coolant 454, as shown in FIG. 4E, underneath the interface surface between chuck 412 and wafer 410. Coolant 454 may be used to cool platen 422 and, via conductive heat transfer, chuck 412. Resistive heater elements 418 may be powered to generate heat 456 in chuck 412 directly. Thus, chuck 412 may be both heated and cooled.

Coolant 454 may be circulated from a remote chiller, such as the Thermorack 1200 from Solid State Cooling. The chiller may be mounted remotely from the pedestal to reduce vibration in the pedestal assembly. The chiller may be configured to regulate coolant 454 temperature based on feedback from a temperature-sensing device located within pedestal 420 or chuck 412. For example, chuck 412 may be configured with one or more RTDs which may provide feedback regarding the current temperature of chuck 412 to the chiller. The chiller may adjust coolant 454 temperature up or down depending on the temperature feedback from the RTDs. Locating the one or more RTDs in chuck 454 or in close proximity to chuck 412, such as in pedestal 420 near the platen 422/chuck 412 interface, may improve the cooling response time by nearly 50% over configurations relying on an RTD in the chiller itself. An alternative to using one or more chuck-mounted RTDs is to use a sensor capable of remote measurement, such as a Lumasense infrared thermometer. Use of a remote-sensing device such as a Lumasense thermometer allows for the temperature of wafer 410, rather than the temperature of the chuck, to be used for controlling the chiller. Managing chuck 412 temperature based on a reading of wafer 410 temperature would result in more accurate thermal control of wafer 410.

During wafer 410 processing, chuck 412 and/or coolant loop 428 may reduce the temperature of wafer 410 to promote condensation of deposition gas mixture 446 into flowable gap fill material on wafer 410. For example, coolant loop 428 may reduce the temperature of chuck 412 and wafer 410 to a set-point of −5° C. for flowable gap fill processing.

Resistive heating elements 418 may also be configured to heat chuck 412 to substantially elevated temperatures. For example, resistive heating elements 418 may be configured to heat chuck 412 to 80° C. during plasma cleaning operations to prevent condensation during the plasma cleaning operation.

In some embodiments which feature purge gas delivery to the perimeter of wafer 410, as discussed previously in the section describing the pedestal, the wafer may be offset from the surface of the chuck using physical standoffs and the purge gas may be introduced into the gap between wafer 410 and the interface surface of chuck 412. The standoffs may be configured to support wafer 410 in a manner which minimally interferes with purge gas flow between wafer 410 and chuck 412. The purge gas may be introduced into the gap between wafer 410 and chuck 412 through ports located in chuck 412.

Perimeter purge gas delivery embodiments may also include features on chuck 412, insulating ring 414, or other pedestal 420 components which guide purge gas flow when the purge gas exits the region between wafer 410 and chuck 412. For example, insulating ring 414 may include a raised annular boss which encircles wafer 410 and which has an inner diameter slightly larger than the outer diameter of wafer 410. In such an embodiment, the purge gas may generally flow in an axial direction after reaching the perimeter of wafer 410, in contrast to the largely radial flow experienced when the purge gas is between wafer 410 and chuck 412. Such embodiments may be used to reduce flowable film deposition at the periphery of wafer 410, such as in the wafer bevel region or the wafer side region.

FIG. 7C, previously introduced, depicts reactor 700 and components mounted to pedestal 720 for a particular embodiment. Coolant line 728 routes coolant through pedestal shaft 724 and platen 722 to chuck 712. Cooling channels 728' distribute coolant throughout chuck 712. Resistive heater elements may also be embedded within 712, but are not shown in FIG. 7. Insulator ring 714 encircles chuck 712. Chuck 712 may include purge gas distribution holes 719 arrayed across the wafer support region of the chuck. Chuck 712 may also feature standoffs (not shown), which provide support to a wafer during processing and which allow the purge gas to flow towards the periphery of a processed wafer.

Insulating Ring

Pedestal 420 may also include insulating ring 414. Insulating ring 414 may act to shield surfaces of pedestal 420 and chuck 412 from plasmas formed during wafer processing. Insulating ring 414 may also shield surfaces of pedestal 420 and wafer 410 from unwanted deposition or condensation during wafer processing. Finally, insulating ring 414 may prevent plasma arcing to chuck 412 or RF electrode 416.

Insulating ring 414 may be fashioned from a material such as alumina, and may be formed in a circular shape. Insulating ring 414 may be manufactured with a first inner diameter which is slightly larger than the outer diameter of platen 422 and a second inner diameter which is slightly larger than the diameter of chuck 412.

If insulating ring 414 is used in pedestal 420, an edge or surface of insulating ring 414 may define one boundary of an annular gap between pedestal 420 and skirt 406, as discussed previously. If pedestal 420 is being used to regulate gas flow through the deposition area, the concentricity of insulating ring 414 with skirt 406 will be at least partly determinative of the flow uniformity through the annular gap. In such configurations, the dimensional tolerances of insulating ring 414 must be tightly controlled, as must the position of insulating ring 414 once installed on pedestal 420.

One embodiment of an insulating ring may feature an annular ring 14" in diameter. The annular ring may feature an internal diameter of substantially 11.5-12" for substantially 0.5-0.6" of the annular ring's thickness. The internal diameter of the annular ring may then step up to substantially 12.75-13" in diameter for substantially 0.25-0.375" of the annular ring's thickness. Finally, the annular ring may step up to a diameter of substantially 13-13.125" for substantially 0.625-0.75" of the annular ring's thickness. The overall thickness of the annular ring may be approximately 1.375-1.725". Other features, such as chamfers, small shoulders, and fillets may also be present, as well as locator or indexing features.

Alternate Reactor and Module Configurations

Figure 11:
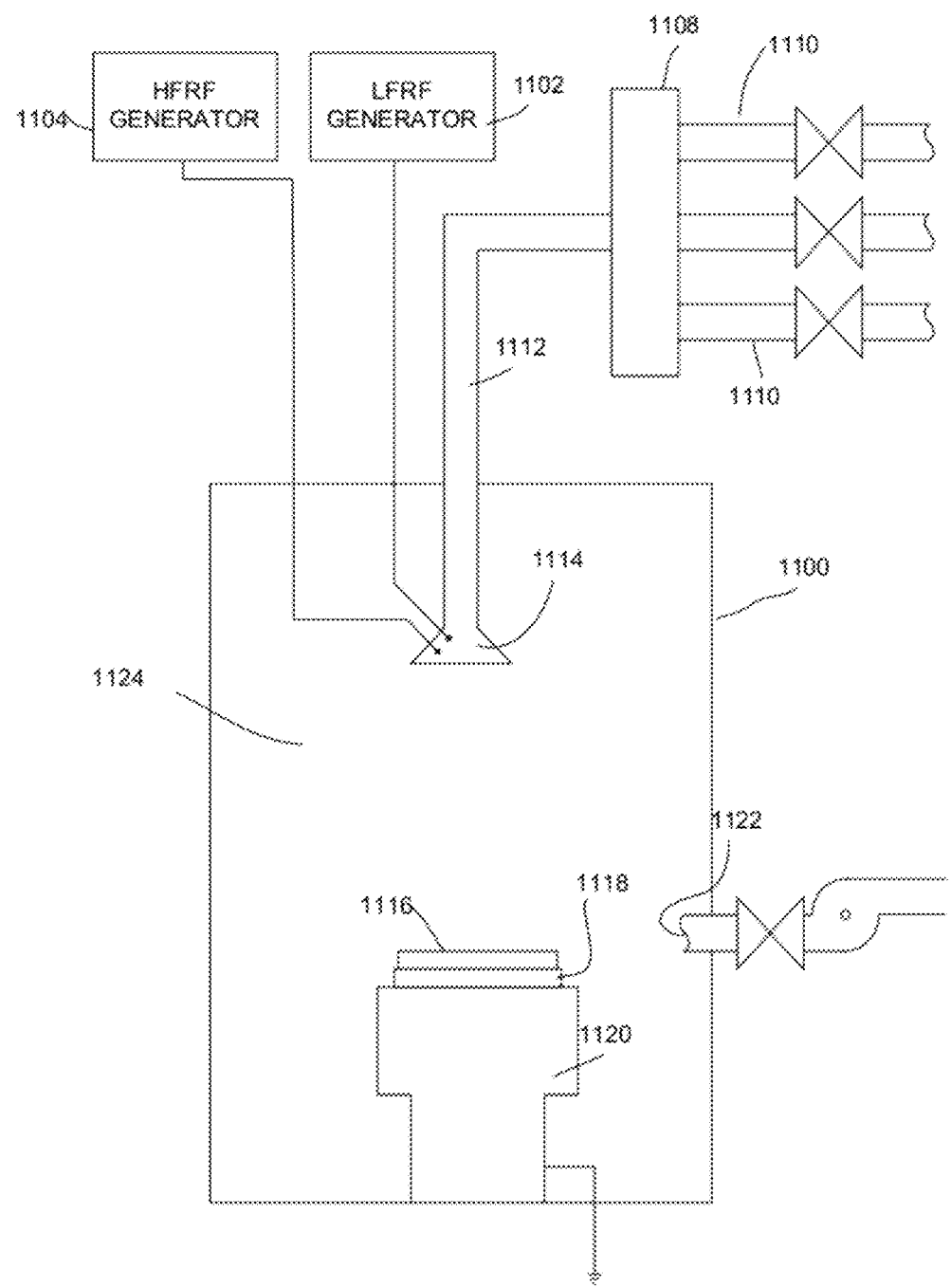
FIG. 11 shows an example of a reactor or module.
Figure 12:
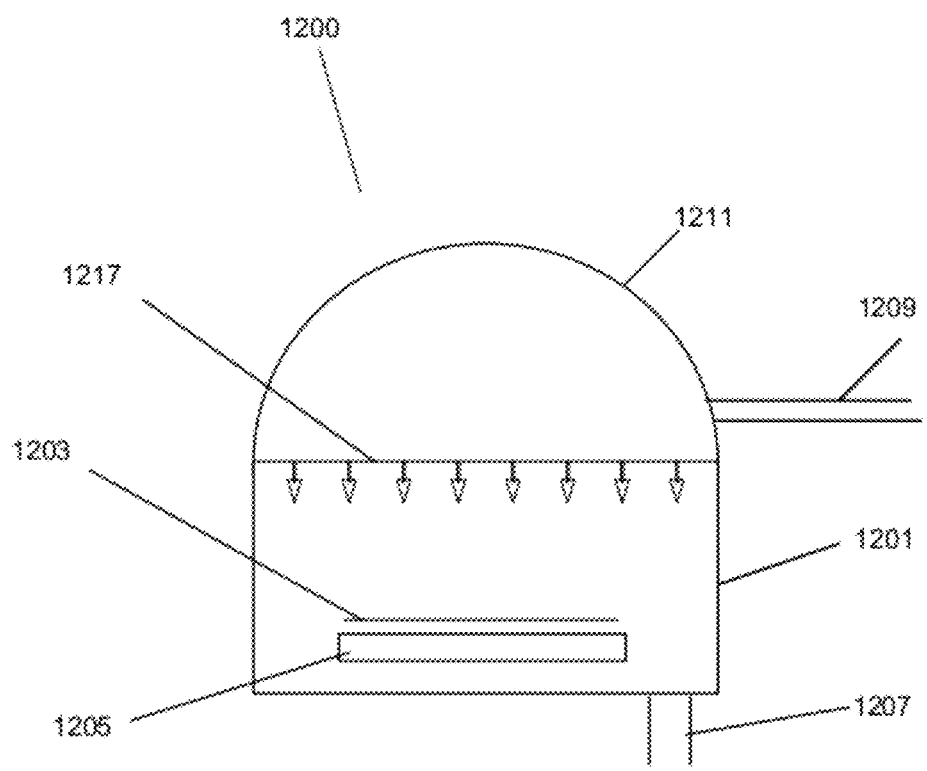
FIG. 12 is a simplified schematic of a remote plasma treatment module.
Figure 13:
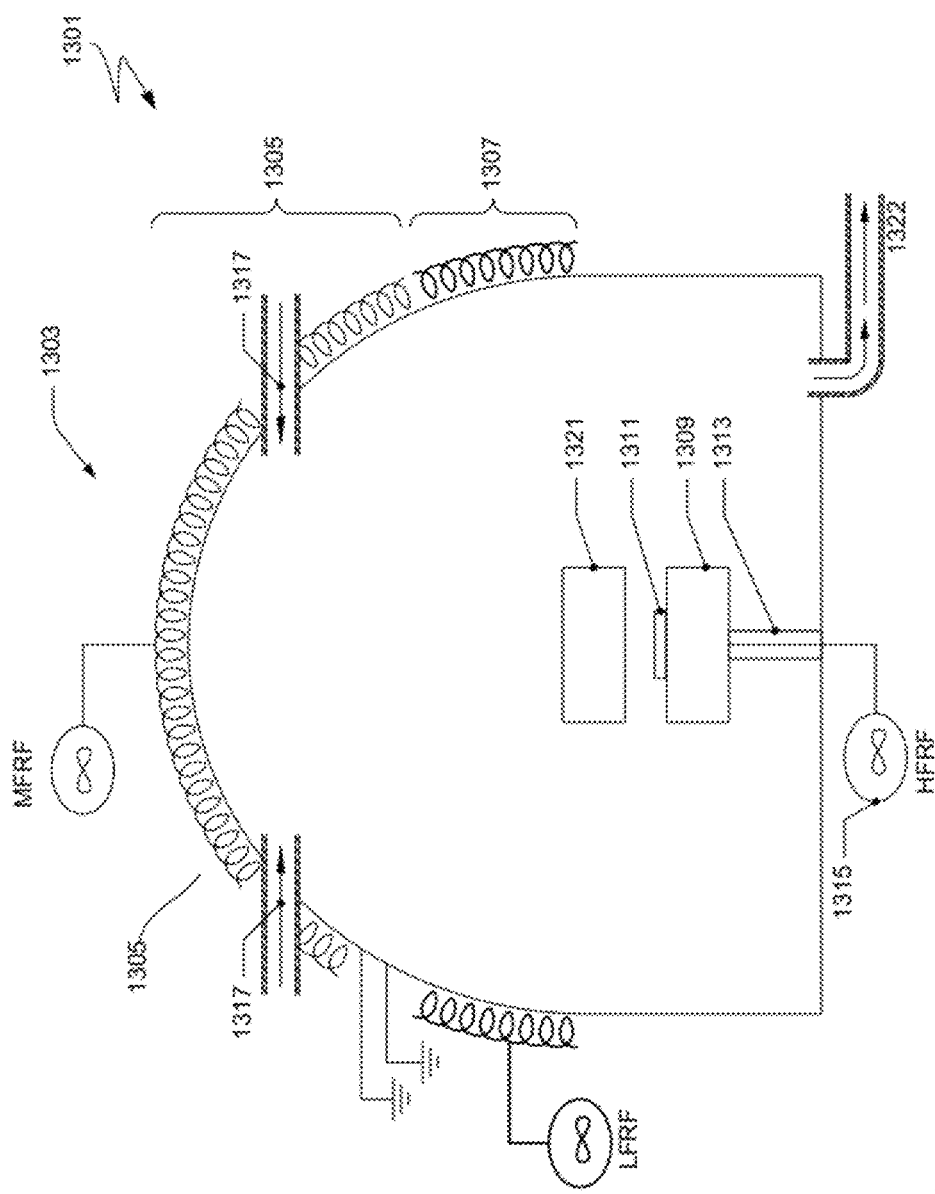
FIG. 13 is a simplified illustration of various components of a HDP-CVD apparatus.

The systems and structures disclosed above may include other reactor or module configurations as well, such as reactors or modules equipped for deposition of dielectric film and/or pre- or post-deposition treatments, including HDP-CVD reactors, PECVD reactors, sub-atmospheric CVD reactors, any chamber equipped for CVD reactions, chambers used for PDL (pulsed deposition layers), and chambers equipped for CFD. FIGS. 11-13 are examples of modules or reactors that may be included in a tool configuration, such as those shown in FIGS. 2A and 2B.

FIG. 11 shows an example of a reactor or module that may be used in accordance with certain embodiments of the invention. Reactor 1100 may be used as a deposition chamber, a treatment and deposition chamber, or as an independent cure module. Reactor 1100 is suitable for both dark (non-plasma) or plasma-enhanced deposition and as well as treatment, for example, via capacitively-coupled plasma. As shown, reactor 1100 includes process chamber 1124, which encloses other components of the reactor and serves to contain the plasma generated by a capacitor-type system including showerhead 1114 working in conjunction with grounded heater block 1120. Low-frequency RF generator 1102 and high-frequency RF generator 1104 are connected to showerhead 1114. The power and frequency are sufficient to generate a plasma from the process gas, for example 400-700 W total energy. In some implementations, the generators are not used, e.g., for non-plasma deposition or treatment. During a plasma treatment step, one or both generators may be used. For example, in a typical process, the high frequency RF component is generally between 2-60 MHz; in a preferred embodiment, the component is 13.56 MHz.

Within the reactor, a wafer pedestal 1118 supports a substrate 1116. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 1112. Multiple source gas lines 1110 are connected to manifold 1108. The gases may be premixed or not. The temperature of the mixing bowl/manifold lines should be maintained at levels above the reaction temperature. Temperatures at or above about 80° C. usually suffice. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 1100 via outlet 1122. Vacuum pump 1126 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

FIG. 12 is a simplified schematic of a remote plasma treatment module according to certain embodiments. Apparatus 1200 has plasma producing portion 1211 and exposure chamber 1201 separated by showerhead assembly or faceplate 1217. Inside exposure chamber 1201, platen (or stage) 1205 provides support for wafer 1203. Platen 1205 is fitted with a heating/cooling element. In some embodiments, platen 1205 is also configured for applying a bias to wafer 1203. Low pressure is attained in exposure chamber 1201 via vacuum pump via conduit 1207. Sources of gaseous treatment gases provide a flow of gas via inlet 1209 into plasma producing portion 1211 of the apparatus. Plasma producing portion 1211 may surrounded by induction coils (not shown). During operation, gas mixtures are introduced into plasma producing portion 1211, the induction coils are energized and a plasma is generated in plasma producing portion 1211. Showerhead assembly 1217 may have an applied voltage and terminates the flow of some ions and allows the flow of neutral species into exposure chamber 1201.

FIG. 13 is a simplified illustration of various components of a HDP-CVD apparatus that may be used for pre- and/or post-deposition treatment and or deposition of solid oxide material according to various embodiments. As shown, reactor 1301 includes process chamber 1303 which encloses other components of the reactor and serves to contain the plasma. In one example, the process chamber walls are made from aluminum, aluminum oxide, and/or other suitable material. The embodiment shown in FIG. 13 has two plasma sources: top RF coil 1305 and side RF coil 1307. Top RF coil 1305 is a medium frequency or MFRF coil and side RF coil 1307 is a low frequency or LFRF coil. In the embodiment shown in FIG. 13, MFRF frequency may be from 430-470 kHz and LFRF frequency from 340-370 kHz. However, apparatuses having single sources and/or non-RF plasma sources may be used.

Within the reactor, wafer pedestal 1309 supports substrate 1311. A heat transfer subsystem including line 1313 for supplying heat transfer fluid controls the temperature of substrate 1311. The wafer chuck and heat transfer fluid system can facilitate maintaining the appropriate wafer temperatures.

A high frequency RF of HFRF source 1315 serves to electrically bias substrate 1311 and draw charged precursor species onto the substrate for the pre-treatment or cure operation. Electrical energy from source 1315 is coupled to substrate 1311 via an electrode or capacitive coupling, for example. Note that the bias applied to the substrate need not be an RF bias. Other frequencies and DC bias may be used as well.

The process gases are introduced via one or more inlets 1317. The gases may be premixed or not. The gas or gas mixtures may be introduced from primary gas ring 1321, which may or may not direct the gases toward the substrate surface. Injectors may be connected to primary gas ring 1321 to direct at least some of the gases or gas mixtures into the chamber and toward substrate. The injectors, gas rings or other mechanisms for directing process gas toward the wafer are not present in certain embodiments. Process gases exit chamber 1303 via outlet 1322. A vacuum pump typically draws process gases out and maintains a suitably low pressure within the reactor. While the HDP chamber is described in the context of pre- and/or post-deposition treatment or cure, in certain embodiments, it may be used as a deposition reactor for deposition of a flowable film. For example, in a thermal (non-plasma) deposition, such a chamber may be used without striking a plasma.

Figure 14A:
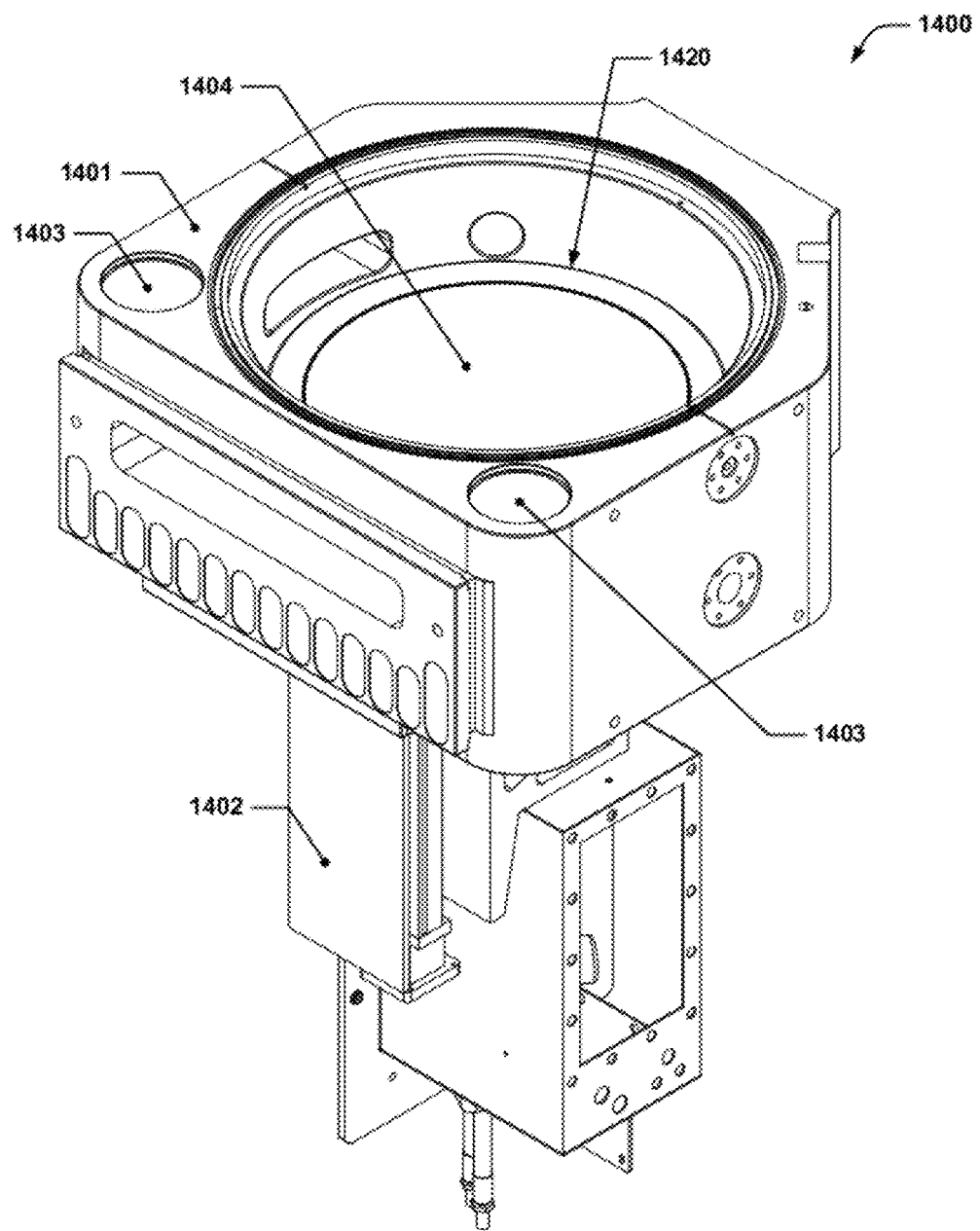
FIG. 14A depicts an isometric view of an example reactor.
Figure 14B:
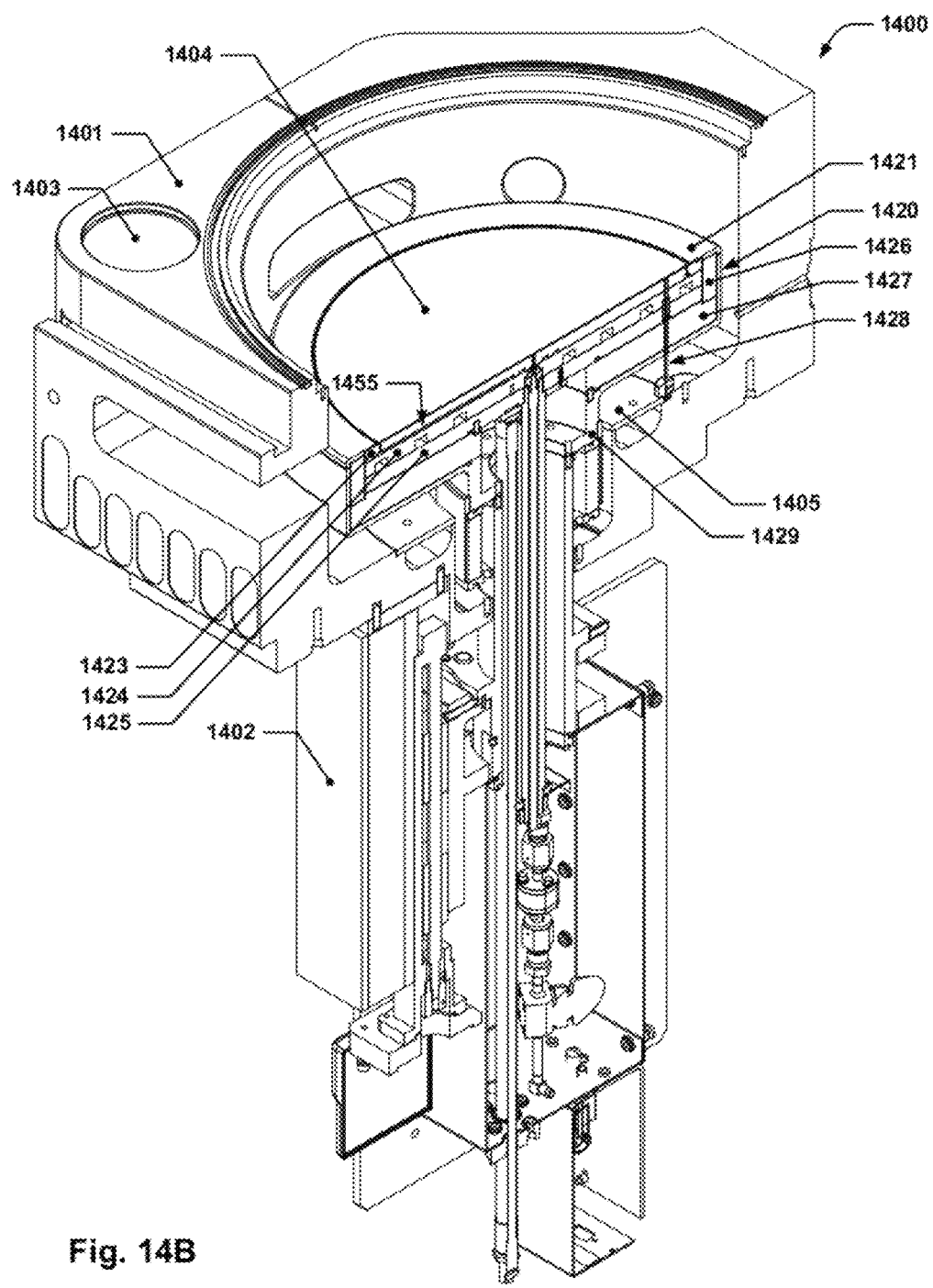
FIG. 14B depicts an isometric section view of the reactor of FIG. 14A.
Figure 14C:
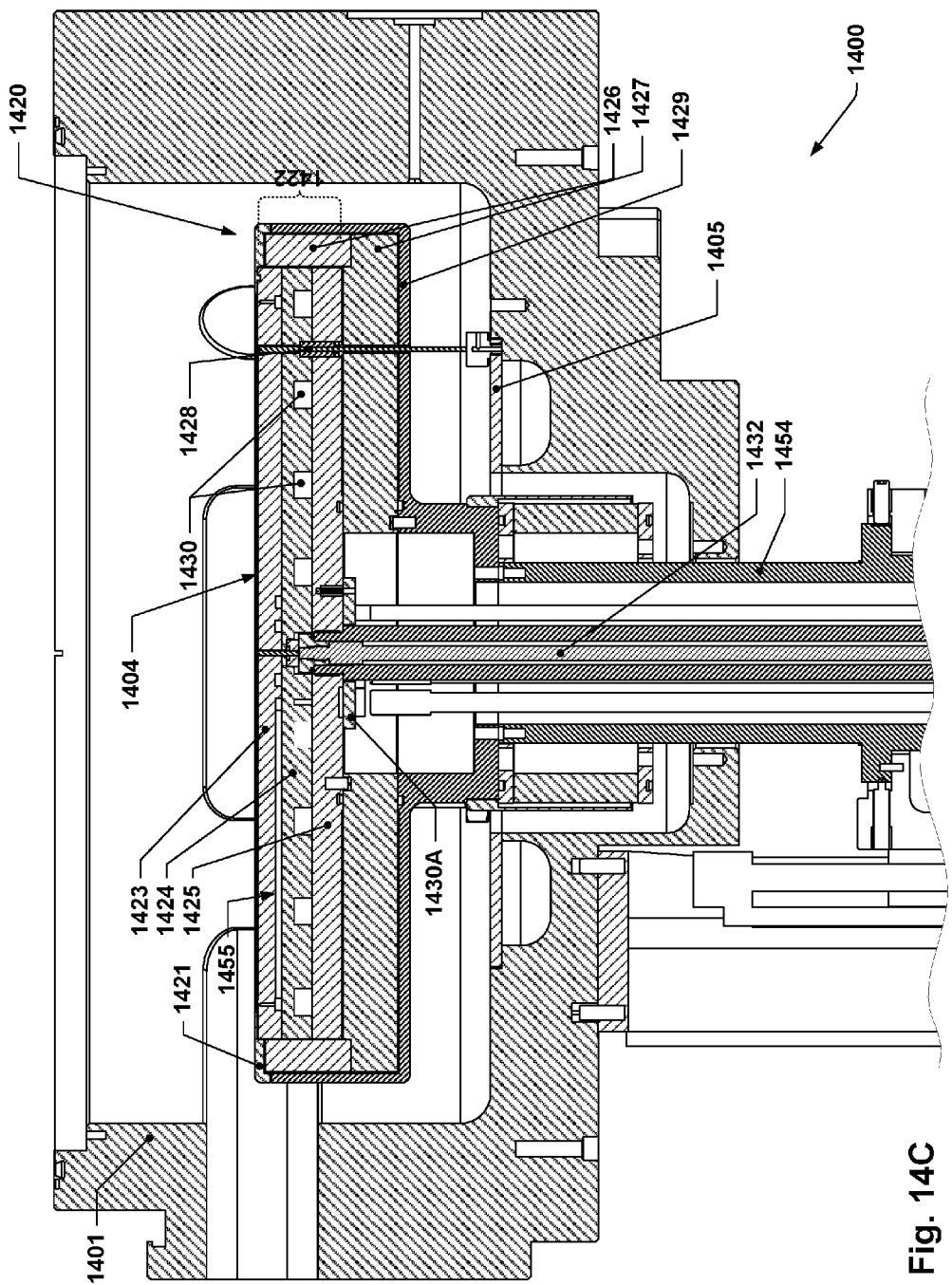
FIG. 14C depicts a side section view of the reactor of FIG. 14A.
Figure 14D:
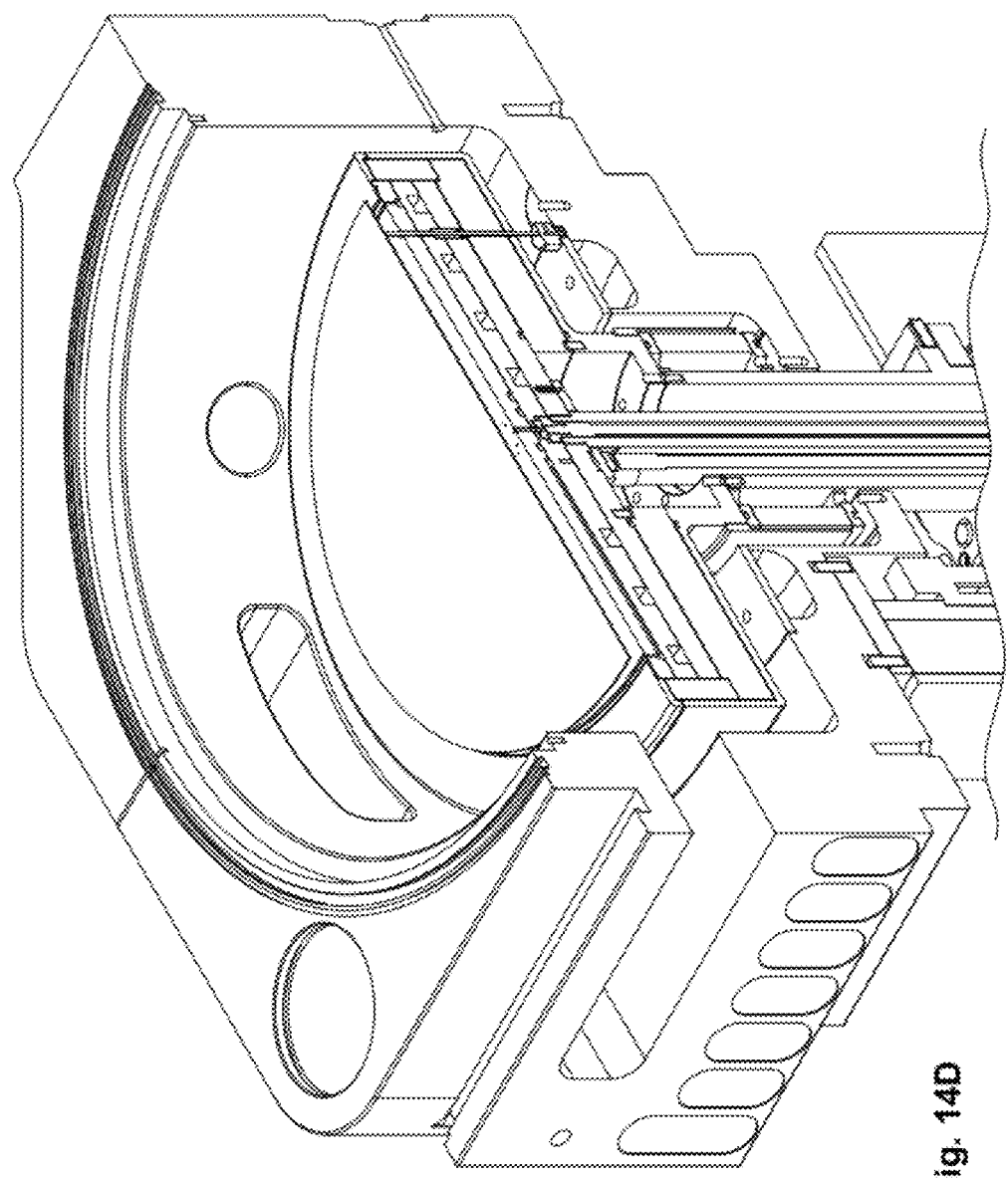
FIG. 14D depicts an isometric section view of the reactor of FIG. 14A with the wafer in a lifted position.
Figure 14E:
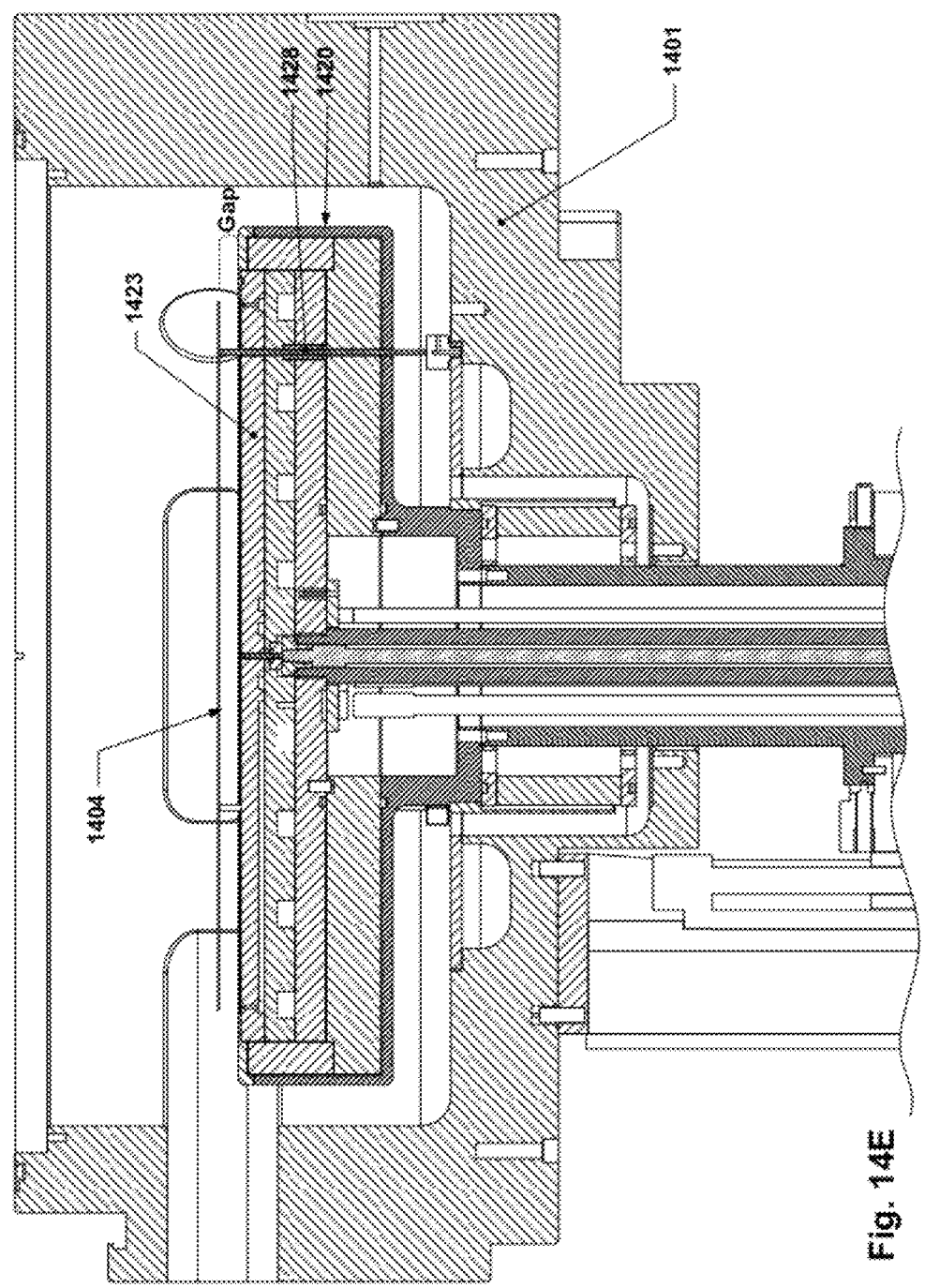
FIG. 14E depicts a side section view of the reactor of FIG. 14A with the wafer in a lifted position.
Figure 14F:
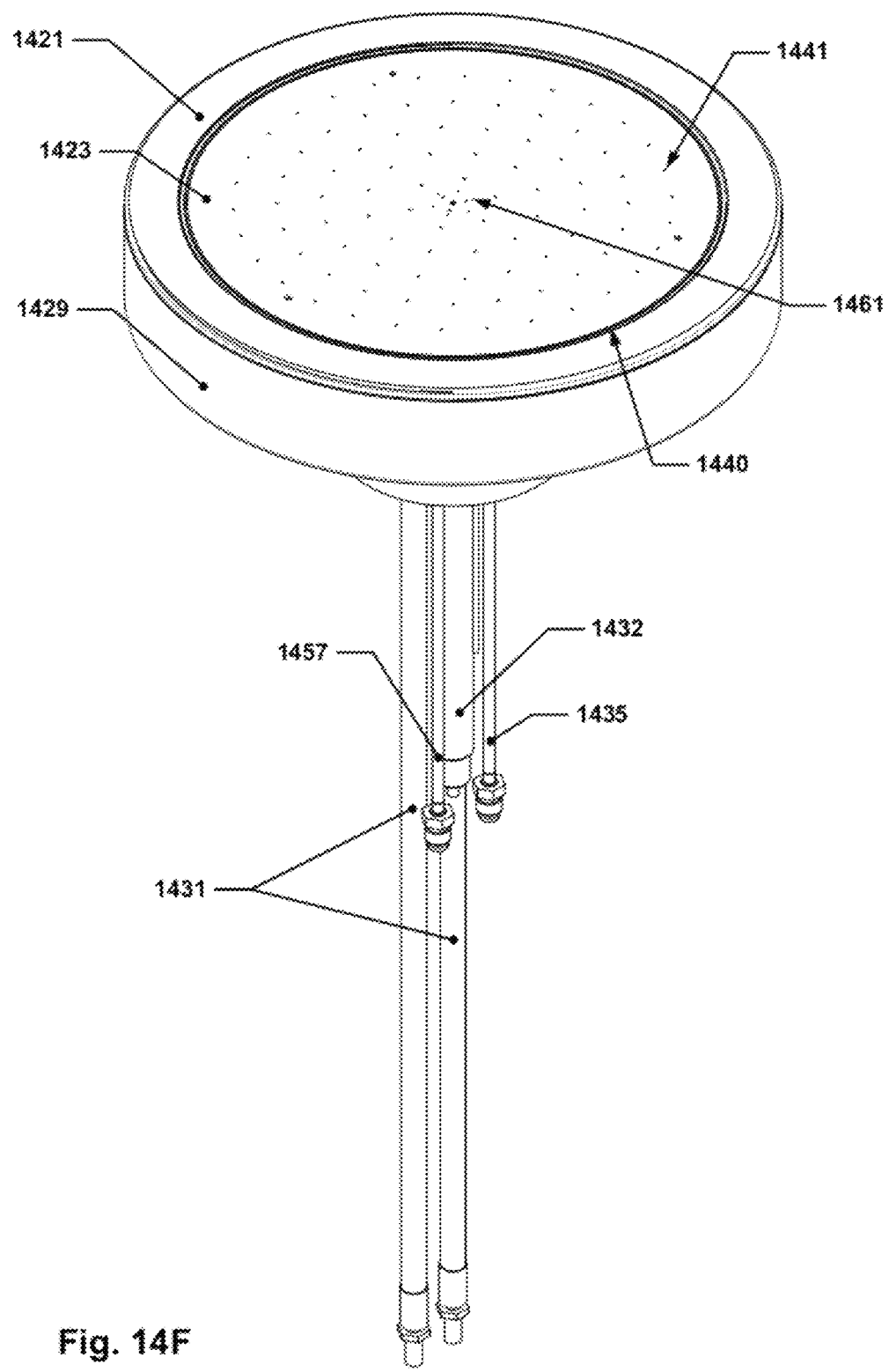
FIG. 14F depicts an isometric view of the wafer support apparatus of FIG. 14A.
Figure 14G:
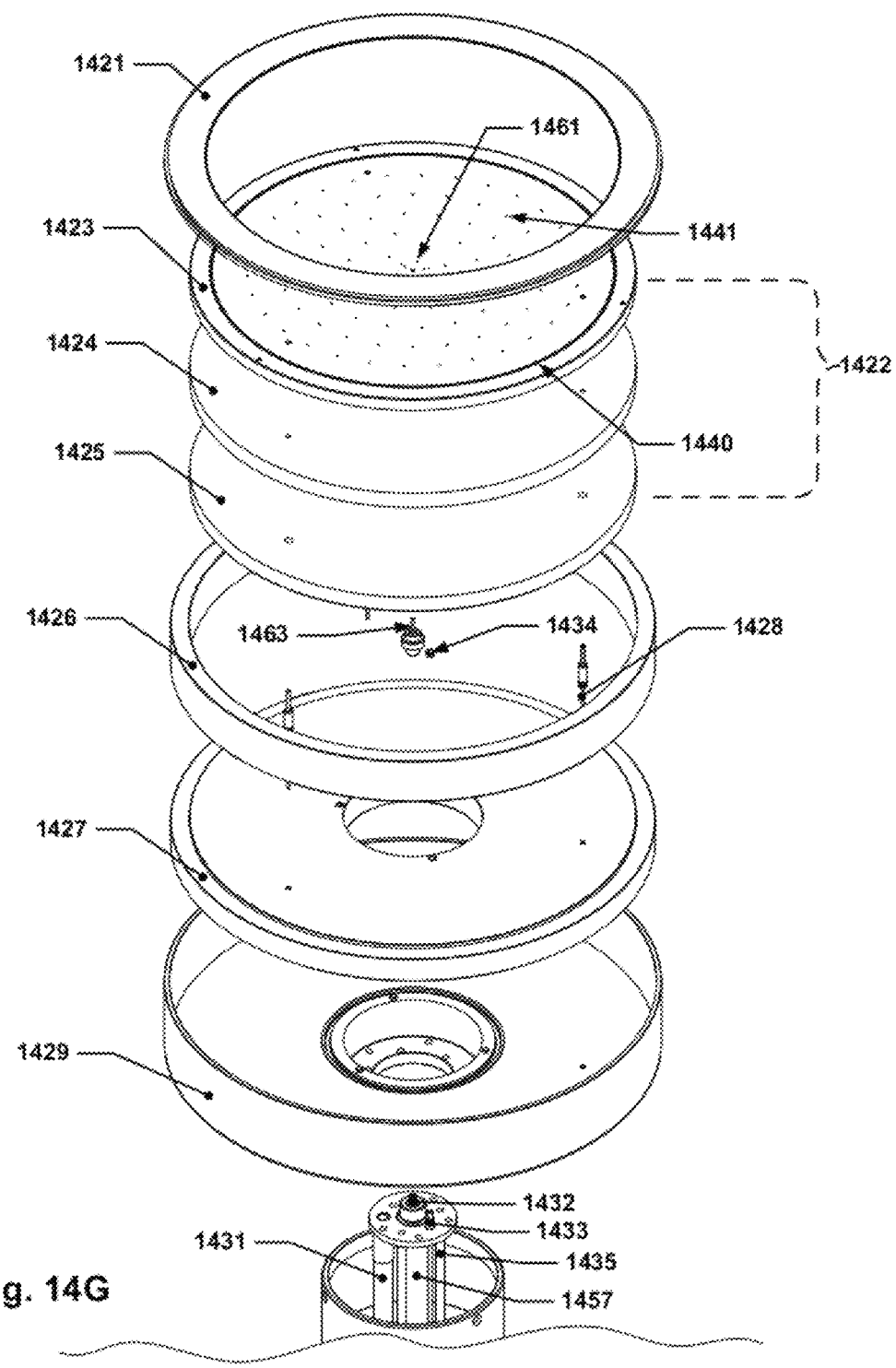
FIG. 14G depicts an isometric exploded view of the wafer support apparatus of FIG. 14A.
Figure 14I:
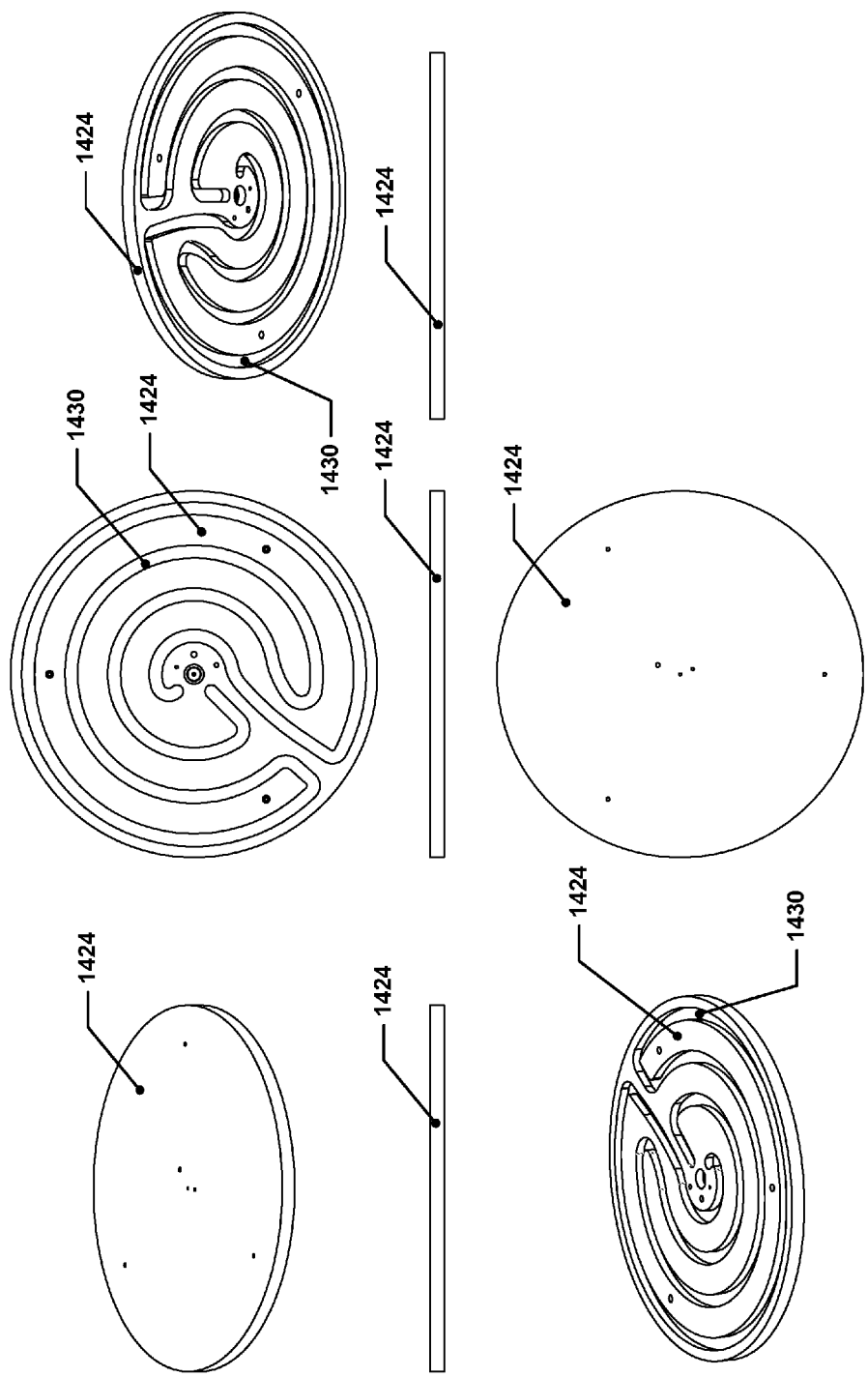
FIG. 14I depicts multiple views of an example cooling plate used in the reactor of FIG. 14A.
Figure 14J:
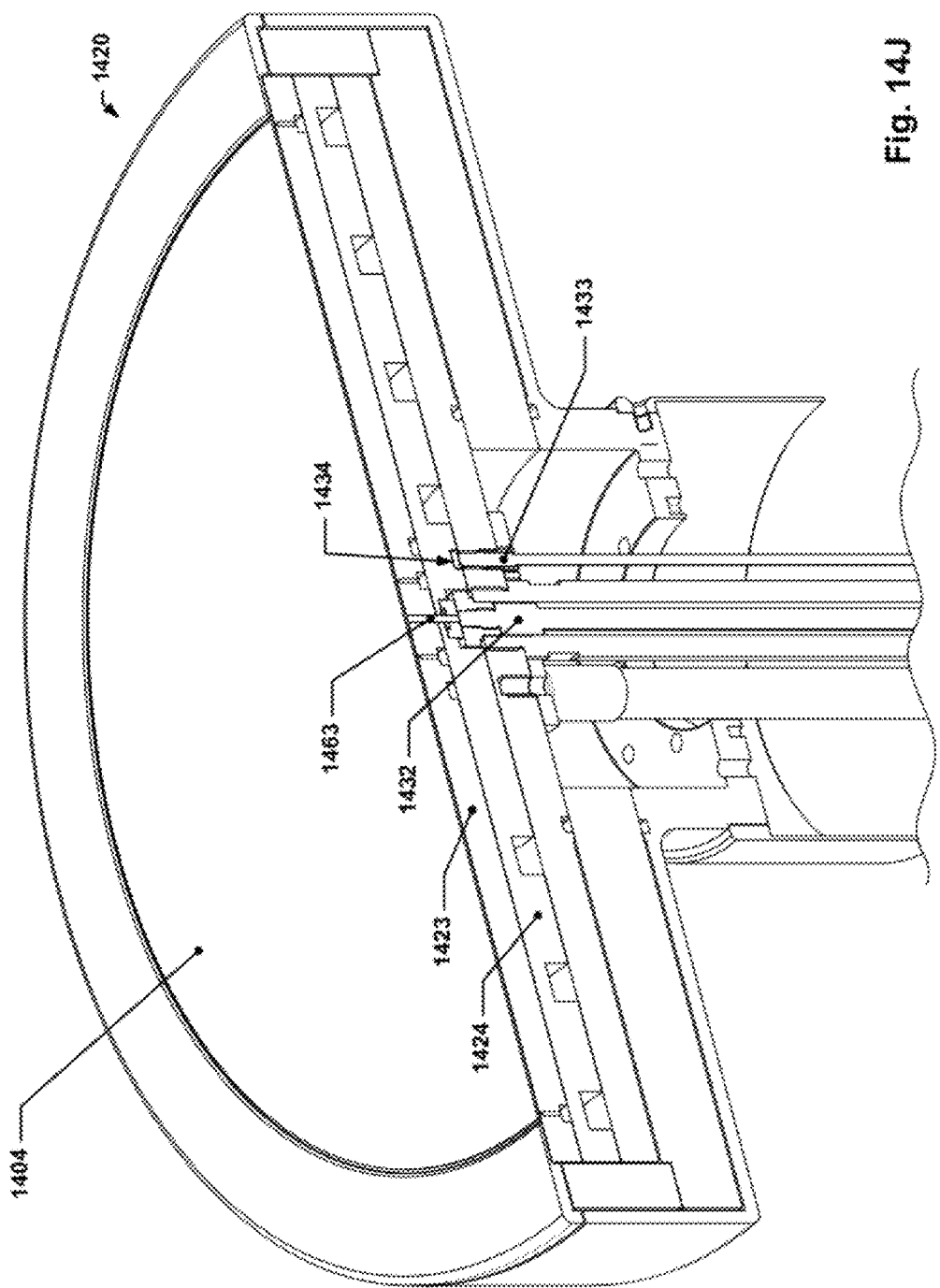
FIG. 14J depicts an isometric section view of the wafer support apparatus of FIG. 14A illustrating light pipe interfaces.
Figure 14N:
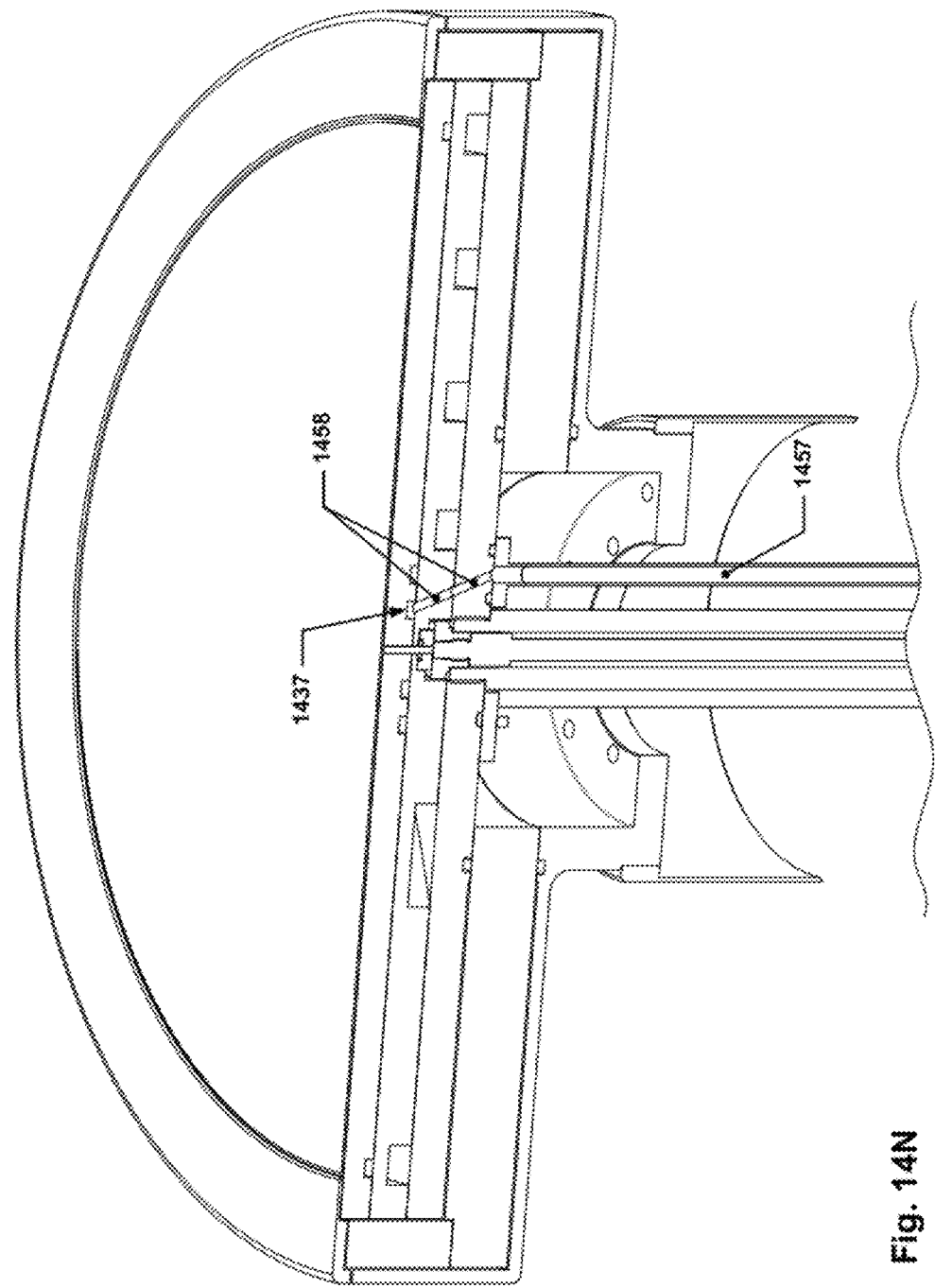
FIG. 14N depicts an isometric section view of the wafer support apparatus of FIG. 14A illustrating a vacuum interface.
Figure 140:
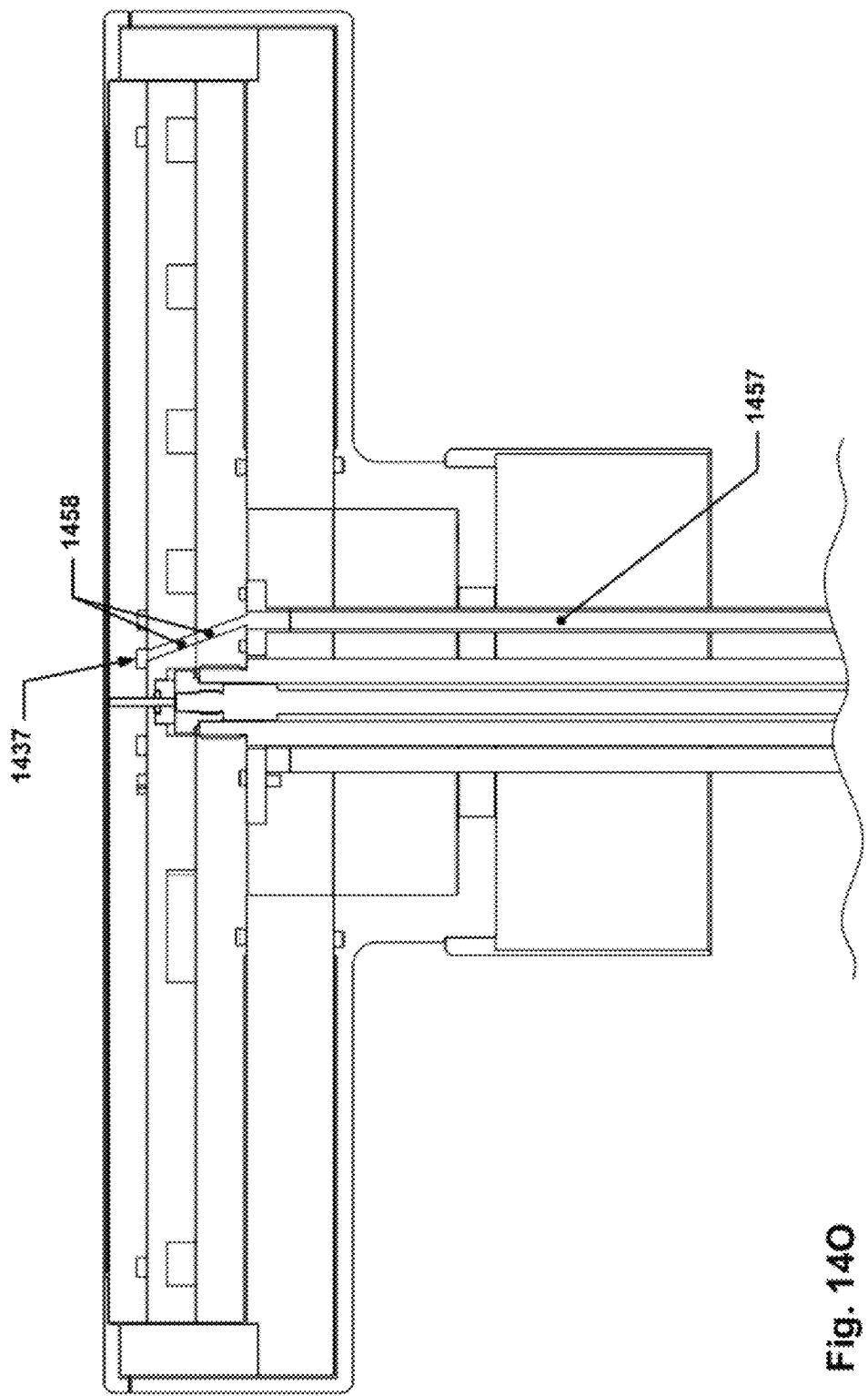
Figure 14P:
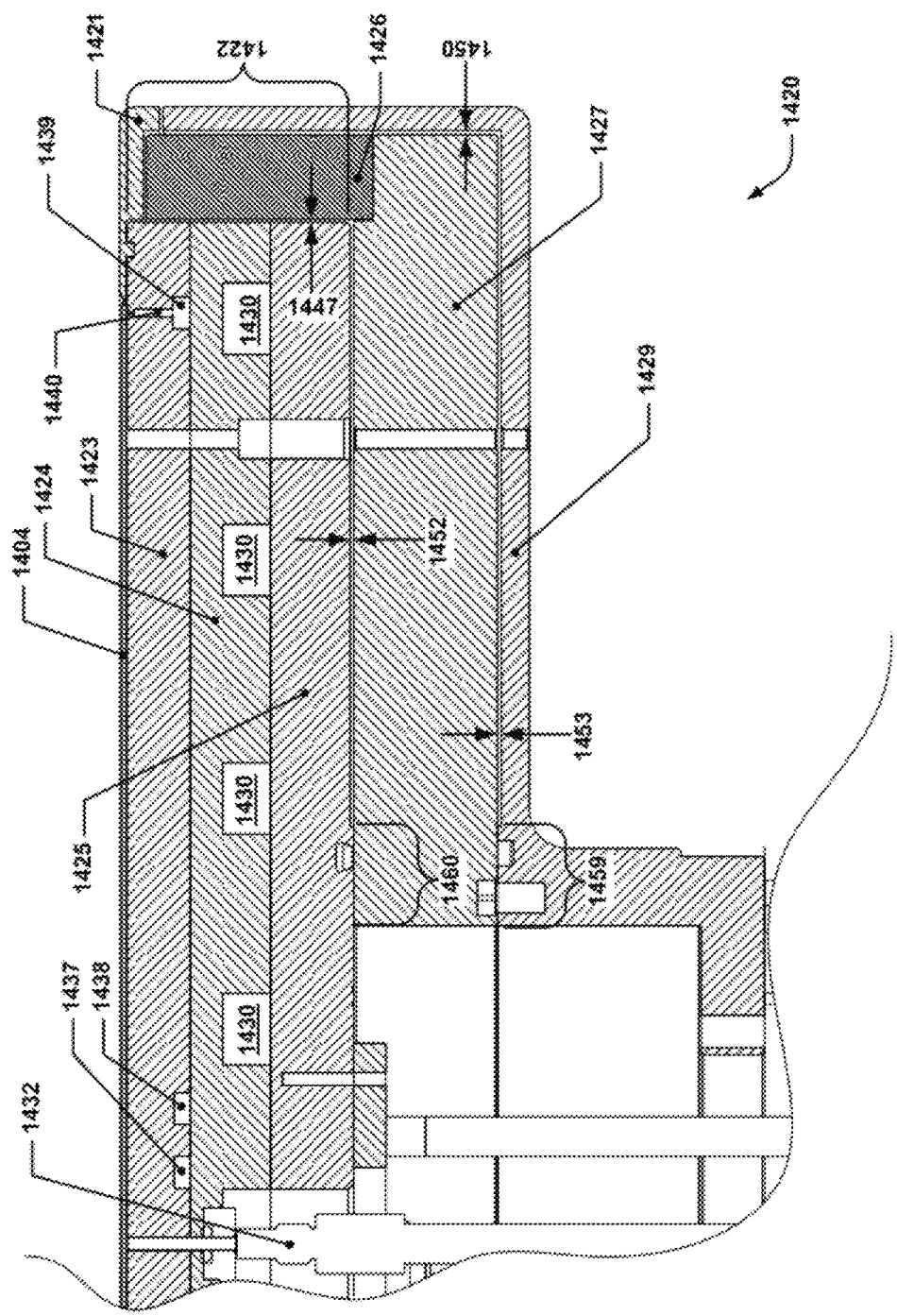
FIG. 14P depicts a detail section view of the wafer support apparatus of FIG. 14A.
Figure 14Q:
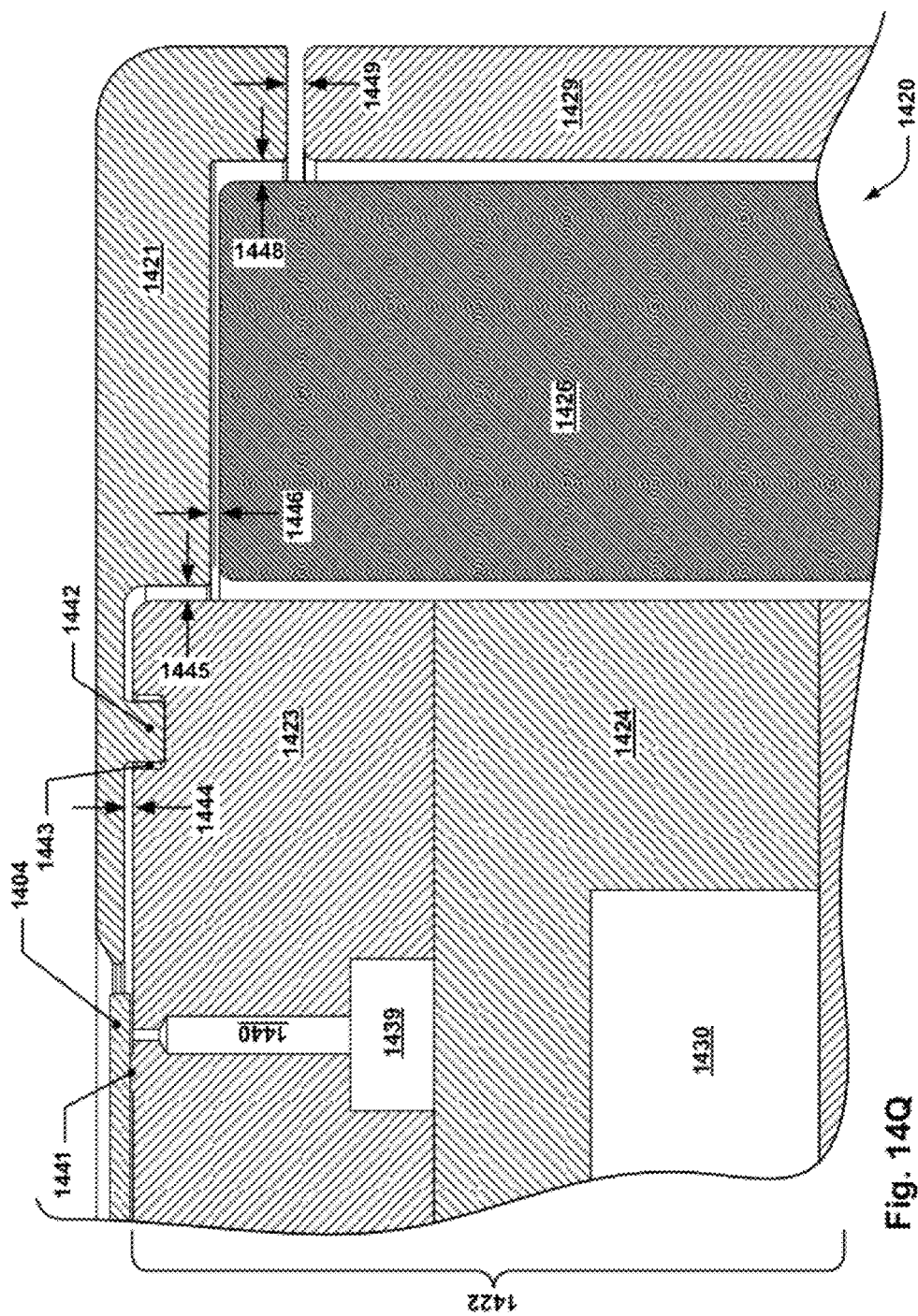
FIG. 14Q depicts a further detail section view of the wafer support apparatus of FIG. 14A.

FIGS. 14A-14Q depict various views and components of one example implementation of a reactor configured for flowable gap fill operations. Such a reactor may also be used in other non-gap-fill flowable deposition processes as well. FIG. 14A depicts an isometric view of a reactor 1400 (without a top plate or showerhead installed). Reactor 1400 includes chamber 1401, wafer support apparatus 1420, and lift mechanism 1402. Chamber 1401 may include, for example, two heater receptacles configured to receive heater elements for heating chamber 1401. Also shown is a wafer 1404, which, for this implementation, is a 300 mm diameter wafer. Generally speaking, while the components shown in FIGS. 14A-14Q are designed for use with a 300 mm wafer, larger or smaller wafer sizes may be accommodated by equipment which is designed according to similar principles but resized to accommodate the larger or smaller-sized wafer. Wafer support apparatus may provide functionality similar to that provided by pedestal 420 in FIGS. 4A-4E, and may also be regarded as one implementation of a pedestal. Conversely, pedestal 420 may also be regarded as one implementation of a wafer support apparatus. Reactor 1400 may be connected with systems described elsewhere in this paper, such as a gas distribution system, a dual-flow showerhead, RF power, vacuum sources, wafer handling systems, etc.

Reactor 1400 may, for example, be configured to cool wafer 1404 to a temperature of approximately −5° C. to promote flowable gap fill deposition on wafer 1404 while maintaining chamber 1401 and other components within reactor 1400 at a higher temperature to inhibit deposition on non-wafer components, as generally discussed previously. Various aspects of the design shown in FIGS. 14A-14Q are directed at managing the thermal environment of wafer support apparatus 1420 and the components therein as well as wafer 1404. The design shown in FIGS. 14A-14Q may, for example, be capable of achieving temperature variances of less than 0.35° C., or even less than 0.1° C., across substantially all of wafer 1404 while maintaining wafer 1404 at low temperatures, e.g., −10 to −5° C., and while maintaining various other components in close proximity to wafer 1404 but not touching wafer 1404, at temperatures approximately 5 to 10° C. higher than wafer 1404.

FIG. 14B depicts an isometric section view of reactor 1400 and FIG. 14C depicts the section view of FIG. 14B from a side view perspective. Some minor components, such as O-rings, fittings, fasteners, tubing, etc., may not be shown or may not be shown in their entirety to avoid undue visual clutter. Wafer 1404 may be supported by a chuck 1422 of wafer support apparatus 1420, which may, in turn, be supported by a dielectric plate 1427. The area of chuck 1422 which may support wafer 1404 may be referred to as a wafer support area. The wafer support area may generally correspond with the top surface of chuck 1422, although the top surface of chuck 1422 may extend beyond the nominal diameter of wafer 1404 and the wafer support area. In addition to supporting chuck 1422, dielectric plate 1427 may also support a dielectric ring 1426. Dielectric plate 1427 and dielectric ring 1426 may, for example, be made from $Al_2O_3$. While dielectric plate 1427 and dielectric ring 1426 are shown as separate pieces, they may also, in some implementations, be made as a unitary part. Whether unitary part or an assembly of multiple pieces, dielectric plate 1427 and dielectric ring 1326 may be viewed as having a "dielectric floor" and an "outer dielectric wall." Dielectric plate 1427 and dielectric ring 1426, or an equivalent structure, may also be viewed, and referred to, as a "dielectric break." Dielectric plate 1427 may generally correspond with the dielectric floor, and dielectric ring 1426 and the outermost portion of dielectric plate 1427 may generally correspond with the outer dielectric wall. Dielectric plate 1427 may be supported by a housing 1429, which may be supported by a support column 1454 driven by lift mechanism 1402. Housing 1429 may be made from aluminum, e.g., 6061 aluminum and, similar to dielectric plate 1427 and dielectric ring 1426, may include a floor and an outer wall. The outer wall of housing 1429 may be substantially cylindrical. Housing 1429 may, in some implementations, also serve as a ground plane for RF energy used during processing. The floor of housing 1429 may be substantially planar and may meet the outer wall along one edge of the outer wall. Housing 1429 may also include other components or portions which further define the overall shape of housing 1429. Housing 1429 may provide some of the functionality provided by platen 422 of FIGS. 4-4E, e.g., housing 1429 may, directly or indirectly, provide support for chuck 1422. Housing 1429 may also be referred to as a chuck housing.

Lift pin assemblies 1428 may lift wafer 1404 off of chuck 1422 when wafer support apparatus 1420 is lowered by lift mechanism 1402. FIGS. 14D and 14E show isometric section and side section views of reactor 1401 with wafer support apparatus 1420 in a lowered position and wafer 1404 lifted off of chuck 1422 by lift pin assemblies 1428.

FIGS. 14F and 14G show isometric and isometric exploded views of chuck 1422 (without wafer 1404 shown). Chuck 1422 may be a multi-layer component and may include a purge channel plate 1423, a cooling channel plate 1424, and a base plate 1425, which may be bonded together to form a contiguous part. Purge channel plate 1423 may provide support to wafer 1404 and a guard ring 1421. Guard ring 1421 may be made from a dielectric material, such as $Al_2O_3$. Lift pin assemblies 1428 may be installed in chuck 1422. Chuck 1422 may be partially or entirely coated with a coating to protect chuck 1422 from corrosion during plasma cleaning operations. Such a coating may, for example, be provided by 2-3 μm of electron-beam deposited yttrium-fluoride ($YF_3$). Chuck 1422 may be made, for example from aluminum, such as 3003 aluminum. Lift pin assemblies 1428 may be made, for example, from $Al_2O_3$, and may be held in place within chuck 1422 through the use of an O-ring or other compliant clamping mechanism. Chuck 1422 may be a larger diameter than the nominal wafer diameter of wafer 1404. For example, chuck 1422 may extend 10-15 mm, or approximately 13 mm, beyond the edge of wafer 1404 in a radial direction.

Referring back to FIGS. 14B and 14C, various conduits may be routed to the underside of chuck 1422 through support column 1454. For example, coolant lines, including a coolant supply line and a coolant return line, may be routed through support column 1454 and connect to an interface plate 1430A, which may be hermetically sealed to the underside of chuck 1422. To assist in understanding the various conduit interfaces within chuck 1422, FIGS. 14H and 14J-14O provide various isometric section and side-section views showing such interfaces.

FIG. 14H depicts an isometric non-planar section view of reactor 1400. In FIG. 14H, reactor 1400 has been sectioned along planes intersecting at the center of wafer support apparatus 1420 and passing through the centerlines of coolant lines 1431. In some implementations, such as the one pictured in FIG. 14H, cooling performance may be largely independent of which coolant line 1431 is used to supply coolant and which is used to return coolant. In some other implementations, however, one coolant line 1431 may need to be designated as a supply line and the other as a return line in order to promote uniform cooling across chuck 1422. The implementation shown in FIGS. 14A-14Q does not feature a heating element within chuck 1422.

FIG. 14I depicts cooling plate 1424 from various perspectives, including three separate isometric perspectives. Cooling channel 1430 of cooling plate 1424 may be composed of nested C-shaped portions which may be generally aligned such that the "open" portion of each C-shaped portion is oriented in substantially the same direction. Each C-shaped portion may be connected to another C-shaped portion by a cross-over portion which links one end of the C-shaped portion to a corresponding end of the other C-shaped portion. Some C-shaped portions may not be connected to other C-shaped portions at both ends, and may instead have one end fluidly connected to an inlet or outlet corresponding with a coolant line 1431. Such C-shaped portions may utilize a cross-over portion to reach the inlet or outlet, or the C-shaped portion may simply have an end located at such an inlet or outlet. Cooling channel 1430 may, for example, have a nominal depth of approximately 0.3" and a nominal width of 0.45"

FIGS. 14J and 14K depict isometric and side section views, respectively, of wafer support apparatus 1420 along a plane which passes through the centerlines of a calibration light pipe 1432 and an in-situ light pipe 1433. Calibration light pipe 1432 may provide dual-purpose functionality. For example, calibration light pipe 1432 may be centered on wafer support apparatus 1420/chuck 1422 and used as a fiduciary to assist in centering wafer 1404 on wafer support apparatus 1420. For example, a wafer transfer robot (not shown) may illuminate the top side of wafer support apparatus 1420. The light from such illumination may reflect back at the wafer transfer robot from the top surface of wafer support apparatus 1420. However, since calibration light pipe 1432 is optically transparent, the amount of light which is reflected back from the top surface of wafer support apparatus 1420 decreases when the light is incident on the center of the apparatus. The wafer transfer robot may be equipped with a detector to measure the amount of reflected light. The wafer transfer robot may be configured to correlate the lower-reflectivity area with the center of wafer support apparatus 1420. Calibration light pipe 1432 may be capped with a sapphire window 1463 mounted in purge plate 1423 and cooling plate 1424.

Additional functionality which the calibration light pipe may provide is to allow for calibration of a temperature monitoring system using in-situ light pipe 1433. Due to the low temperatures used in the processes described herein, conventional non-contact temperature measurement, such as infrared temperature measurement, may be incapable of measuring the temperature of wafer 1404 during processing. In order to obtain in-situ temperature data regarding the temperature of wafer 1404 during processing, it may be assumed that the temperature of chuck 1422 at a point within chuck 1422 may be used to reliably estimate the temperature of wafer 1404 at a given point in time. In-situ light pipe 1433 may provide a mechanism for obtaining such an interior temperature measurement of chuck 1422. A phosphor puck 1434 may be in thermal contact with chuck 1422, e.g., with cooling plate 1424, and in-situ light pipe 1433 may provide an optical path for light emitted by phosphor puck 1434 to reach a spectroscopic light sensor (not shown). Phosphor puck 1434 may emit different wavelengths of light depending on the temperature it is at, and such wavelength/ temperature correlations may provide an accurate measurement of phosphor puck 1434's temperature based on the wavelength of the emitted light. There may, however, be some variation in wafer 1404 temperature as compared with the temperature obtained from phosphor puck 1434. In order to quantify this variation and correct for it, calibration measurements may be taken by using a calibration wafer which is coated to allow for temperature measurement via an optical sensor connected with calibration light pipe 1432. When the calibration wafer is used, temperature measurements may be obtained using both the in-situ light pipe 1433 and the calibration light pipe 1432. The differences observed between the two sets of measurements for the same environmental conditions may be used to correct in-situ light pipe 1433 readings of chuck 1422 associated with wafer 1404 and to obtain a more accurate estimate of wafer 1404 temperature during processing.

FIGS. 14L and 14M depict isometric and side section views, respectively, of wafer support apparatus 1420 along a plane which passes through the centerlines of chuck 1422 and a purge gas line 1435. Two purge gas risers 1456 allow purge gas provided by purge gas line 1435 to reach purge gas inlet channel 1438 and be distributed to annular purge gas channel 1439 by purge gas spokes 1455 (not visible in FIGS. 14G and 14H, although one purge gas spoke 1455 is visible in FIGS. 14B and 14C). Purge gas functionality for this implementation is discussed later in greater detail.

FIGS. 14N and 14O depict isometric and side section views, respectively, of reactor 1400 along a plane which passes through the centerlines of chuck 1422 and a vacuum line 1457. Vacuum line 1457 may be fluidly connected with annular vacuum channel 1437 via vacuum risers 1458. Although not shown in FIGS. 14N and 14O, several small vacuum ports may fluidly connect annular vacuum channel 1437 with the top face of chuck 1422 to allow for vacuum-assisted clamping of wafer 1404 during some processing. A circular pattern of six such vacuum ports 1461 may be seen in FIGS. 14F and 14G.

FIG. 14P shows a detail side section view of approximately one half of the subportion of the wafer support apparatus components shown, for example, in FIG. 14F, as well as wafer 1404. FIG. 14Q shows a further detail side section view of an edge region of wafer support apparatus 1420 which includes guard ring 1421. Guard ring may have an inner diameter approximately 2 mm larger than the nominal diameter of wafer 1404. As is evident from FIGS. 14P and 14Q, various thermal breaks may separate various components of wafer support apparatus 1420. As used herein, a thermal break refers to a physical separation, i.e., gap, between parts which is sufficiently large enough to substantially prevent conductive heat transfer between the parts via any gases trapped within the thermal break yet which is also sufficiently small enough to prevent substantial convective heat transfer between the parts via the gases. Parts or portions of parts which are either in direct contact, or which are separated by a gap but which are still sufficiently close enough together to experience significant conductive heat transfer across the gap via any gases trapped within the gap, may be referred to as being in "thermal contact" with each other in this document.

In the case of wafer support apparatus 1420, the gases which may be resident within the thermal breaks may be process gases such as Ar, He, or other gases supplied by a gas delivery system. The thermal breaks may be engineered to take into account the density of such gases in the process environments present during wafer processing. For example, a 0.015" or lower thermal break may result in non-negligible heat conduction between two parts when Ar or He gas fills the thermal break gap and the gas is at a pressure of 25 to 75 Torr. The term "thermal break region" may be used to refer to a portion of a component which, when the component is assembled with another component, may represent one side of a thermal break. The other component may have a corresponding thermal break region which forms the other side of the thermal break.

For example, while the underside of dielectric plate 1427 may be in physical contact with housing 1429 across a first structural support region 1459, the rest of the underside of dielectric plate 1427, as shown in FIG. 14P, may be offset from housing 1429 by an axial thermal break 1453. First structural support region 1459 may be a substantially annular area with, for example, a 4" inner diameter and a 5.25" outer diameter. In some implementations, the first structural support region may have an outer diameter less than about 50% of the diameter of chuck 1422. Axial thermal break 1453 between housing 1429 and the underside of dielectric plate 1427 may be between 0.015" and 0.050" in size and extend over annular thermal break regions on both parts which have an inner diameter of approximately 5.25" and an outer diameter of approximately 13.25". It is to be recognized that the specific thermal break values described herein with respect to the various thermal breaks shown in FIGS. 14P and 14Q may be different from other values which may effectively provide similar thermal management functionality and it is to be understood that wafer support apparatus designs achieving similar thermal management functionality by employing thermal breaks similar to those described herein but with different values fall within the scope of this disclosure.

Axial thermal break 1453 may transition to a radial thermal break 1450 between the inner cylindrical surface of housing 1429 and the outer cylindrical surface of dielectric plate 1429, and may be continued between the inner cylindrical surface of housing 1429 and the outer cylindrical surface of dielectric ring 1426. The term "axial thermal break" is used herein to describe a thermal break which is primarily characterized by a gap or gaps between parts along the center axis of a substantially axially-symmetric assembly, and the term "radial thermal break" is used herein to describe a thermal break which is primarily characterized by a radial gap or gaps between such parts. Radial thermal break 1450 may have a gap distance of between 0.015" and 0.050".

Another thermal break evident in FIG. 14P is located between chuck 1422 and dielectric plate 1427 as well as dielectric ring 1426. Chuck 1422 may be in physical contact with dielectric plate 1427 across a second structural support region 1460, much as dielectric plate 1427 may be in physical contact with housing 1429 across first structural support region 1459. The portion of chuck 1422 extending outward from second structural support region 1460 may be separated from dielectric plate 1427 by an axial thermal break 1452, which transitions to a radial thermal break 1447 between the outer cylindrical surface of chuck 1422 and the inner cylindrical surface of dielectric plate 1427. Axial thermal break 1452 between chuck 1422 and dielectric plate 1427 and radial thermal break 1447 may both have gap distances between 0.015" and 0.050". Axial thermal break 1452 may extend across annular thermal break regions on dielectric plate 1427 and chuck 1422 which may have an inner diameter of approximately 5.25" and an outer diameter of approximately 12.75".

In addition the thermal breaks separating dielectric ring 1426 and dielectric plate 1427 from housing 1429 and from chuck 1422, other thermal breaks may exist between other components shown in FIGS. 14P and 14Q. For example, guard ring 1421 may be thermally separated from housing 1429 and dielectric ring 1426 by axial thermal breaks 1446 and 1449 and radial thermal break 1448, which may be on the order of 0.015" to 0.050". Guard ring 1421 may, despite being physically supported by chuck 1422, be separated from chuck 1422 in large part by gap 1444, which may, in some implementations, be on the order of 15 to 250 microns, and radial thermal break 1445. Guard ring 1421 may be spaced apart from chuck 1422 by several posts 1442 protruding from the underside of guard ring 1421 which rest within corresponding recesses 1443 in the top surface of chuck 1422. While there is physical contact between guard ring 1421 and chuck 1422 via the posts 1442 and receiving recesses 1443, this physical contact may be extremely limited, e.g., three small-diameter posts, and conductive heat transfer through posts 1442 into chuck 1422 may be correspondingly negligible. Aside from, for example, posts 1442, guard ring 1421 may be substantially axially symmetric. Furthermore, guard ring 1421 may have a very low thermal mass compared to many of the other components in wafer support apparatus 1420, which reduces thermal inertia, i.e., heat may flow very rapidly within guard ring 1421 as compared to other components within wafer support apparatus 1420. Such rapid heat flow within guard ring 1421 permits a high rate of convective heat transfer from guard ring 1421 into the surrounding environment. During processing, reactant gases may be flowed across wafer 1404, towards the wafer perimeter, and over the guard ring. These gases may, through such convective heat transfer, remove heat which has been transferred to guard ring 1421 from chamber 1401 and carry the heat away from wafer 1404. Through the combination of convective heat transfer and minimal thermal conduction described above, chuck 1422 may receive negligible amounts of heat from guard ring 1421 during processing.

While wafer 1404 may be protected from thermal excursions due to heat transfer from guard ring 1421 by the features and geometries described above and shown, for example, in FIG. 14Q, wafer 1404 may also be vulnerable to localized hot or cold spots on chuck 1422, which may result in a less uniform temperature profile across wafer 1404. To help protect wafer 1404 from such potential temperature variations across the surface of chuck 1422, wafer 1404 may be offset from the surface of chuck 1422 through the use of a pattern of small mesas or bosses 1441. Bosses 1441 may be between 15 to 250 microns in height (approximately 0.0006" to 0.01") in height, and offset wafer 1404 from chuck 1422 by a corresponding amount. Bosses 1441 may, for example, be 0.010" to 0.050 in diameter, and be arranged in concentric radial patterns to provide distributed support of wafer 1404 across the entire span of wafer 1404. Bosses 1441, as well as the overall pattern of bosses 1441, are also visible in FIGS. 14F and 14G; a total of 96 bosses 1441 are shown. Other patterns with different numbers, boss diameters or sizes, and boss heights may be used.

Also visible in FIGS. 14P and 14Q are annular purge gas channel 1439 and purge gas distribution hole 1440. Purge gas distribution holes 1440 may be spaced along annular purge gas channel 1439 to form a circular hole pattern; the circular hole pattern may be of a slightly smaller diameter, e.g., 1-2 mm, than the nominal diameter of wafer 1404. Purge gas distribution holes 1440 may be stepped holes with an exit diameter of approximately 0.001" to 0.015". Annular purge gas channel 1439 may be fluidly connected to purge gas inlet channel 1438 via one or more purge gas spokes 1455. Purge gas supplied to purge gas inlet channel 1438 by purge gas line 1435 may travel through the one or more purge gas spokes 1455, into annular purge gas channel 1439, and out through the purge gas distribution holes 1440. The purge gas may then exit the purge gas distribution holes 1440 into the gap between wafer 1404 and chuck 1422, where it may eventually flow towards the periphery of wafer 1404 and over and under guard ring 1421. The purge gas may serve to substantially shield chuck 1422 from reactants used for deposition, thus preventing substantial deposition on chuck 1422 and prolonging the service life of chuck 1422. While some back diffusion of the purge gas over the top and towards the center of wafer 1404 may occur, the bulk of the purge gas may be pushed towards guard ring 1421 and over the edge of wafer support apparatus 1420 by the flow of reactant gases. The purge gas may also protect guard ring 1421 and housing 1429 from undesired deposition.

In some implementations, e.g., wafer support apparatuses which do not provide RF energy, the dielectric break formed by dielectric plate 1427 and dielectric ring 1426 may be omitted from the design. In such implementations, the housing 1429 and chuck 1422 may be constructed to provide a thermal break of 0.015 to 0.050 between each other, thus avoiding the creation of a large empty volume where the omitted dielectric materials may have been located.

FIGS. 11-14L provide examples of apparatuses that may be used in conjunction with structures and systems discussed herein. However, one of skill in the art will understand that various modifications may be made from the provided descriptions. For example, a plasma treatment module may be a remote and/or direct inductively- or capacitively-coupled plasma module. In some implementations, a flowable gap fill module may feature more than one pedestal and showerhead, e.g., two pedestals and showerheads, housed within a single chamber. This allows for increased throughput as two wafers may be processed at the same time in the same chamber.

In some embodiments, the apparatus may include a system controller having instructions for controlling process operations in accordance with the present invention. The system controller will typically include one or more memory devices and one or more processors configured to execute the instructions so that the apparatus will perform a method in accordance with the present invention. Machine-readable media containing instructions for controlling process operations in accordance with the present invention may be coupled to the system controller. The processors may include a CPU or computer and may include or be communicatively connected with one or more analog and/or digital input/output connections, stepper motor controller boards, etc. The system controller, for example, may be configured to control the gas delivery system, pedestal movement, vacuum port suction, plasma electrodes, and/or heating and cooling elements, if present in a particular embodiment.

Typically there will be a user interface associated with the system controller. The user interface may include a display screen, graphical software displays of the apparatus and/or process conditions, and user input devices such as pointing devices, keyboards, touch screens, microphones, etc. The system controller may be connected to any or all of the components shown in of a tool or module, including those shown in the Figures of this application; the system controller's placement and connectivity may vary based on the particular implementation.

In certain embodiments, the system controller controls the pressure in the processing chambers. The system controller may also control the concentration of various process gases in the chamber by regulating valves, liquid delivery controllers, and MFCs in the delivery system as well as flow restriction valves in the exhaust line. The system controller executes system control software including sets of instructions for controlling the timing, flow rates of gases and liquids, chamber pressure, chamber/showerhead/pedestal/substrate temperature, and/or other parameters of a particular process. Other computer programs stored on memory devices associated with the controller may be employed in some embodiments. In certain embodiments, the system controller controls the transfer of a substrate into and out of the various apparatuses shown in the figures.

The computer program code for controlling the processes in a process sequence can be written in any conventional computer readable programming language: for example, assembly language, C, C++, Pascal, Fortran or others. Compiled object code or script is executed by the processor to perform the tasks identified in the program. The system software may be designed or configured in many different ways. For example, various chamber component subroutines or control objects may be written to control operation of the chamber components necessary to carry out the described processes. Examples of programs or sections of programs for this purpose include process gas control code, pressure control code, and plasma control code.

The controller parameters relate to process conditions such as, for example, timing of each operation, pressure inside the chamber, substrate temperature, process gas flow rates, RF power, as well as others described above. These parameters are provided to the user in the form of a recipe, and may be entered utilizing the user interface. Signals for monitoring the process may be provided by analog and/or digital input connections of the system controller. The signals for controlling the process are output on the analog and digital output connections of the apparatus.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper. Further, the disclosed methods may be implemented in a process with lithography and/or patterning processes preceding or following the disclosed methods.

It will be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the invention.

What is claimed is:

1. A wafer support apparatus comprising:
a chuck, wherein:
the chuck includes a top surface, a bottom surface, and an outer surface,
the top surface and the bottom surface are both substantially parallel to, and offset from, each other,
the outer surface is located between the top surface and the bottom surface, and
the top surface is configured to support a semiconductor wafer;
a housing; and
a dielectric break, wherein:
the housing includes an outer wall and a housing floor connected to the outer wall,
the housing floor includes a first thermal break region extending from the outer wall towards the center of the housing floor, wherein the first thermal break region stops short of extending all the way towards the center of the housing floor,
the bottom surface of the chuck faces the housing floor,
the bottom surface and the outer surface of the chuck are substantially within a volume defined by the outer wall and the housing floor,
the chuck and the housing are configured to move together as a single assembly within a semiconductor fabrication chamber,
there is no substantial thermal contact between the outer surface of the chuck and the outer wall of the housing,
there is no substantial thermal contact between the bottom surface and the housing floor across the first thermal break region,
the outer surface and the outer wall are substantially cylindrical,
the housing floor is substantially annular and has an inner perimeter,
the thermal break region does not extend to the inner perimeter,
the dielectric break includes an outer dielectric wall and a dielectric floor that meets the outer dielectric wall,
the dielectric floor includes a second thermal break region extending from the outer dielectric wall towards the center of the dielectric floor,
the dielectric floor is interposed between the housing floor and the bottom surface,
the outer dielectric wall is interposed between the outer wall and the outer surface
there is no substantial thermal contact between the outer wall, the outer dielectric wall, and the outer surface,
there is no substantial thermal contact between the bottom surface and the dielectric floor across the second thermal break region, and
there is no substantial thermal contact between the dielectric floor and the housing floor across the first thermal break region.

2. The wafer support of claim 1, wherein there is no substantial thermal contact between the outer surface of the chuck and the outer wall of the housing across the first thermal break region, and there is no substantial thermal contact between the bottom surface and the housing floor across the first thermal break region, when the wafer support apparatus is exposed to gases and environmental conditions present in a flowable deposition semiconductor fabrication chamber.

3. The wafer support of claim 2, wherein the gases include Ar or He and the environmental conditions include a pressure of between 25 and 75 Torr.

4. The wafer support of claim 1, wherein:
there is a gap of at least 0.015" between substantially all of the outer surface of the chuck and the outer wall of the housing, and
there is a gap of at least 0.015" between substantially all of the bottom surface and the housing floor across the first thermal break region.

5. The wafer support of claim of claim 1, wherein:
the outer surface and a surface of the outer dielectric wall facing the outer surface are separated by a gap of between 0.015" and 0.050",
the bottom surface and a surface of the dielectric floor within the second thermal break region and facing the bottom surface are separated by a gap of between 0.015" and 0.050",
surfaces of the outer dielectric wall and the outer wall facing each other are separated by a gap of between 0.015" and 0.050", and a surface of the dielectric floor and a surface of the housing floor within the first thermal break region are separated by a gap of between 0.015" and 0.050".

6. The wafer support of claim 1, further comprising:
a guard ring, wherein the guard ring:
is substantially annular,
has an inner diameter larger than a specified nominal diameter of the semiconductor wafer which the top surface is configured to support,
is supported by the chuck,
is not in contact with the outer wall of the housing or the outer surface of the chuck.

7. The wafer support of claim 6, wherein:
the guard ring includes a plurality of posts,
each post protrudes from a surface of the guard ring facing the top surface by a first amount and into a recess in the top surface with a depth less than the first amount,
the surface of the guard ring from which the posts protrude is offset from the top surface by between 15 and 250 microns.

8. The wafer support of claim 6, wherein there is a gap of at least 0.015" between a surface of the guard ring closest to the outer wall and the outer wall.

9. The wafer support of claim 1, wherein:
a plurality of raised bosses protrude from the top surface,
the bosses are arranged in concentric circular patterns, and
each boss protrudes from the top surface by 15 to 250 microns.

10. The wafer support of claim 1, wherein:
the chuck further includes a calibration light pipe and an in-situ light pipe,
one end of the calibration light pipe terminates at the center of the top surface,
one end of the in-situ light pipe terminates at a phosphor puck located between the top surface and the bottom surface, and
the calibration light pipe and the in-situ light pipe are separated, within the chuck, by a distance less than the distance from the center of the housing floor to the first thermal break region.

11. The wafer support of claim 1, wherein:
the chuck and the housing are made primarily from aluminum, and
the dielectric break is made primarily from $Al_2O_3$.

12. The wafer support of claim 11, wherein:
the chuck is primarily made from 3003 aluminum, and
the top surface is coated with $YF_3$.

13. The wafer support of claim 1, wherein the chuck includes a cooling channel located between the top surface and the bottom surface and following a circuitous path through the chuck.

14. The wafer support of claim 13, wherein the circuitous path comprises:
a plurality of nested C-shaped segments of different sizes; and
a plurality of cross-over segments, wherein:
each cross-over segment joins an end of one C-shaped segment with a corresponding end of another C-shaped segment, and
only one cross-over segment joins together any two C-shaped segments.

15. The wafer support of claim 14, wherein:
the chuck includes a first plate and a second plate,
the first plate includes a first top face and a first bottom face,
the second plate includes a second top face and a second bottom face,
the first top face is bonded to the second bottom face,
the cooling channel is recessed into the second bottom face,
the first plate includes two through-holes,
each through-hole corresponds with a different terminal end of the cooling channel and the first plate and the second plate are aligned such that each through-hole aligns with the corresponding terminal end of the cooling channel.

16. The wafer support of claim 15, wherein:
the chuck further includes a third plate,
the third plate includes a third top face and a third bottom face,
the third bottom face is bonded to the second top face,
the third bottom face includes an annular purge gas channel and one or more purge gas supply channels fluidly connected with the annular purge gas channel,
a circular pattern of holes fluidly connects the annular purge gas channel with the third top face, and
a purge gas inlet passes through the first plate and the second plate and fluidly connects the one or more purge gas supply channels with the first bottom face.

17. The wafer support of claim 1, wherein the chuck includes an annular purge gas channel located between the top surface and the bottom surface and wherein a circular pattern of holes fluidly connects the annular purge gas channel with the top surface.

18. The wafer support of claim 17, wherein the wafer support is configured to support wafers of a specified nominal diameter and the diameter of the circular pattern is smaller than the nominal diameter by 1-2 mm.

* * * * *